United States Patent [19]
Abele et al.

[11] Patent Number: 5,790,006
[45] Date of Patent: Aug. 4, 1998

[54] APPARATUS FOR GENERATING UNIFORM MAGNETIC FIELDS WITH MAGNETIC WEDGES

[75] Inventors: Manlio G. Abele, New York; Henry Rusinek, Great Neck; Jens Jensen, Harrison, all of N.Y.

[73] Assignee: New York University, New York, N.Y.

[21] Appl. No.: 754,916

[22] Filed: Nov. 22, 1996

[51] Int. Cl.[6] .................................................. H01F 7/02
[52] U.S. Cl. ............................................. 335/306; 335/301
[58] Field of Search ..................................... 335/302–306; 324/318–320

[56] References Cited

U.S. PATENT DOCUMENTS

| | | | |
|---|---|---|---|
| 3,205,415 | 9/1965 | Seki | 335/306 |
| 3,768,054 | 10/1973 | Neugebauer | 335/304 |
| 4,647,887 | 3/1987 | Leupold | 335/211 |
| 4,701,737 | 10/1987 | Leupold | 335/301 |
| 4,764,743 | 8/1988 | Leupold | 335/306 |
| 4,810,986 | 3/1989 | Leupold | 335/301 |
| 5,034,715 | 7/1991 | Leupold et al. | 335/306 |
| 5,055,812 | 10/1991 | Abele et al. | 335/210 |
| 5,107,239 | 4/1992 | Abele | 335/306 |
| 5,334,966 | 8/1994 | Takeshima et al. | 335/306 |
| 5,428,333 | 6/1995 | Abele et al. | 335/306 |
| 5,467,769 | 11/1995 | Yoshino et al. | 128/653.2 |

Primary Examiner—M. L. Gellner
Assistant Examiner—Raymond Barrera
Attorney, Agent, or Firm—Darby & Darby

[57] ABSTRACT

A magnetic structure generating a substantially uniform magnetic field within a region of interest comprising at least one pair of magnetic wedges of substantially identical shape arranged symmetrically about a first axis and abutting one another along a common edge. Each magnetic wedge has a first side and a second side which terminate at the common edge. The first wedge of each pair is positioned to define a first angle between the first side and the first axis and a second angle between the second side and the first axis, and is uniformly magnetized in a direction relative to a second axis (perpendicular to the first axis) which is a function of the sum of the first and second angles. The second wedge of each pair is magnetized such that the absolute values of components of the magnetization along the first and second axes are equal to components of the magnetization of the first wedge along the first and second axes, respectively, and one of the magnetization components of the second wedge is opposite to the respective magnetization component of the first wedge. The region of interest containing the substantially uniform field is between the first sides of the pair of wedges, the second sides of the pair of wedges, or both. To minimize or eliminate the surface charge density along the third side of each wedge, the third side of each wedge is preferably parallel to the direction in which the wedge is magnetized.

33 Claims, 51 Drawing Sheets

| n | 1 | | 2 | |
|---|---|---|---|---|
| | $g_n$ | $g_n \left(\frac{y_i}{r_0}\right)^{2n}$ | $g_n$ | $g_n \left(\frac{y_i}{r_0}\right)^{2n}$ |
| 1 | -1.77664E-01 | -2.17639E-02 | -1.02500E-06 | -1.25563E-07 |
| 2 | 4.76828E-02 | 7.15539E-04 | -4.43588E-07 | -6.65659E-09 |
| 3 | -1.93012E-02 | -3.54807E-05 | -1.96786E-05 | -3.61745E-08 |
| 4 | 6.57125E-03 | 1.47976E-06 | -2.83574E00 | -6.38573E-04 |
| 5 | -9.51668E-05 | -2.62522E-09 | 2.91394E+01 | 8.03825E-04 |
| 6 | -3.01278E-03 | -1.01808E-08 | -2.08162E+02 | -7.03426E-04 |
| 7 | 5.17820E-03 | 2.14354E-09 | 1.28920E+03 | 5.33669E-04 |
| 8 | -1.50058E-02 | -7.60935E-10 | -7.44508E+03 | -3.77536E-04 |
| 9 | 8.87803E-02 | 5.51495E-10 | 4.14041E+04 | 2.57198E-04 |
| 10 | -6.35099E-01 | -4.83284E-10 | -2.25414E+05 | -1.71531E-04 |

*Fig. 9*

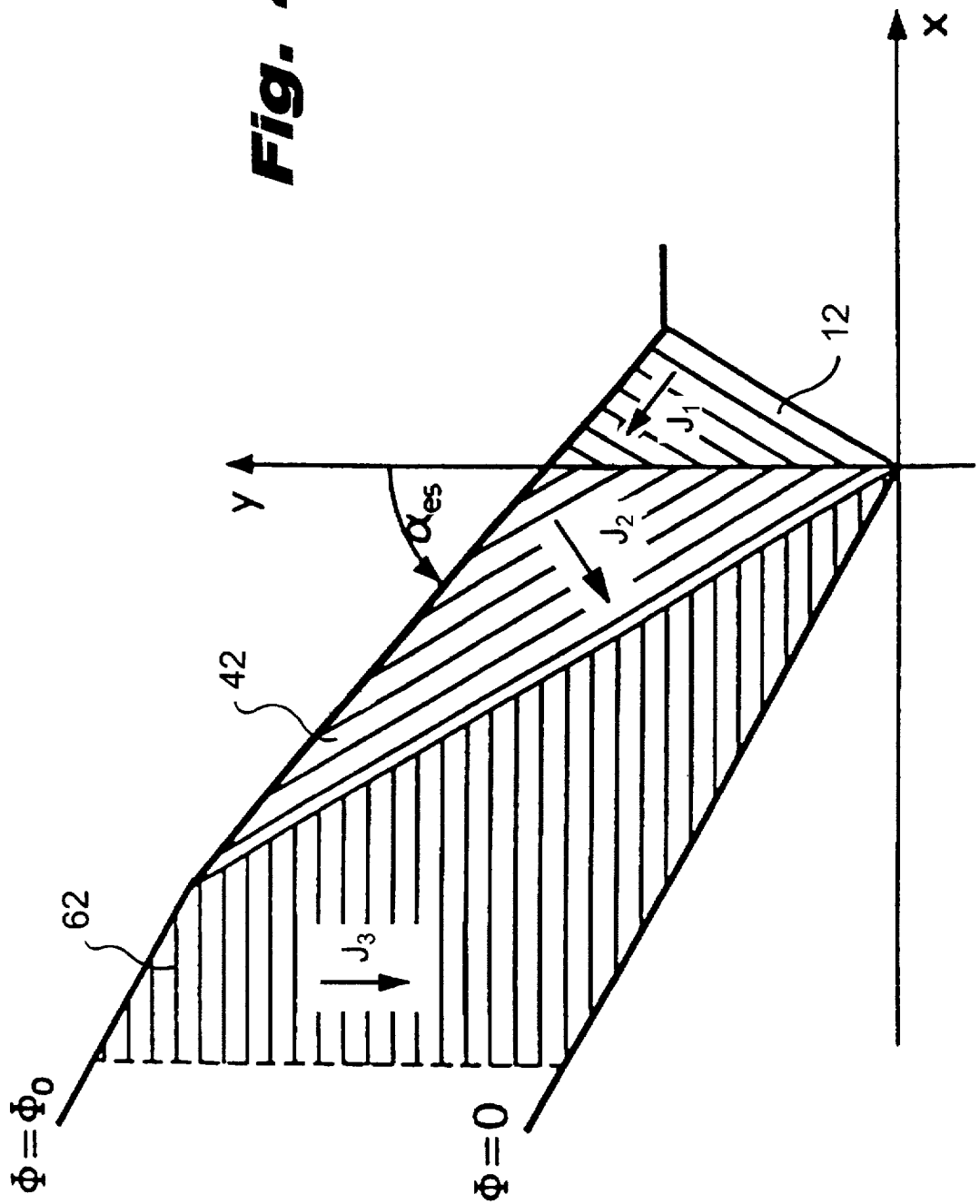

APPARATUS FOR GENERATING UNIFORM MAGNETIC FIELDS WITH MAGNETIC WEDGES

COPYRIGHT NOTICE

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

RELATED APPLICATIONS AND PATENTS

This application is related to copending U.S. application, Ser. No. 08/613,756. Related patents include U.S. Pat. No. 5,495,222 for "Open Permanent Magnet Structure for Generating Highly Uniform Field;" U.S. Pat. No. 5,475,355 for "Method and Apparatus for Compensation of Field Distortion in a Magnetic Structure Using Spatial Filter;" U.S. Pat. No. 5,428,333, for "Method and Apparatus for Compensation of Field Distortion in a Magnetic Structure;" U.S. Pat. No. 5,278,534 for "Magnetic Structure Having a Mirror;" U.S. Pat. No. 5,285,393 for "Method for Determination of Optimum Fields of Permanent Magnet Structures with Linear Magnetic Characteristics;" U.S. Pat. No. 5,412,365 for "High Field Magnets for Medical Applications;" U.S. Pat. No. 5,162,771 for "Highly Efficient Yoked Permanent Magnet;" U.S. Pat. No. 5,107,239 for "Hybrid Permanent Magnets;" U.S. Pat. No. 5,119,057 for "Optimum Design of Two-Dimensional Permanent Magnets;" and U.S. Pat. No. 4,990,083 for "Yokeless Permanent Magnet Structure and Method of Construction". All of the above patents and applications are hereby incorporated by reference into this application.

BACKGROUND OF THE INVENTION

The invention disclosed herein relates generally to magnetic structures, such as structures used in medical applications of nuclear magnetic resonance ("NMR") imaging. More particularly, the present invention relates to magnetic structures formed from one or more pairs of magnetic wedges having configurations and remanences designed to generate substantially uniform fields within a region of interest. The structures may be closed, partially open, or totally open.

A desirable feature of a magnet for NMR imaging is open access to the patient. An open magnet design should preferably be flat and provide maximum access to the patient by separating the imaging region from the source of the magnetic field which can be either a superconductive or a permanent magnet. One problem facing the designer of a flat magnetic structure is the confinement of the field to the region of interest. Another problem is designing a structure with reasonably small dimension of the flat surface relative to the size of the imaging region because large and powerful magnetic structures are usually necessary to generate the required field within a region large enough to satisfy the requirements of practical applications.

Schemes have been proposed for the development of open superconductive structures. Because of the high degree of design flexibility offered by permanent magnets, open structures based on the use of permanently magnetized materials are often preferable in spite of their field strength limitations compared to superconductive magnets. As described in U.S. Pat. No. 5,495,222, issued to the same inventors as those identified herein, permanent magnets may be used in accordance with the recently developed methodology described therein in the design of partially open magnet configurations. The present invention provides new approaches to magnet design that provide for structures which may be closed, partially open, or totally open, and which minimize the amount of magnetic material needed to generate a strong, uniform field within a region of interest.

Further background information on magnetic structures and the use of permanent magnetic structures to generate highly uniform fields is found in the patents listed above and at least in the following additional sources, each of which is hereby incorporated herein by reference:

[1] Abele, M., *Structures of permanent magnets*. John Wiley and Sons, Inc., New York, 1993.

[2] Jensen, J. H., Abele M. G., *Maximally Efficient Permanent Magnet Structures*. Journal of Applied Physics 79(2), 1157-1163, Jan. 15, 1996.

[3] Abele M. G., Jensen J. H., Rusinek H, *Open Hybrid Permanent Magnet*. Technical Report No. 29, Department of Radiology. New York University Medical Center, Mar. 15, 1995.

[4] Jensen J. H., Abele M. G., *Effects of Field Orientation on Field Uniformity in Permanent Magnet Structures*. Journal of Applied Physics 76(10), 6853-6855, 1994.

[5] Abele M. G., Jensen J. H., Rusinek H., *Linear Theory of Pole Piece Design in Permanent Magnets*. Proceedings of XIII International Workshop on Rare-Earth Magnets and Applications. C. A. F. Manwaring, D. G. R. Jones, A. J. Williams and I. R. Harris, Eds, University of Birmingham, Edgbaston, United Kingdom, pp.167-176, 1994.

[6] Abele M. G., *Generation of Highly Uniform Fields with Permanent Magnets* (invited paper). Journal of Applied Physics 76(10), 6247-6252, 1994.

[7] Abele M. G., Rusinek H., *Field Computation in Permanent Magnets with Linear Characteristics of Magnetic Media and Ferromagnetic Materials*. Technical Report No. 24, Department of Radiology, New York University Medical Center, Aug. 15, 1991.

SUMMARY OF THE INVENTION

It is an object of the present invention to provide an improved apparatus for generating a substantially uniform magnetic field within a region of interest.

It is another object of the present invention to provide a totally open magnetic structure which is useful for medical imaging.

It is another object of the present invention to reduce or compensate for distortions in a magnetic field generated by a totally open magnetic structure.

It is another object of the present invention to minimize the amount of magnetic material needed to generate a strong uniform magnetic field within a region of interest.

It is another object of the present invention to provide improved magnetic structures for NMR imaging.

The above and other objects are achieved by a magnetic structure generating a substantially uniform magnetic field within a region of interest comprising at least one pair of magnetic wedges of substantially identical shape arranged symmetrically about a first axis and abutting one another along a common edge. Each magnetic wedge has a first side and a second side which terminate at or near the common edge. A first wedge of each pair of wedges is positioned to define a first angle between the first side and the first axis and a second angle between the second side and the first axis. The first wedge is uniformly magnetized in a direction relative to a second axis (perpendicular to the first axis) which is a function of the sum of the first and second angles.

A second wedge of each pair of wedges is magnetized such that the absolute values of components of the magnetization along the first and second axes are equal to components of the magnetization of the first wedge along the first and second axes, respectively, and such that one of the magnetization components of the second wedge is opposite to the respective magnetization component of the first wedge. With this structure, the region of interest containing the substantially uniform field is between the first sides of the pair of wedges, the second sides of the pair of wedges, or both.

To minimize or eliminate the surface charge density along the third side of each wedge, the third side of each wedge is preferably parallel to the direction in which the wedge is magnetized.

The magnetization directions may be configured to provide a purely transverse field (generally parallel to the second axis) or a purely longitudinal field (generally parallel to the first axis) in the region of interest. For a transverse field, the first wedge is magnetized at an angle relative to the second axis equal to the sum of the first and second angles minus 90°. The second wedge is magnetized such that the magnetization component along the second axis is equal to the magnetization component of the first wedge along the second axis and the magnetization component along the first axis is equal and opposite to the magnetization component of the first wedge along the first axis.

For a longitudinal field, the first wedge is magnetized at an angle relative to the second axis equal to the sum of the first and second angles. The second wedge is magnetized such that the magnetization component along the first axis is equal to the magnetization component of the first wedge along the first axis and the magnetization component along the second axis is equal and opposite to the magnetization component of the first wedge along the second axis.

To help close the flux of the magnetic field the magnetic structure may comprise a high magnetic permeability yoke positioned between either the first or second sides of the at least one pair of wedges and an exterior region, whereby magnetic flux is substantially zero in the exterior region. The yoke may extend along and abut the first or second sides of the at least one pair of wedges, or may not abut the first or second sides of the at least one pair of wedges, leaving a space between the sides and the yoke into which may be positioned a filter structure as described herein.

The first and second wedges may assume a variety of shapes such as spherical wedges or prismatic wedges, but are preferably triangular in cross section.

To increase the magnitude of the magnetic field intensity, a plurality of pairs of wedges may be provided, each pair being arranged symmetrically about the first axis. The common edges of the pairs of wedges are preferably in an adjacent relationship to one another, and the angular widths between the first and second sides of the plurality of wedges are preferably substantially equal. The wedges in one pair of the plurality of pairs of wedges may have a shape which is substantially different than or identical to the shape of the wedges in another pair of the plurality of pairs of wedges.

The multiple pairs of wedges preferably abut one another, so that the first sides of at least one pair of wedges abut the second sides of another pair of wedges. Alternatively, there may be space between each pair of wedges. To close the flux in an exterior region on the opposite side of the magnetic structure as the region of interest, a high magnetic permeability yoke may be positioned between corresponding sides of one of the pairs of wedges and an exterior region.

The magnetic structure may be closed, partially open, or totally open. For a closed magnet the magnetic structure would comprise one or more additional magnetic elements connected to the pair(s) of wedges, the one or more additional magnetic elements defining with the wedges a cavity in which the region of interest is situated. For a partially open magnet, the structure may contain additional elements which partially enclose with the wedges a cavity, but which cavity is open at at least one side thereof. For a totally open magnet, the region of interest is unbounded by any magnetic element other than the wedges.

Means may be provided for compensating for distortions in the substantially uniform magnetic field produced by the magnetic wedges. The means may comprise at least one filter structure positioned adjacent to either the first or second sides of a pair of wedges. The filter structure comprises one or more filter elements, and may be positioned between the high magnetic permeability yoke and the pair of wedges.

The means may also comprise a pair of dipole distributions of uniform moments positioned adjacent to either the first or second sides of a pair of wedges, the dipole distributions being positioned symmetrically about the first axis. If the dipole distributions are oriented in opposite directions along the first axis, they compensate for distortions in any component of the magnetic field along the second axis. If the dipole distributions are oriented in the same direction along the first axis, they compensate for distortions in any component of the magnetic field along the first axis. Two sets of dipole distributions may be employed to compensate for distortions in both components of the field.

The compensation means may comprise at least one pair of elements positioned at or near ends of first or second sides of a pair of wedges. The elements may comprise a pair of substantially identical ferromagnetic pole pieces positioned symmetrically about the first axis, or at least one pair of substantially identical magnetized elements positioned symmetrically about the first axis.

BRIEF DESCRIPTION OF THE DRAWINGS

The invention is illustrated in the figures of the accompanying drawings which are meant to be exemplary and not limiting, in which like references refer to like or corresponding parts, and in which:

FIG. 9 is a table of coefficients of the field expansion as a series given in Eq. (2.2) of the wedge structures of FIGS. 7 and 8;

FIG. 45 is a schematic diagram for the y>0 region of a triple wedge pair magnetic structure of an embodiment of the present invention;

DETAILED DESCRIPTION OF THE PREFERRED EMBODIMENTS

Figure 1:
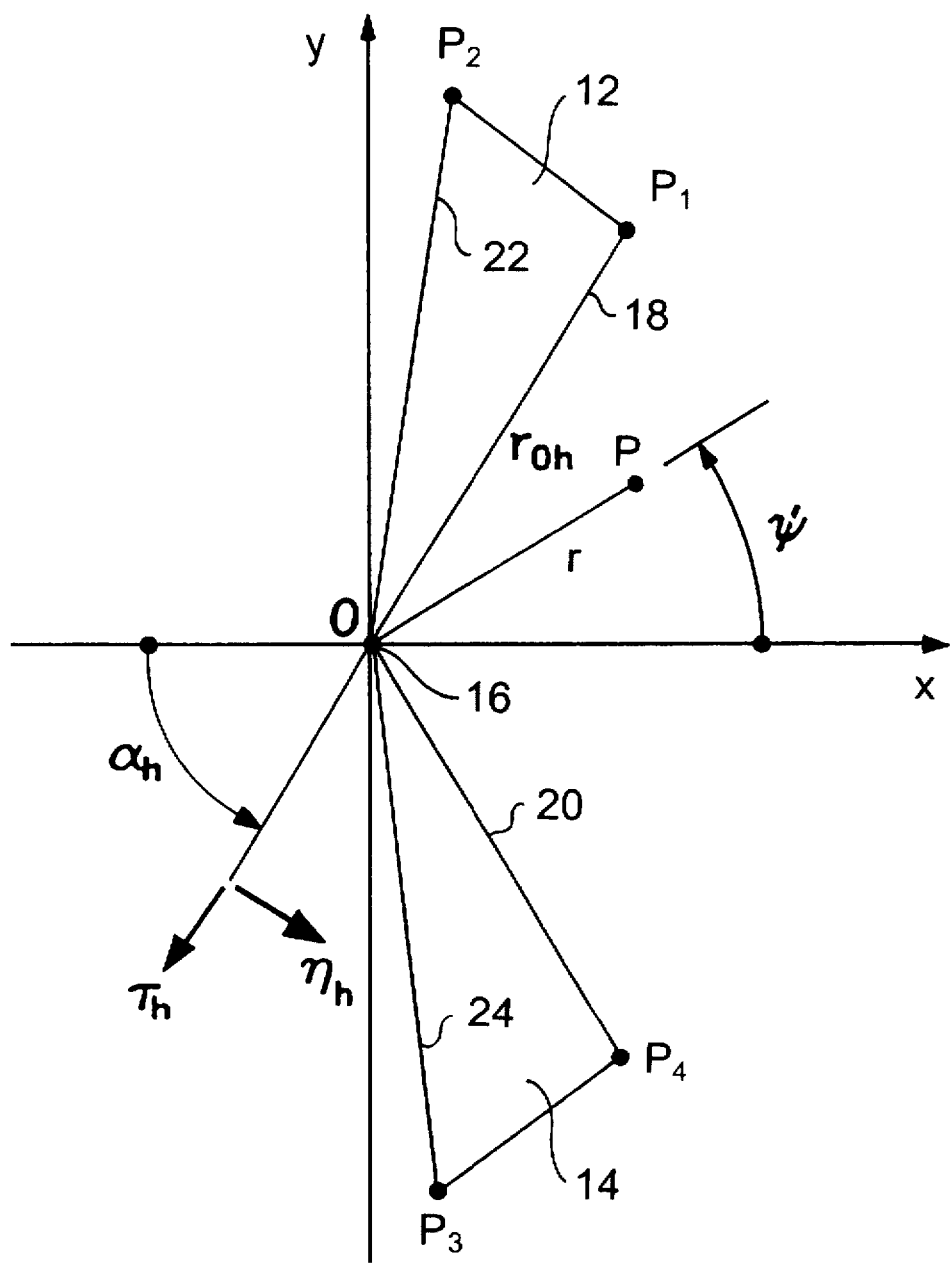
FIGS. 1–3 are schematic diagrams of cross sections of embodiments of magnetic structures of the present invention with a single pair of wedge magnets.

The magnetic structures of preferred embodiments of the present invention having single or multiple pairs of wedge magnets will be described in the following sections with reference to the drawings in the figures. Section 1 contains an analysis of the properties of a two dimensional magnetic structure and, in particular, of the distribution of magnetization required to generate an arbitrarily assigned orientation of the field within a region of interest. Section 2 contains a description of the achievement of a uniform field within the region of interest including the design of filter structures that cancel the dominant spatial harmonics of the field distortion. Section 3 contains an analysis of the effect of the relative orientation of the wedges on the properties of the region of interest, and a description of single wedge pair embodiments of the present invention incorporated closed and open magnetic structures. Sections 4 and 5 contain a description of magnetic structures of preferred embodiments having multiple wedge magnets and terminations for such wedge magnets. Section 6 extends the two dimensional formulation of previous sections to an embodiment of a three dimensional wedge structure of finite dimensions.

The magnetic structures described herein have potential use in dedicated scanners wherein the region of interest is the imaging area and is close to the surface of a body, for instance the breast or the spine area of the human body. For example, the magnetic structure 10 of FIG. 50 contains a pair of identical magnetized wedges 12 and 14 arranged symmetrically about the x axis. The wedges 12 and 14 have a common edge 16 extending along the z axis. Wedges 12 and 14 have sides 18 and 20, respectively, which are effectively the "interior" sides of the structure 10 and sides 22 and 24, respectively, which are effectively the "exterior" sides of the structure 10. The wedges 12 and 14 are magnetized in order to generate a magnetic field within a region of interest between the interior sides 18 and 20, which is the imaging region for a part of the human body. As described in detail herein, the magnetic field can be generated at a desired strength and uniformity by varying the orientation, size and number of wedges, and by adding filter structures, dipole distributions, and other structural elements. A yoke 26 made of high magnetic permeability material extends along the exterior sides 22 and 24 to close the flux. Each particular application determines the geometrical constraints of the imaging region and, as a consequence, provides the input of the design of the magnet configurations and appropriate filter structures as described herein.

1. Analysis of Magnetized Wedges

Figure 50:
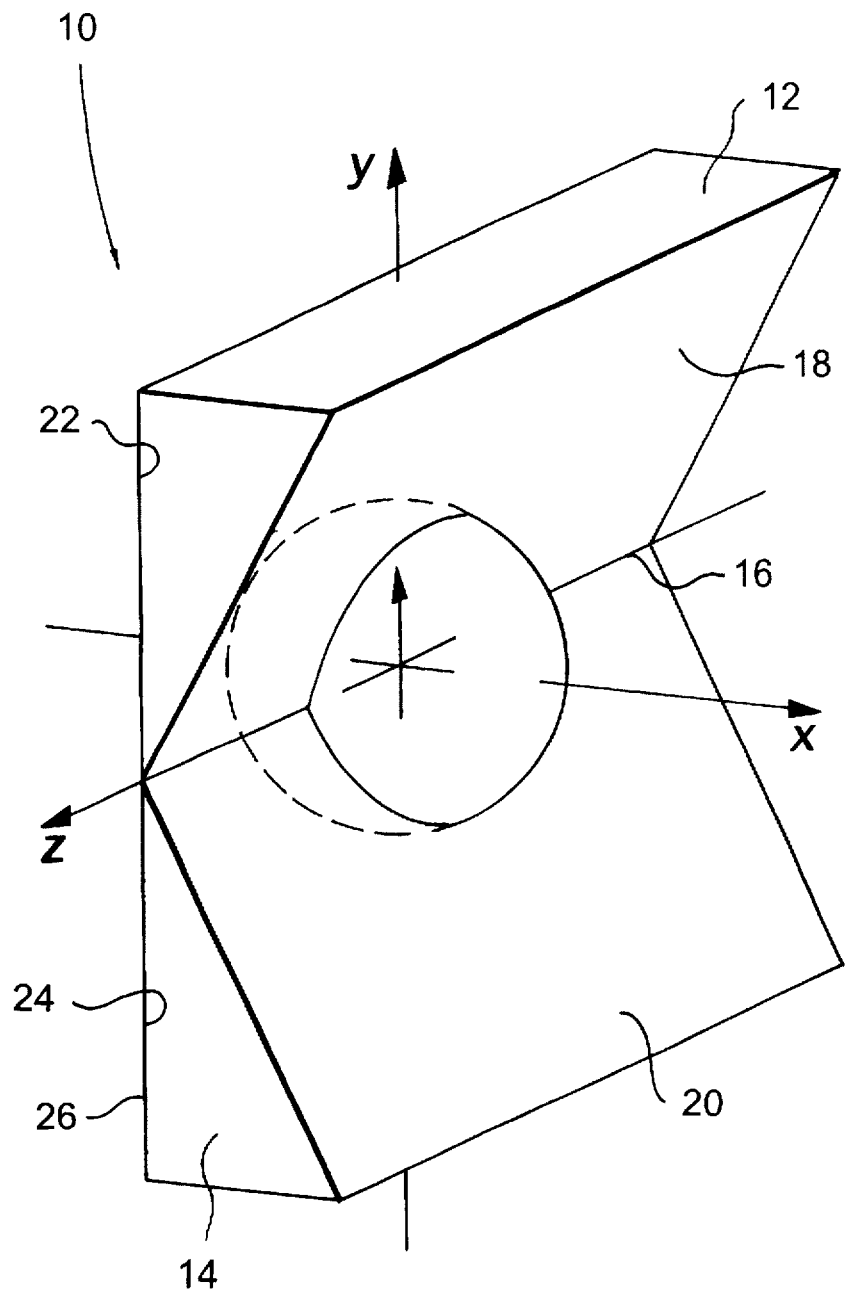
FIG. 50 is a perspective three-dimensional view of a single wedge pair magnetic structure of one embodiment of the present invention.

The magnetic structure of FIG. 50 can be analyzed by considering a cross section of the structure taken along the z axis. The basic component of the wedge magnet is the two-dimensional structure of FIG. 1. The structure consists of two identical wedges 12 and 14 of magnetic material symmetrically arranged with respect to the axis x with a common edge 16 as shown in FIG. 1. The wedges are located in a non magnetic medium. Assume an ideal demagnetization characteristic $$\vec{B} = \vec{J} + \mu_0 \vec{H}, \tag{1.1}$$

where $\vec{B}$, $\vec{H}$ are the magnetic induction and intensity respectively, and $\mu_0$ is the permeability of a vacuum. The orientations of the four surfaces 18, 22, 24, and 20 of the wedges 12 and 14, which meet at the vertex at the common edge 16, are given respectively by the angles $$\alpha_1, \alpha_2, \alpha_3 = 2\pi - \alpha_2, \alpha_4 = 2\pi - \alpha_1. \tag{1.2}$$

The magnetization $\vec{J}$ of the wedges 12 and 14 induces a uniform surface charge density $\sigma_h$ on each of the four interfaces that have the axis z in common. The induced surface charge densities are $$\sigma_1 = J_0 \cos(\alpha_1 - \theta), \sigma_2 = J_0 \cos(\alpha_2 - \theta), \sigma_3 = -\sigma_2, \sigma_4 = -\sigma_1, \tag{1.3}$$

where $\theta$ is the angle between the remanence $\vec{J}$ of the wedge in the region y>0 and the axis y.

At a point P, the surface charge densities $\sigma_h$ generate an intensity of the magnetic field $\vec{H}_h$ $$\vec{H}_h = \tag{1.4}$$

$$-\frac{\sigma_h}{2\pi\mu_0} \left\{ \left[ \ln r - \frac{1}{2} \ln(r^2 + r_{0h}^2 - 2r_{0h}r\cos(\alpha_h - \psi)) \right] \vec{\tau}_h - \left[ \pi - \alpha_h + \psi - \arctan\frac{\eta_h}{r_{0h} - r\cos(\alpha_h - \psi)} \right] \vec{\eta}_h \right\},$$

where r, $\psi$ are the polar coordinates of point P, as indicated by FIG. 1. $r_{0h}$ is the radial dimension of interface $S_h$ between wedges and external medium. $\eta_h$ is the coordinate of P in the frame of reference of the interface defined by the unit vectors. $\tau_h$, $\eta_h$, as indicated in FIG. 1. Sides ($P_1P_2$) and ($P_3P_4$) are assumed to be parallel to the remanence of the two wedges.

Assume $r_{0h} \to \infty$. The two wedges 12 and 14 generate a uniform field if the charges $\sigma_h$ satisfy the condition $$\sum_{h=1}^{4} \sigma_h \vec{\tau}_h = 0 \tag{1.5}$$

Eq. 1.5 has two particular solutions:

$$\sigma_4 = -\sigma_1, \sigma_3 = -\sigma_2, \sigma_1 \sin\alpha_1 + \sigma_2 \sin\alpha_2 = 0 \tag{1.6}$$

and $$\sigma_4 = \sigma_1, \sigma_3 = \sigma_2, \sigma_1 \cos\alpha_1 + \sigma_2 \cos\alpha_2 = 0. \tag{1.7}$$

When condition (1.6) is satisfied, the remanence $\vec{J}$ in the region y>0 (in the wedge 12) is oriented at an angle $\theta_1$ relative to the axis y $$\theta_1 = \alpha_1 + \alpha_2 - \frac{\pi}{2} \tag{1.8}$$

and $$J_x(-y) = -J_x(-y), J_y(-y) = J_y(y). \tag{1.9}$$

Figure 2:
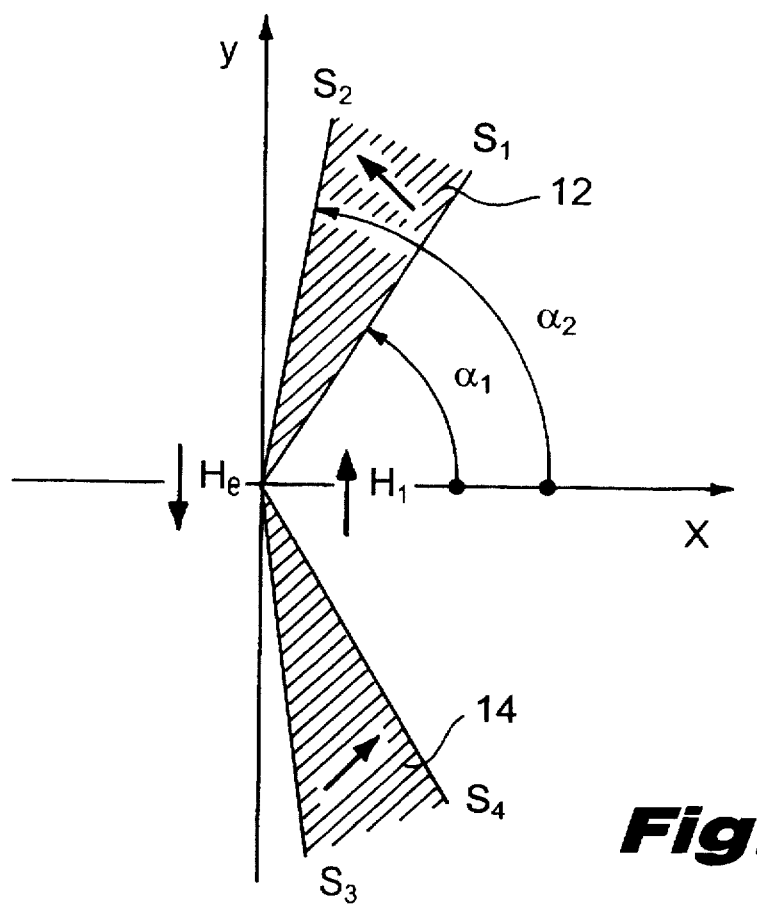

Eq. 1.9 corresponds to the distribution of magnetization shown in FIG. 2 (the thick arrows within the wedges in the figure representing the magnetization). Under condition (1.6), the components of intensity $\vec{H}_i$ in the region $$-\alpha_1 < \alpha < \alpha_1 \tag{1.10}$$

are $$H_{ix} = 0,$$

$$H_{iy} = \frac{KJ_0}{\mu_0} \left\{ 1 - \frac{\alpha_m}{\pi} + \frac{\sin 2\alpha_m}{2\pi K}(\alpha_2 - \alpha_1) \right\} + \tag{1.11}$$

$$\frac{J_0}{\pi\mu_0} \sin\alpha_1 \sin\alpha_2 \ln\left|\frac{\sin\alpha_1}{\sin\alpha_2}\right|,$$

where $J_0$ is the magnitude of $\vec{J}$, and $$\alpha_m = \frac{1}{2}(\alpha_2 + \alpha_1) \tag{1.12}$$

and $$K = \sin(\alpha_2 - \alpha_1). \tag{1.13}$$

In the region $$\alpha_2 < \alpha < 2\pi - \alpha_2, \tag{1.14}$$

the intensity $\vec{H}_e$ is also parallel to the axis y, and oriented in the opposite direction of $\vec{H}_i$ as indicated in FIG. 2. Its magnitude is given by $$\mu_0(H_i - H_e) = KJ_0, \quad (1.15)$$

which is independent of the orientation $\alpha_m$ of the wedges.

The constant K given by Eq. (1.13) depends on the angle of the wedges only, and it attains its maximum $$K = 1 \text{ for } \alpha_2 - \alpha_1 = \frac{\pi}{2}. \quad (1.16)$$

In the limit $$\alpha_m = \frac{\pi}{2} \quad (1.17)$$

the wedges are symmetric with respect to the x=0 plane. The remanence is parallel to the x axis and Eqs. (1.11) and (1.15) yield $$\frac{\mu_0 H_i}{KJ_0} = -\frac{\mu_0 H_e}{KJ_0} = \frac{1}{2}. \quad (1.18)$$

Under condition (1.7) the remanence $\vec{J}$ in the region y>0 (in the wedge 12) is oriented at an angle $\theta_2$ relative to the axis y $$\theta_2 = \alpha_1 + \alpha_2 \quad (1.19)$$

and $$J_x(-y) = J_x(y), \quad J_y(-y) = -J_y(y) \quad (1.20)$$

Figure 3:
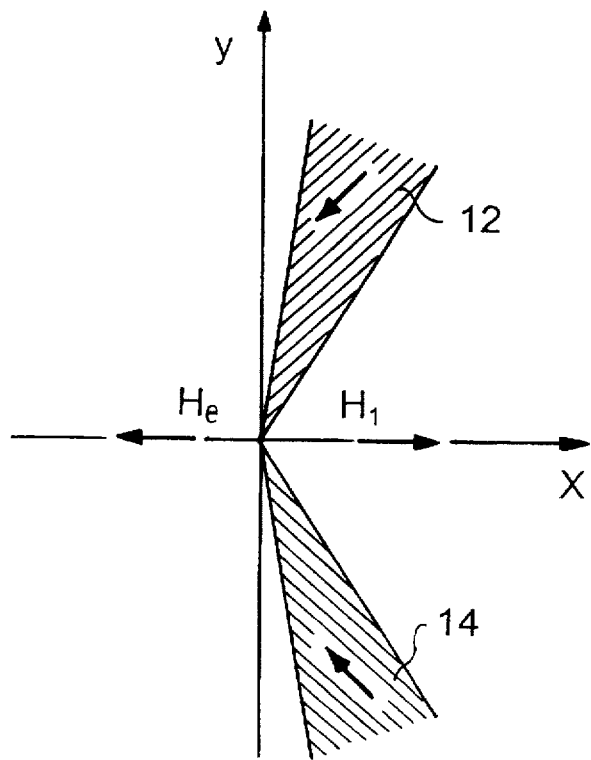

Eq. (1.20) corresponds to the distribution of magnetization shown in FIG. 3. In the region (1.10) the components of intensity $H_i$ are:

$$H_{ix} = \frac{KJ_0}{\mu_0} \left\{ 1 - \frac{\alpha_m}{\pi} + \frac{\sin 2\alpha_m}{2\pi K}(\alpha_2 - \alpha_1) \right\} + \quad (1.21)$$

$$\frac{J_0}{\pi\mu_0} \cos\alpha_1 \cos\alpha_2 \ln\left|\frac{\cos\alpha_1}{\cos\alpha_2}\right|,$$

$$H_{iy} = 0$$

In the region (1.14) the intensity $\vec{H}_e$ is also parallel to the axis x and oriented in the opposite direction of $\vec{H}_i$ and its magnitude is given by the same equation (1.15).

Figure 7:
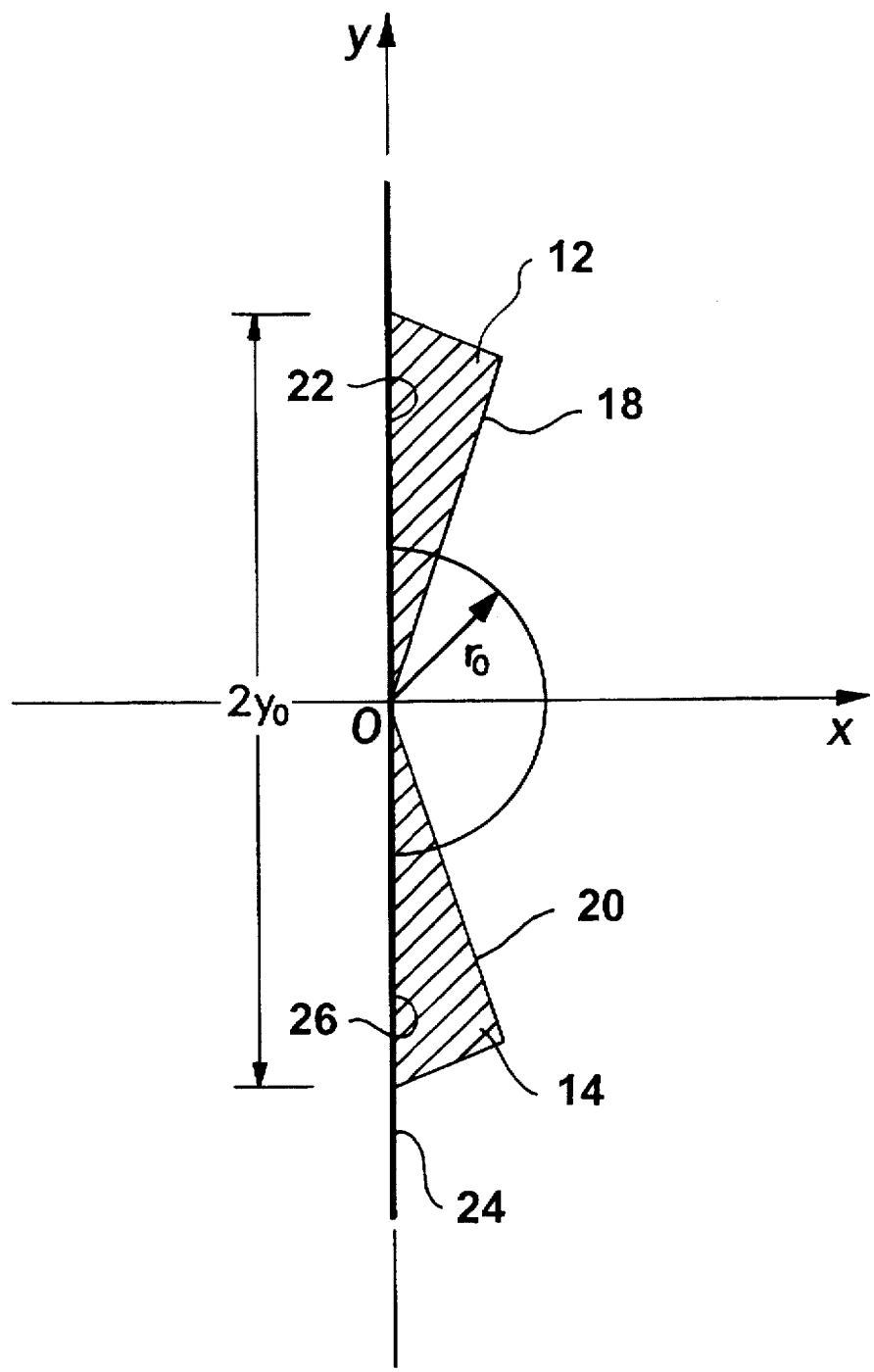
FIG. 7 is a schematic diagram of a cross section of one embodiment of a magnetic structure of the present invention having a high permeability yoke.

Eqs. (1.7), (1.11), (1.19) and (1.21) show that a rotation of $\vec{J}$ by +π/2 results in a rotation of vectors $\vec{H}_i$, $\vec{H}_e$ by −π/2 [1]. By virtue of results (1.11) and (1.21) any combination of remanences satisfying conditions (1.8), (1.9) and (1.19), (1.20) may be used to generate a uniform field of arbitrary orientation. As a consequence, if the magnetization of both wedges is rotated by an arbitrary angle $\theta_1$, the difference vector Hi−He is rotated by the the angle −$\theta_1$, while maintaining the magnitude of $KJ_0/\mu_0$. This follows naturally from the simple superposition of the conditions expressed in equations (1.8), (1.9), (1.19), (1.20), and the resultant uniform field $\vec{H}_i$ will be oriented at an angle $\theta_2$, which depends upon the angle $\theta_1$ chosen. FIG. 1A illustrates the above, showing the angles of the parameters described for a chosen arbitrary angle $\theta_1$. It follows that when a high permability member is added to one side of the structure, as described below in greater detail, one of the field vectors becomes zero leaving only the other field vector active. For example, if a member 26, as illustrated in FIG. 7, is added at the lefthand side to short-circuit $\vec{H}_e$, only the field $\vec{H}_i$ on the right remains. In this case, the angle of orientation $\theta_2$ of the field $\vec{H}_i$ becomes equal to −$\theta_1$.

It also follows that when $\theta_1 = \pi/2$, the uniform magnetic field is parallel to the y axis, i.e., the transverse field results, and when $\theta_1 = \pi$, the uniform magnetic field is parallel to the x axis, i.e., the longitudinal field results.

The boundary conditions across the surfaces of the wedges are not violated by the addition of a magnetic field generated by other sources. In particular, in the ideal system of infinitely large dimensions $r_{0h}$, the addition of a uniform field intensity equal and opposite to either $\vec{H}_e$ or $\vec{H}_i$, confines the field to either region (1.10) or region (1.14) respectively.

Either intensity $\vec{H}_e$ or $\vec{H}_i$ can be eliminated by assuming that either sides $s_2$, $s_3$ (22 and 24) or sides $s_1$, $s_4$ (18 and 24) are interfaces between the wedge material and a medium of infinity magnetic permeability 26. As one skilled in the art will recognize, the medium 26 need not directly abut the sides of the wedges, but may be positioned at a distance from the sides and still close the flux of the magnetic field generated by the wedges. For example, see FIG. 32A.

Figure 4A:
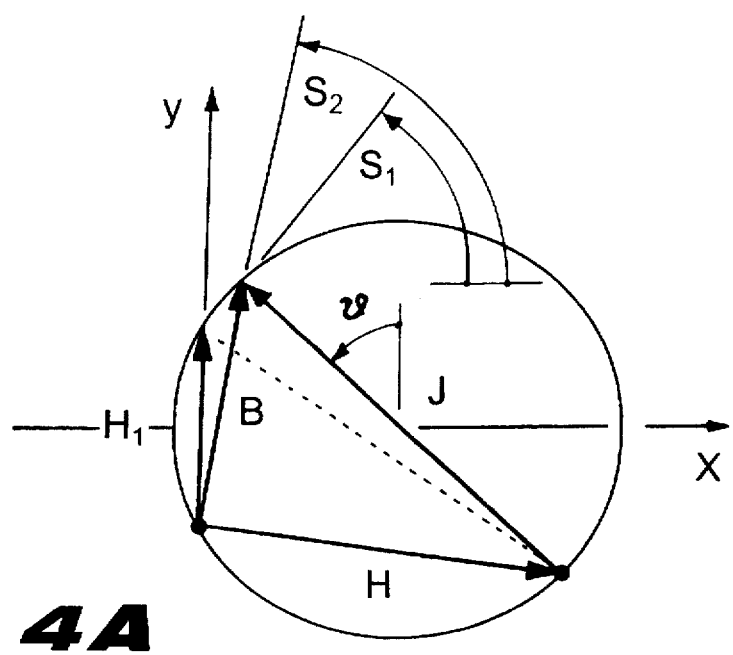
FIGS. 4A–4C are vector diagrams that provide the values of $\vec{B}$ and $\vec{H}$ within wedges for magnetic structures of embodiments of the present invention.
Figure 4B:
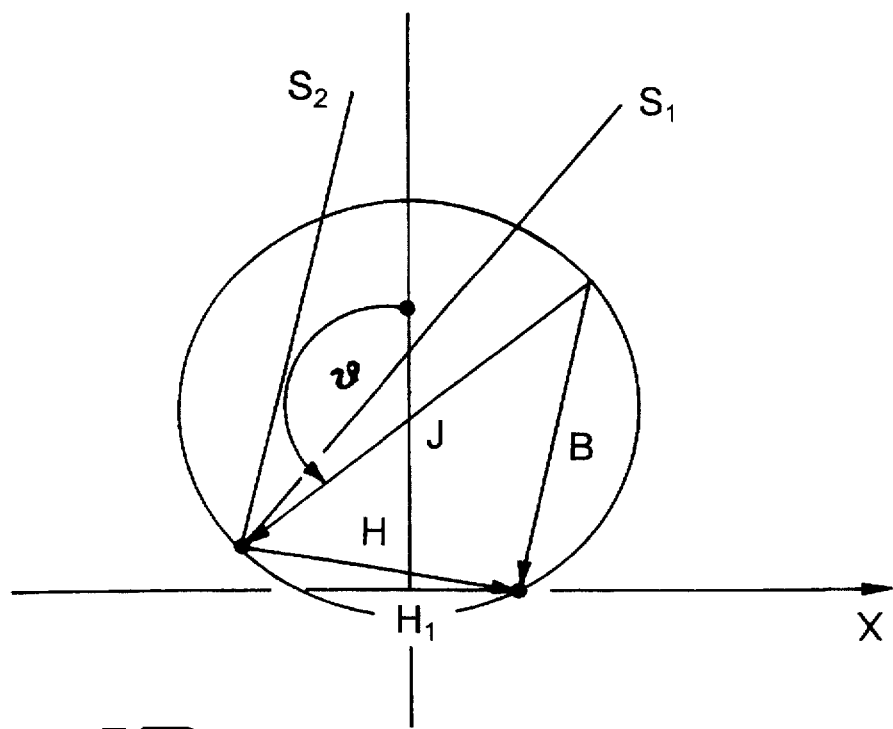

With the condition $\vec{H}_e = 0$ the vector diagrams of FIGS. 4A–4B show vectors $\vec{B}$, $\vec{H}$ within the wedge 12 in the region y>0 in the two areas (1.8), (1.9) and (1.19), (1.20). In both cases vector $\vec{B}$ is parallel to interface $s_2$. The solid lines in FIG. 4A correspond to $\vec{H}_e = 0$ and the dashed lines correspond to $\vec{H}_i = 0$. Consider the solution $$\vec{H}_e = 0 \quad (1.22)$$

in the limit $r_{0h} \to \infty$. Two particular cases are of interest. Assume first $$\alpha_2 = \frac{\pi}{2} \quad (1.23)$$

In this case the magnetic induction $\vec{B}$ within the wedges reduces to $$\vec{B} = \mu \vec{H}_i, \quad (1.24)$$

i.e., in the y>0 region the remanence is perpendicular to the h=1 interface (side 18) and the intensity $\vec{H}$ within the wedges is oriented parallel to the x axis with a magnitude $$\mu_0 H = \sqrt{1 - K^2}\, J_0. \quad (1.25)$$

Figure 4C:
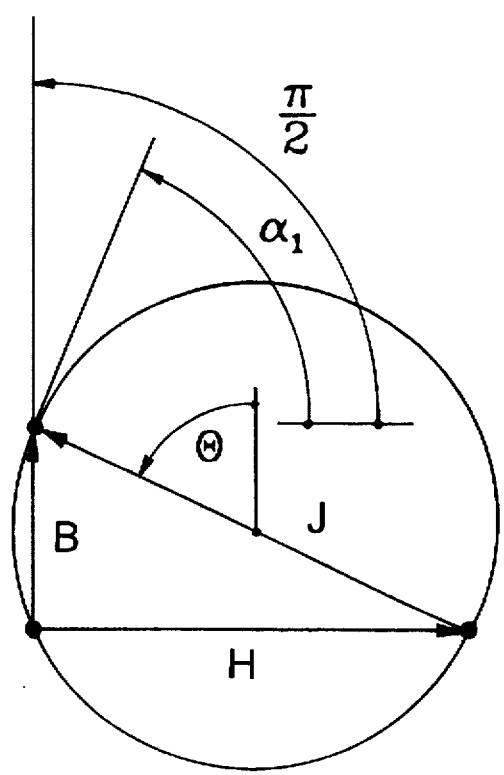

This is shown in the vector diagram of FIG. 4C derived from the diagram of FIG. 4A for the case (1.23).

The second case is $$\alpha_1 = \frac{\pi}{2} \quad (1.26)$$

which, by virtue of the vector diagram of FIG. 4A, yields $$\vec{B} = 0, \quad \mu_0 \vec{H} = -\vec{J} \quad (1.27)$$

Thus in the case (1.26) the wedges do not carry a flux of the magnetic induction and the remanences of the wedges are perpendicular to the h=2, h=3 interfaces (sides 20 and 22).

In the case of finite dimensions $r_{0h}$, the field generated by the wedges is no longer uniform. FIG. 1 shows the truncation of the wedges along segments ($P_1P_2$) and ($P_3P_4$) symmetrically arranged with respect to the axis x. If the wedge truncations are parallel to the remanence, $\sigma_h$, h=1 . . . 4, are the only charges induced by $\vec{J}$ and the field generated at each point is given by the sum of Eqs. (1.4).

Figure 5:
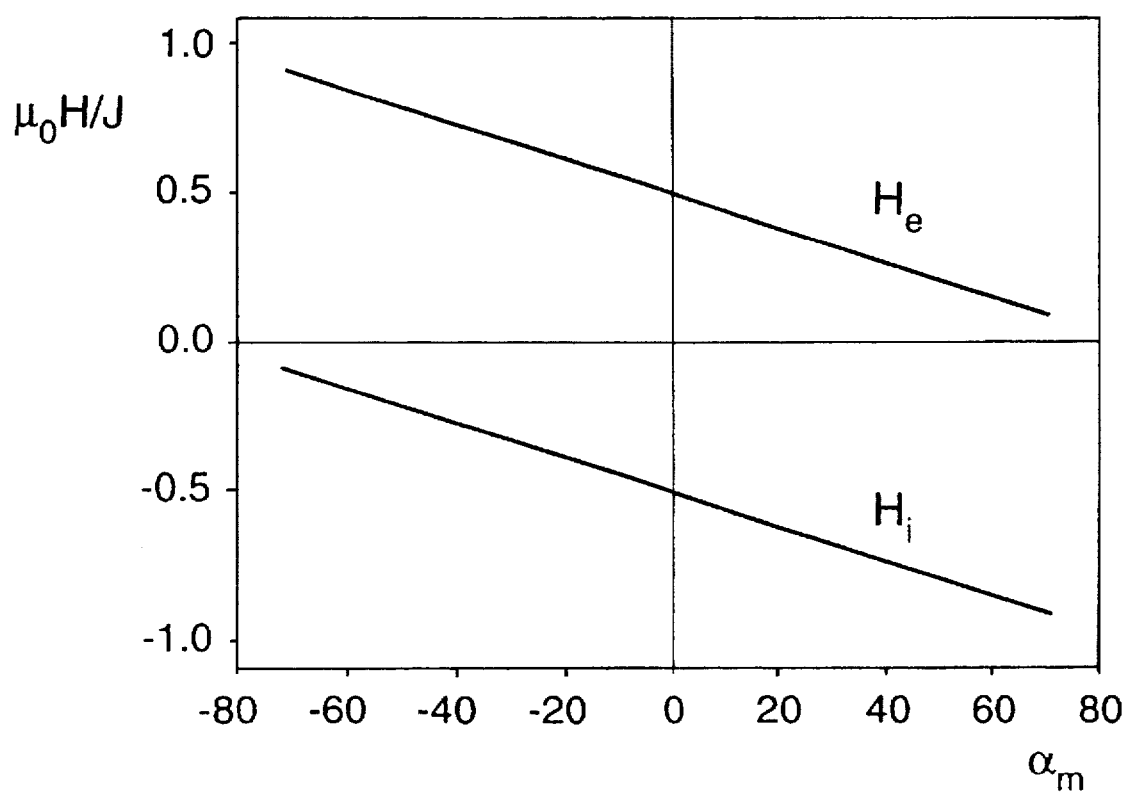
FIG. 5 is a graph showing plots of the intensities $H_i$ and $H_e$ in the limit r→0 versus the orientation $\alpha_m$.

Consider first condition (1.6). In the limit $r \ll r_{0h}$, Eqs. 1.4 yield an intensity $\vec{H}_i$ on the x axis with components $$H_{ix} = 0, H_{iy} - (H_{iy})_0 - \frac{4}{\pi \mu_0} KJ_0 \frac{x}{y_0}, \quad (1.28)$$

where $(H_{iy})_0$ is the magnitude of the intensity at $x \to +0$ (as x converges to 0 from the positive side, i.e., $x>0$) and $$y_0 = \frac{r_{01}}{\sin \alpha_1} = \frac{r_{02}}{\sin \alpha_2} \quad (1.29)$$

i.e., the end points of sides $s_1$, $s_2$ are located on a circle of diameter $y_0$ and center at $x=0$, $y=y_0/2$. At $x=0$ the intensity suffers a discontinuity given by Eq. (1.15). However, the derivative of $H_{iy}$ with respect to x $$\frac{d}{d(x/y_0)} \left( \frac{\mu_0 H_{iy}}{J_0} \right) = -\frac{4K}{\pi} \quad (1.30)$$

is continuous at $x=0$, and is independent of the orientation $\alpha_m$ of the wedges 12 and 14. Length $y_0$ is the normalization factor of the wedge dimensions. The values of $H_i$, $H_e$ in the limit $r \to 0$ are plotted in FIG. 5 versus orientation $\alpha_m$. The plottings of FIG. 5 are computed within the range of distance $r/r_{0h}=10^{-2}$.

A particular geometry of the wedge structure is $\alpha_2 = \pi/2$, i.e., the case of $s_2$ and $s_3$ (sides 22 and 24) located on the plane $x=0$. By virtue of Eq. (1.18) the remanence is perpendicular to $s_1$ (side 18) and for $y_0 = \infty$ the induction $\vec{B}$ is everywhere parallel to the axis y.

Figure 6:
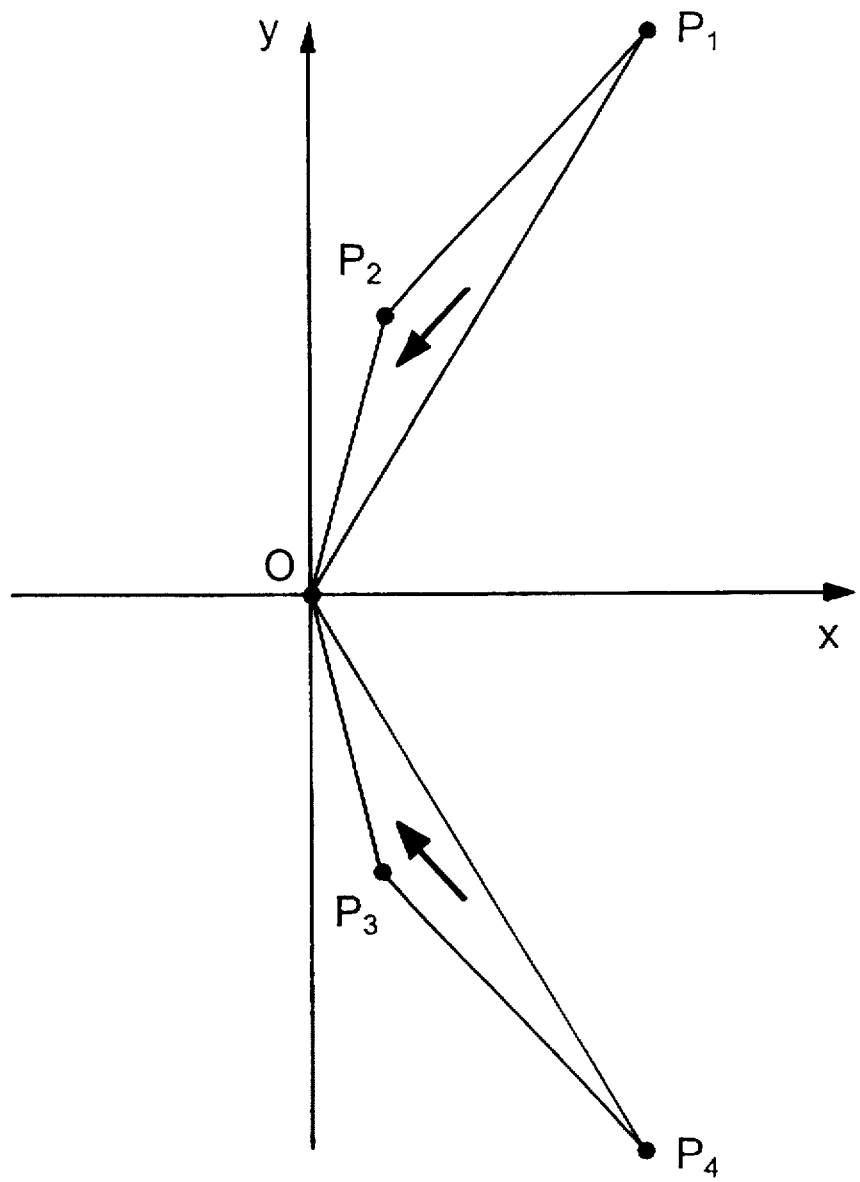
FIG. 6 is a schematic diagram of a cross section of one embodiment of a magnetic structure of the present invention generating a longitudinal field.

Consider now condition (1.7). The truncation of the wedges along segments $(P_1P_2)$ and $(P_3P_4)$ parallel to the remanence yields the geometry shown in FIG. 6. Again in the limit $r \gg r_{0h}$, Eqs. (1.4) yield an intensity $\vec{H}$ on the axis x of components $$H_{iy} = 0, H_{ix} \cong (H_{ix})_0 - \frac{K}{\pi \mu_0} J_0 \frac{x \sin 2\alpha_m}{r_{02} \cos \alpha_1} \quad (1.31)$$

where $H_{ix}$ is the magnitude of the intensity at $x \to +0$. The two radial dimensions $r_{01}$, $r_{02}$ satisfy the equation $$\frac{r_{01}}{\cos \alpha_1} = \frac{r_{02}}{\cos \alpha_2} = x_0, \quad (1.32)$$

where $x_0$ is the new normalization factor of the wedge dimensions. Again the derivative of the intensity with respect to x is continuous at $x=0$, and its value is given by $$\frac{d}{d(x/x_0)} \left( \frac{\mu_0 H_{ix}}{J_0} \right) = -\frac{K}{\pi} (\tan \alpha_1 + \tan \alpha_2). \quad (1.33)$$

Thus in the second case (1.7) the derivative of the intensity is a function of the orientation of the wedges. In the limit $\alpha_2 = \pi/2$, Eq. (1.33) reduces to $$\frac{d}{d(x/r_{02})} \left( \frac{\mu_0 H_{ix}}{J_0} \right) = -\frac{K}{\pi} = \frac{1}{4} \frac{d}{d(x/y_0)} \left( \frac{\mu_0 H_{iy}}{J_0} \right). \quad (1.34)$$

In the limit $\alpha_2 = \pi/2$, the remanence is parallel to $s_1$, and by virtue of Eq. (1.7) no surface change is induced on interfaces $s_1$, $s_4$ whose radial dimensions become infinitely large. As a consequence the field generated by the wedges reduces to the field of a uniform charge distribution on the plane surface of dimension $2r_{02}$, in the $x=0$ plane.

At a distance $r \gg r_{0h}$, the field generated by the wedges reduces to the field generated by a uniform dipole distribution located on the z axis with a dipole moment per unit length $\vec{p}$ oriented either in the y or x direction. In the case defined by condition (1.6) the dipole moment is $$\vec{p}_j = 2A_1 J_0 \cos \theta_1 \vec{y}, \quad (1.35)$$

where $A_1$ is the area of each wedge cross section. In the case defined by condition (1.7) the dipole moment $\vec{p}$ is $$\vec{p}_j = 2A_2 J_0 \cos \theta_2 \vec{x} \quad (1.36)$$

By virtue of Eqs. (1.7) and (1.19), if $A_1 = A_2$, $\vec{p}_1$ and $\vec{p}_2$ have the same magnitude independent of the orientation of $\vec{J}$.

2. Generation of a Uniform Field 2.1 Transverse Field—Field parallel to the y axis The preceding section has presented the basic properties of the wedge structures of the present invention. As explained above, the magnetic field can be confined to either side of the wedge structure by short-circuiting the other side with a high magnetic permeability material. In a general case $\alpha_2 \neq \pi/2$, the field in the region $\alpha_2 < \alpha < 2\pi - \alpha_2$ can be eliminated by assuming that $s_2$, $s_3$ are the interfaces between the wedges and a $\mu = \infty$ material. In the particular case $\alpha_2 = \pi/2$, this transformation does not apply to condition (1.7), because the field generated by the wedges 12, 14 is perpendicular to the plane $x=0$ and the surface charge $\sigma_2$, $\sigma_3$ induced by $\vec{J}$ on the plane $x=0$ are canceled by the $\mu = \infty$ material. Thus the field generated by $\vec{J}$ would reduce to the field generated by the surface charges induced on a truncation of the wedges required to keep the radial dimensions of $s_1$, $s_4$ finite.

If the wedge structure is intended to generate a uniform field within a given distance rfrom the common edge, Eqs. (1.30) and (1.33) provide the order of magnitude of the dimensions of the wedges necessary to achieve an assigned degree of uniformity within such a distance. Assume the particular case $\alpha_2 = \pi/2$ in the absence of the high magnetic permeability yoke 26. If $\delta H_i$ is the maximum value of the field distortion that can be tolerated within distance $r_1$, Eq. (1.30) indicates that the order of magnitude of $y_0$ must satisfy the condition $$0 \left( \frac{r_1}{y_0} \right) \leq \frac{\pi}{4} \frac{\delta H_i}{(H_i)_0} \quad (2.1)$$

Thus $y_0$ must be several orders of magnitude larger than the assigned dimension $r_1$ in order to achieve a uniformity $\delta H/(H_i)_0$ of the order of $10^{-4}$ or better. The achievement of such a highly uniform field with practical wedge dimensions is outside the range of traditional shimming and requires a modification of geometry and magnetization of the structure. The technique described herein is based on a theory of field correction developed by the inventors, based on the elimination of the spatial harmonics of the field distortion in magnets designed to generate the uniform fields.

To discuss the field correction technique, consider the two-dimensional, cross-sectional geometry of FIG. 7 that corresponds to the $\alpha_2 = \pi/2$ case where $s_2$ and $s_3$ (sides 22 and 24) coincide with the plane surface of a $\mu = \infty$ material 26, and assume the distribution of the remanence defined by condition (1.6). The y dimension of the $\mu = \infty$ surface 26 (schematically represented by the heavy line in FIG. 7) is assumed to be large compared to the $2y_0$ dimension of the wedge structure. As shown in FIG. 7, consider a cylindrical surface of radius $r_0$ coaxial with the axis z, and assume $r_0 < y_0$. By virtue of the geometrical and magnetization symmetry within the cylinder of radius $r_0$ the potential $\Phi(r, \alpha)$ of the field distortion generated by the finite dimension $y_0$ of the wedges 12, 14 can be expanded in the series $$\Phi(r, \alpha) = \sum_{n=1}^{\infty} g_n \left( \frac{r}{r_0} \right)^{2n} \sin 2n\alpha \qquad (2.2)$$

where $g_n$ are the amplitudes of the harmonics of the field distortion on the cylindrical surface $r=r_0$. The harmonics can be compensated by assuming a surface distribution of dipole moment density $\vec{p}_s(y)$ on the plane x=0, oriented perpendicular to the plane. Because of symmetry the magnitude of $\vec{p}_s$ satisfies the condition $$p_s(-y) = -p_s(y). \qquad (2.3)$$

The distribution of $\vec{p}_s$ extends on the plane x=0, outside the interval $2y_0$. The potential $\Phi_s(r,\alpha)$ generated by $\vec{p}_s$ in the region $r \leq r_0$ can be expanded in a series like Eq. (2.2), and its value on the cylinder of radius $r=y_0$ is $$\Phi_s = \frac{2}{\pi\mu_0} \sum_{n=1}^{\infty} (-1)^n \int_{r_0}^{\infty} \frac{p_s(y)}{y^{2n+1}} dy \, r^{2n} \sin 2n\alpha. \qquad (2.4)$$

The harmonics of the field distortion are compensated if $$\Phi_s = -\Phi(r_0, \alpha). \qquad (2.5)$$

Thus the distribution of $\vec{p}_s$ must satisfy the system of integral equations $$\frac{2}{\pi\mu_0} (-1)^{n+1} r_0^{2n} \int_{r_0}^{\infty} \frac{p_s(y)}{y^{2n+1}} dy = g_n, \qquad (2.6)$$

$$(n = 1, 2, 3, \ldots)$$

The lower order harmonics are the dominant components of the field distortion. Thus the system of Eqs. (2.5) can be limited to the lower values of n, and the distribution of $p_s(y)$ can be confined to a finite interval $y_e-y_i$ contained within $y_0$. The simplest example is the compensation of the fundamental harmonic n=1, without introducing other harmonics, in which case $p_s(y)$ must satisfy Eqs. (2.6) where $$g_1 \neq 0 g_n = 0 \text{ for } n \neq 1. \qquad (3.7)$$

As a consequence $p_s(y)$ must oscillate between positive and negative values within the interval $y_e-y_i$. A solution of Eqs. (2.6) is obtained by dividing interval $y_e-y_i$ in a number $n_0$ of intervals, each having a uniform dipole moment density $p_{sh}$. Eqs. (2.6) reduce to $$\frac{(-1)^{n+1}}{n\pi\mu_0} r_0^{2n} \sum_{h=1}^{n_0} (y_h^{-2n} - y_{h-1}^{-2n}) p_{sh} = g_n, \qquad (2.8)$$

$$n = 1, 2, \ldots n_0$$

where the intervals are numbered starting from the outside boundary $y=y_e$. The optimization of the division of $y_e-y_i$ yields the dimensions $$y_h = y_{h-1} \exp\left( \frac{1}{2h} \right), (h = 1, 2, 3, \ldots) \qquad (2.9)$$

Thus the total interval $y_e-y_i$ satisfies the equation $$\frac{y_e}{y_i} = \exp\left( \frac{1}{2} \sum_{h=1}^{n_0} \frac{1}{h} \right) \qquad (2.10)$$

Figure 8:
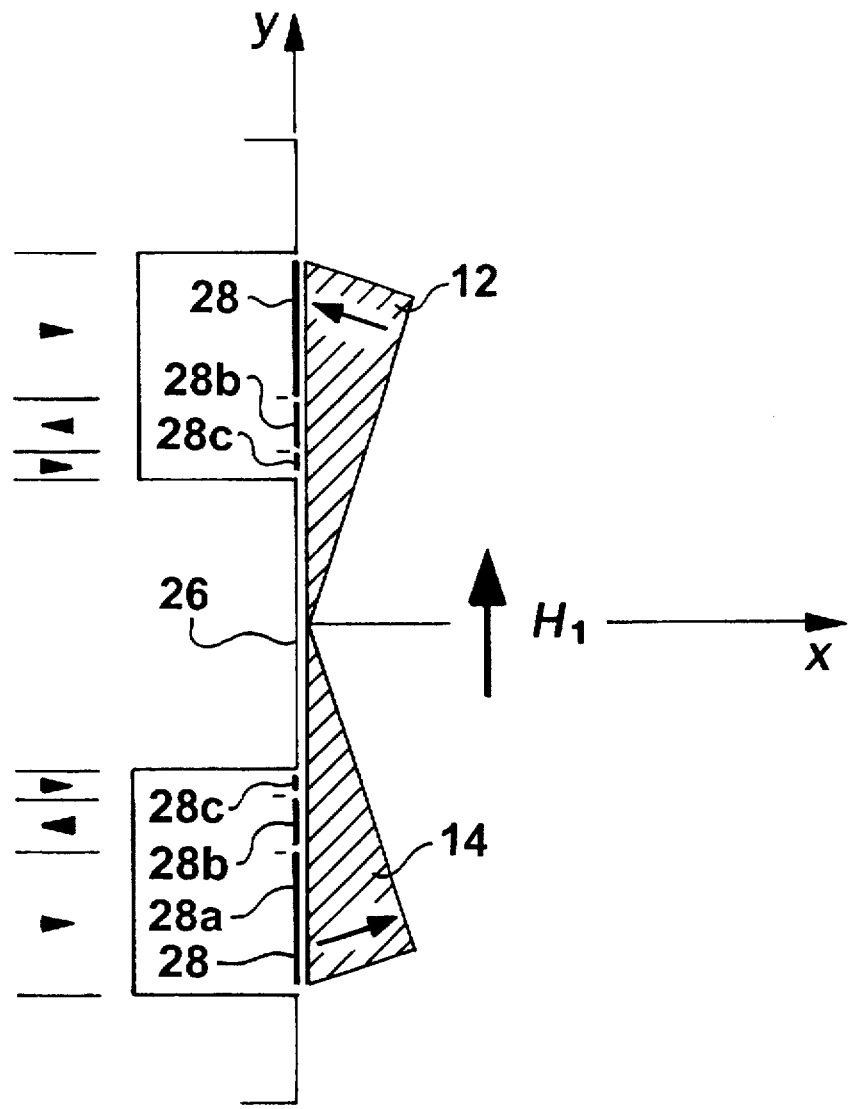
FIG. 8 is a schematic diagram of the structure of FIG. 7 shown with a filter structure.

For $n_0 \to \infty$ the radial integral $y_e-y_i$ would diverge. As a consequence a finite dimension $y_e-y_i$ can be used only for the compensation of a finite number of harmonics. The structure defined by Eqs. (2.8) and (2.9) is an active filter 28 that can be implemented by inserting magnetized material between the $\mu=\infty$ plane 26 located on the plane x=0 and a number $2n_0$ of magnetically insulated $\mu=\infty$ strips 28a, 28b, 28c of dimensions given by Eqs. 2.9 as indicated in FIG. 8. The insulated strips acquire the potentials $$\Phi_{sh} = \frac{p_{sh}}{\mu_0}. \qquad (2.11)$$

In a traditional magnet design an active filter consisting of the surface distribution of dipole movements $p_s$ can be transformed into a passive filter by transforming any equipotential surface that encloses all the dipoles into the surface of a $\mu=\infty$ body. This is the principle of the design of the pole pieces of a traditional magnet, where the active filters are located on the interface between the magnetic material and the magnet cavity. In contrast, the filter structure 28 depicted by Eqs. (2.5) is located on the yoke 26 of the wedge magnet.

The outermost strip of the filter (h=1) is the major component of the filter structure 28 that compensates for the rate of decrease of the magnitude of $\vec{H}_i$ as the distance r from point O increases. If $\vec{H}_i$ is oriented in the positive direction of the axis y, as indicated in the schematic of FIG. 8, the region y>0 is a region of negative values of $\Phi$ and, for h=1 the potential $\Phi_{s1}$, of the outermost strip must satisfy the condition $$\Phi_{s1} < 0. \qquad (2.12)$$

Thus one expects a positive sign of $\Phi_{s2}$, and the sign of $\Phi_{sh}$ alternates from negative to positive from odd numbered to even numbered strips. A zero equipotential surface of the field generated by the wedges 12, 14 and the filter components 28 is found that encloses the yoke 26 and the even numbered strips. The odd numbered strips are outside the $\Phi=0$ surface. Thus the even numbered strips are the only components of the filter 28 that can be replaced by a modified profile of the yoke 26. The odd numbered strips and in particular the h=1 outermost strip must be implemented either as active components or as a combination of active magnetic material and passive ferromagnetic materials. This property characterizes the difference between the filter structure 28 applied to the yoke 26 and the filter structure applied to the pole pieces of traditional magnets, where the fundamental harmonic of the field distortion is canceled by a filter component that can always be replaced by a modified geometry of the pole pieces.

The geometry shown in FIG. 8 corresponds to a value K=0.3 which yields the wedge angle $$\alpha_2 - \alpha_1 = \pi/2 - \alpha_1 = 17.46° \qquad (2.13)$$

Figure 10A:
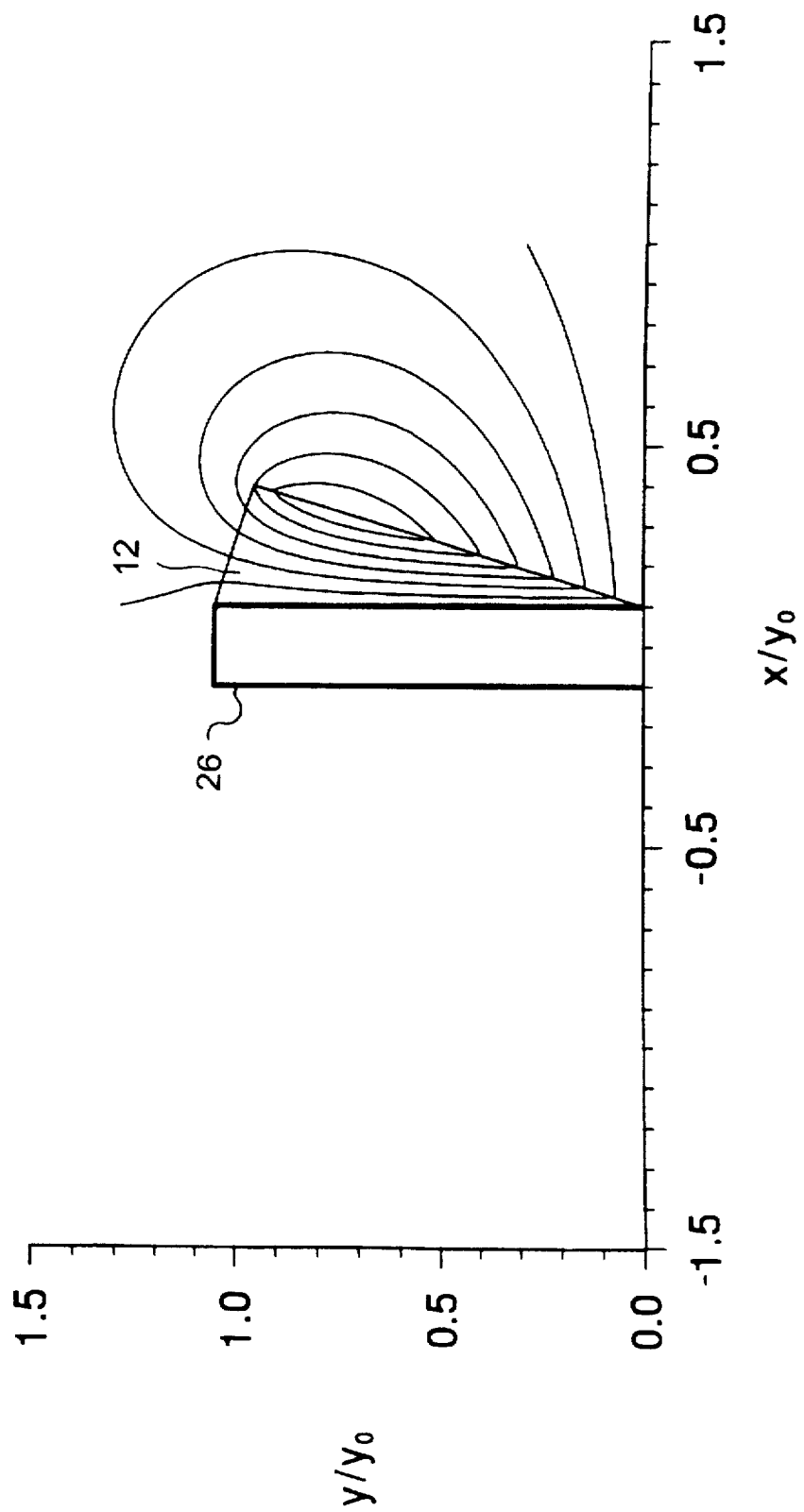
FIG. 10A is a schematic diagram showing the equipotential lines of a wedge magnet of the structure of FIG. 7.
Figure 10B:
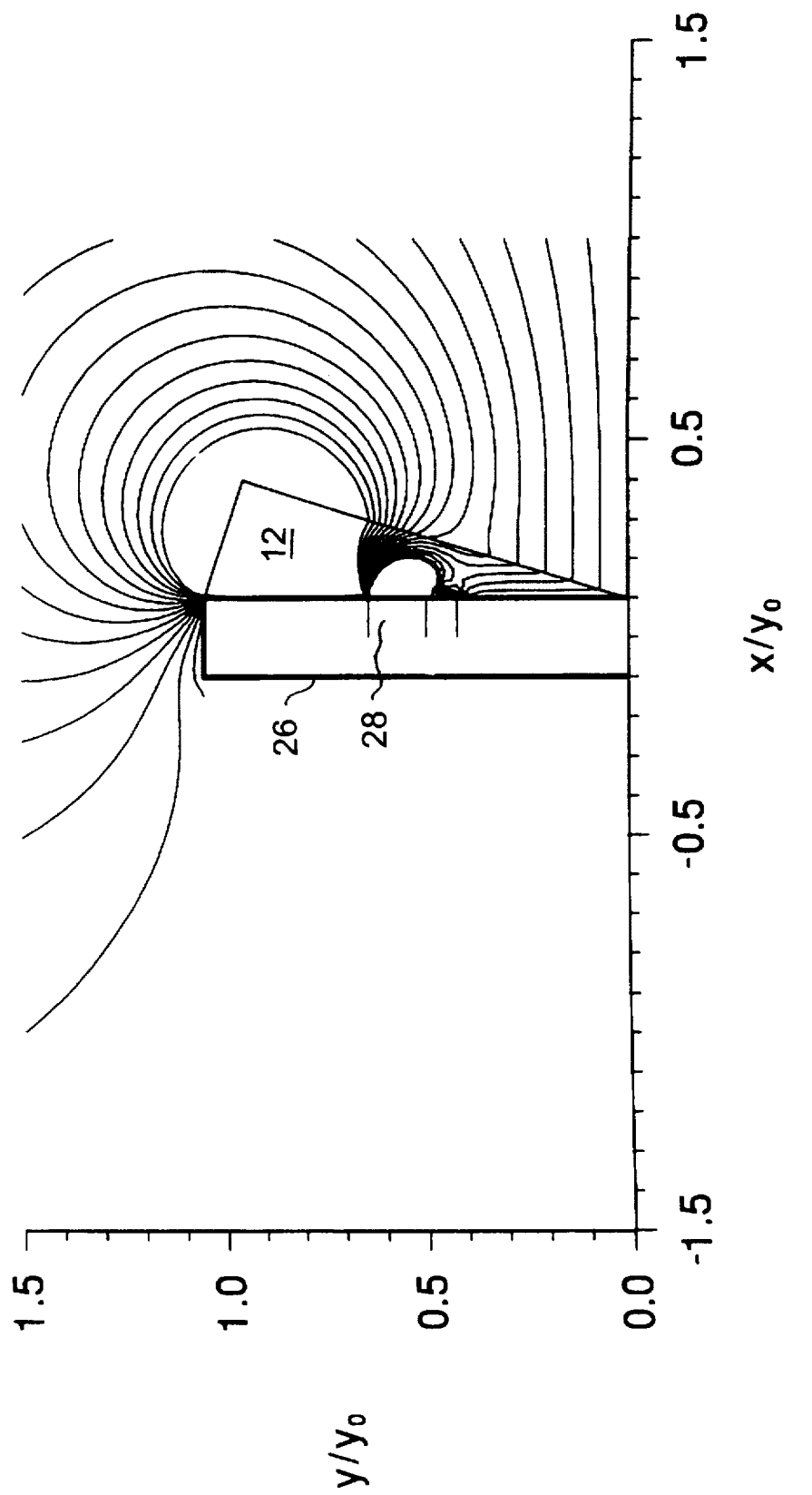
FIG. 10B is a schematic diagram showing the equipotential lines of a wedge magnet of the structure of FIG. 8.

As shown in the figure, assume an $n_0=3$ filter designed to cancel the first three harmonics, and consider the region contained within a cylinder of radius $r_0=0.3y_0$. The coefficients $g_n$ of expansion (2.2) of the field generated by the wedges 12, 14 with a dimension of the yoke 26 large compared to $y_0$, are shown in the table in FIG. 9, and the equipotential lines in the y>0 region (with K=0.3) are shown in FIGS. 10A and 10B with (FIG. 10B) and without (FIG. 10A) the filter structure 28. The dimensions of the strips are chosen according to Eq. (2.9).

The coefficients of the expansion of the total field generated by the wedges and the filter are shown in the table in FIG. 9, wherein the values provided under part or column 1 represent coefficients without the filter and those under part or column 2 represent coefficients with a $n_0=3$ filter structure. One observes that the elimination of the first three harmonics is achieved at the cost of an increase by orders of magnitude of the amplitude of the higher order harmonics. Also listed in the table in FIG. 9 are the values of $g_n(y_i/r_0)^{2n}$ computed on a reference cylinder of radius $y_i=0.35\ r_0$.

The effect of the increase of the amplitude of the higher order harmonics on the field within the region of interest is compensated by the factors $(r/r_0)^{2n}$ that decreases rapidly with n if the dimension of the imaging region is selected to be sufficiently smaller than $y_i$. With the $n_0=3$ filter structure 28 depicted in FIG. 8 a field uniformity $$\left| \frac{\delta H_i}{H_{i0}} \right| \leq 10^{-4} \tag{2.14}$$

is achieved within a radial distance $r_1 \approx 0.2\ y_0$. The cylindrical surface of radius $r_1$ is indicated in the schematic of FIG. 7. Thus with the compensation of the first three harmonics the dimension of the wedge structure necessary to achieve a uniform field within a given dimension $r_1$ is reduced by orders of magnitude compared to the dimension of the uncorrected structure given by Eq. (2.1).

Figure 11:
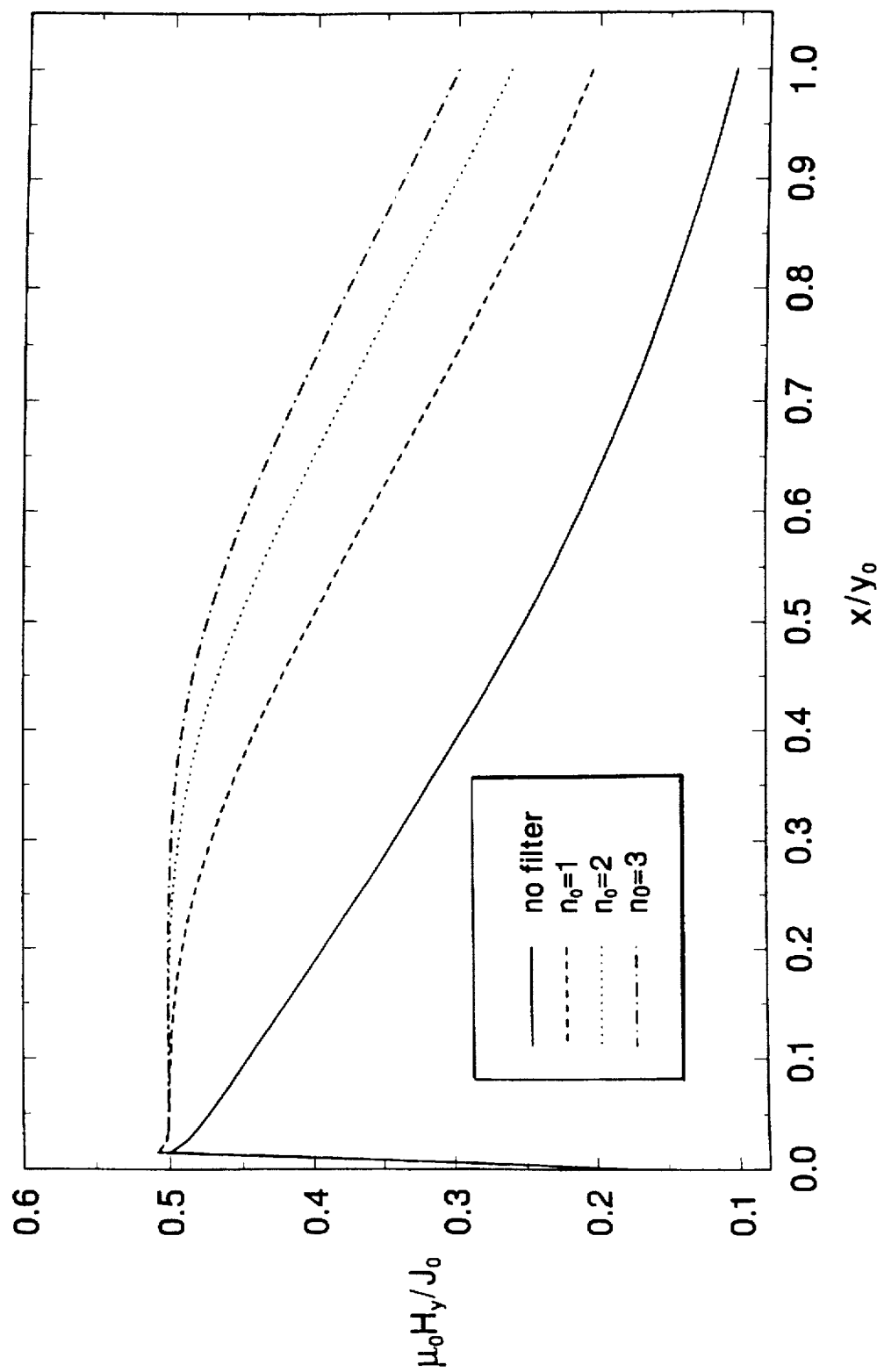
FIG. 11 is a graph showing the effect of an increasing number of filter elements on the intensity of the magnetic field.

The effect of an increasing number $n_0$ of filter components on the intensity close to the origin O is shown in FIG. 11 where the intensity is plotted versus x for $n_0=1, 2, 3$ and compared to the intensity generated without filters.

Figure 12:
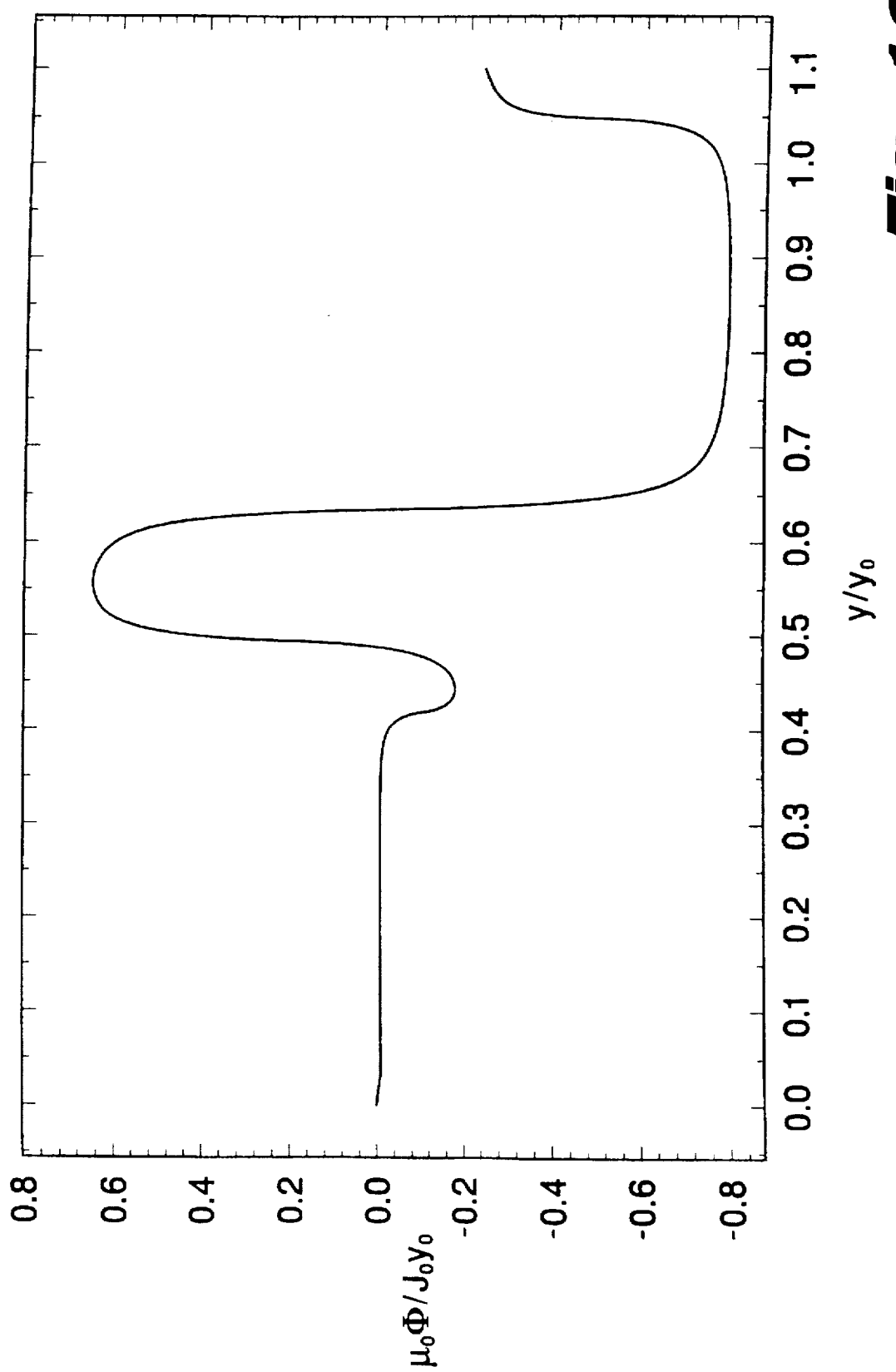
FIG. 12 is a graph showing the potential of components of a filter with three active filter elements ($n_0=3$)
Figure 13:
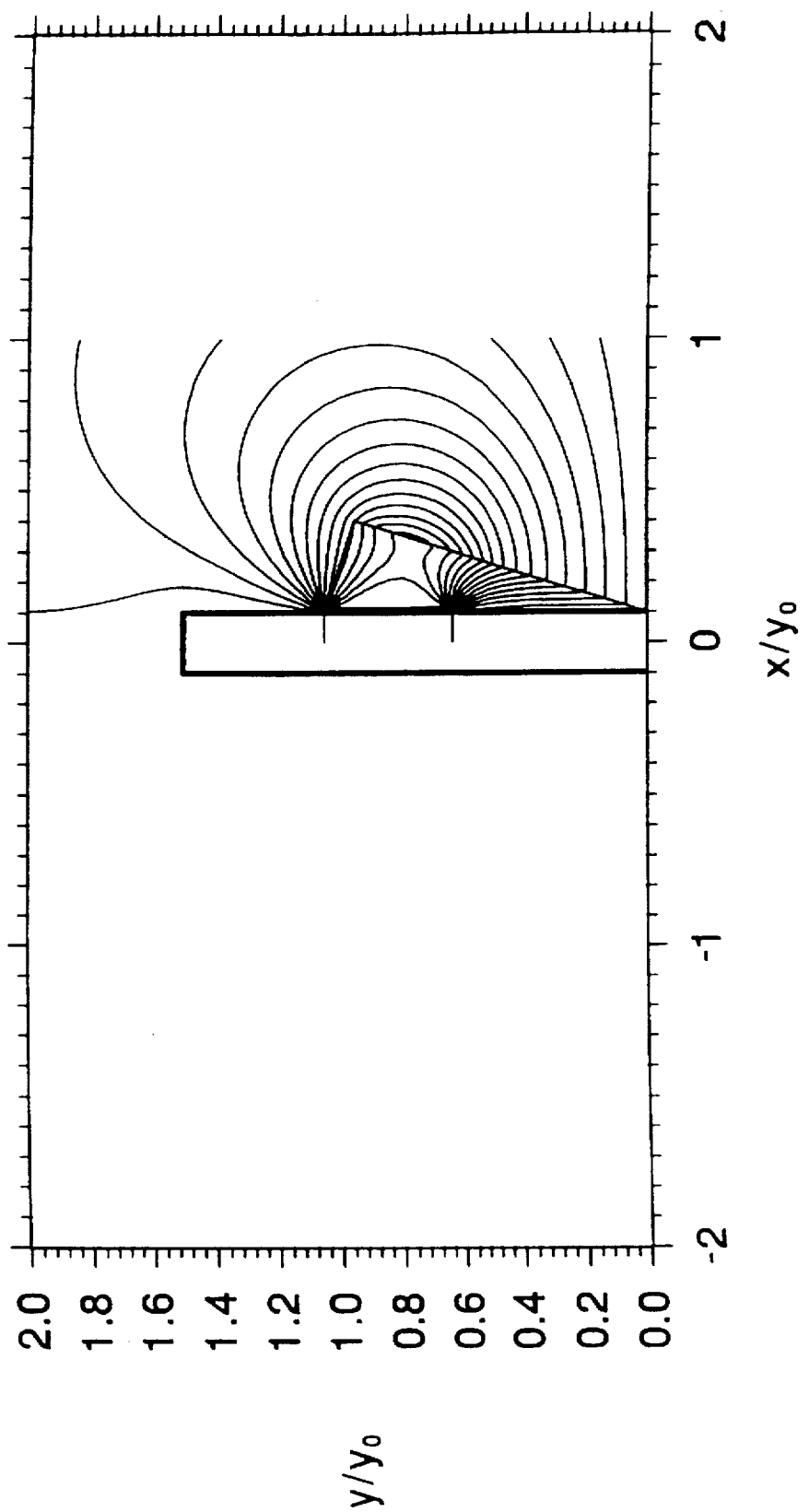
FIG. 13 is a schematic diagram showing the equipotential lines of a wedge magnet of one embodiment of the present invention having a single active filter element ($n_0=1$)
Figure 14:
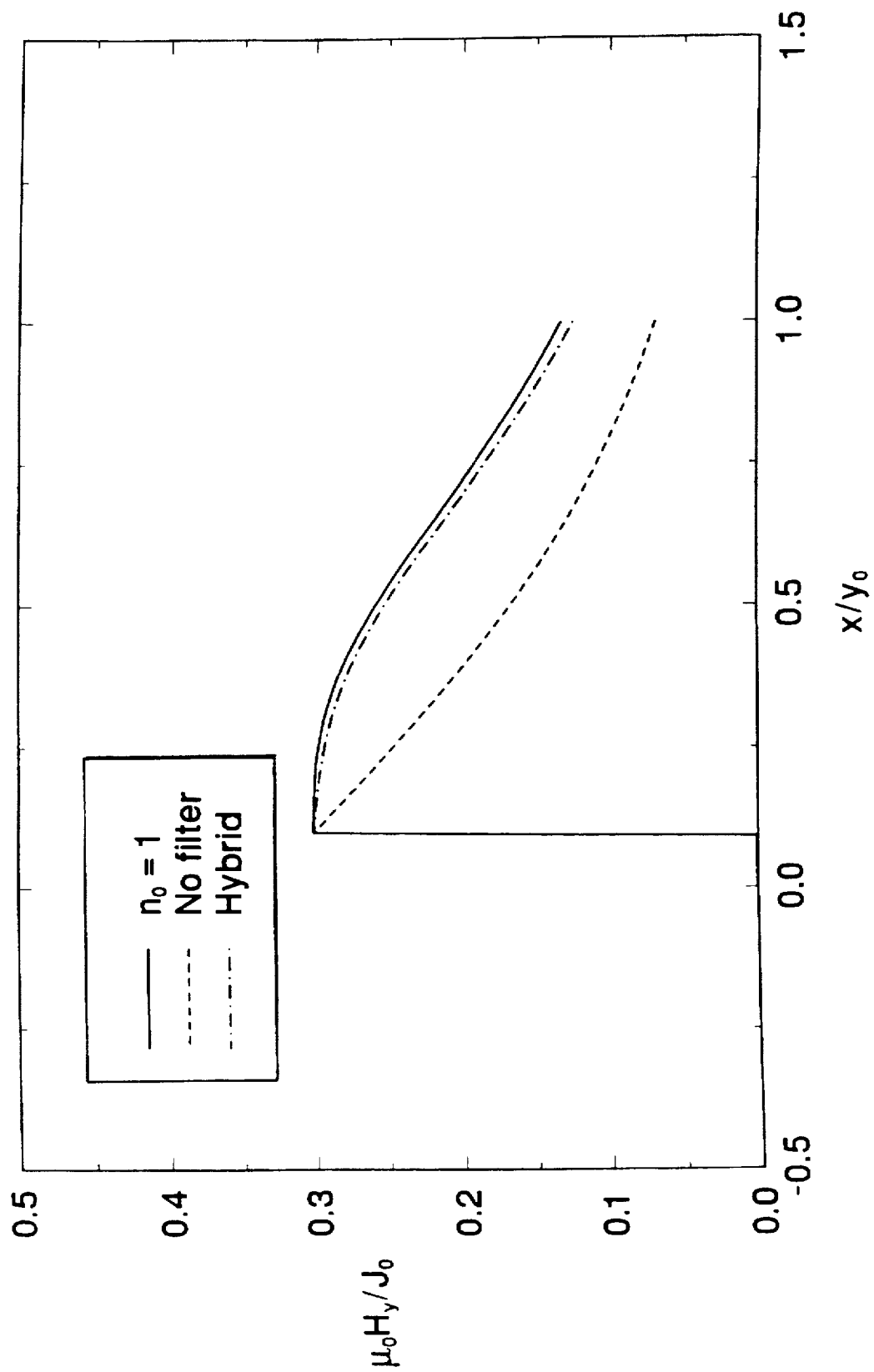
FIG. 14 is a graph showing field intensity versus distance on the x axis for three different structures of the present invention.
Figure 15:
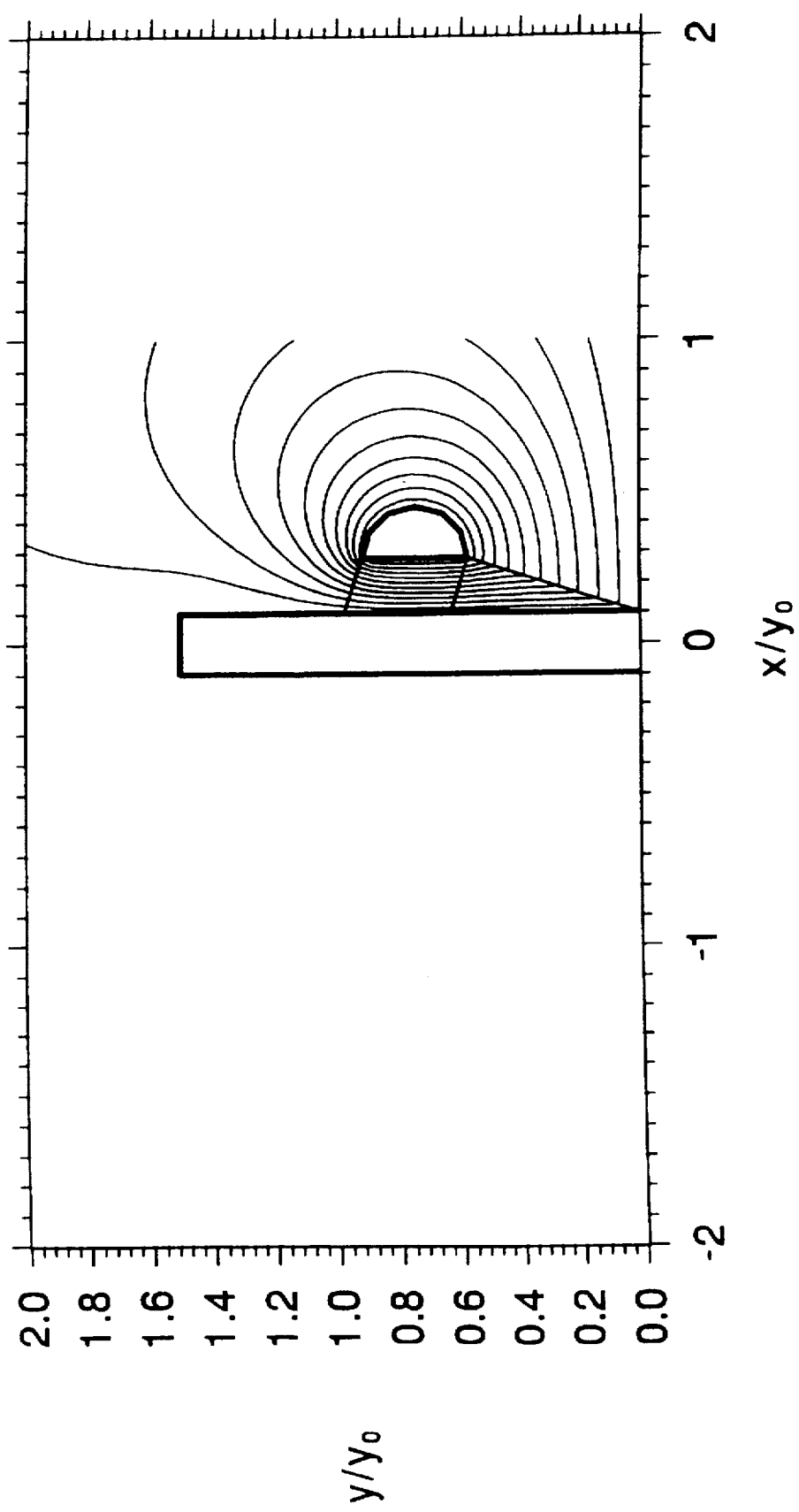
FIG. 15 is a schematic diagram showing equipotential lines for a hybrid wedge magnet in accordance with one embodiment of the present invention.

The potential of the three filter components is shown in FIG. 12. To reduce the magnitude of the sandwich required to generate $\Phi_{s1}$, the active outermost strip of the filter can be replaced by an hybrid structure with a $\mu=\infty$ component whose geometry is determined by an equipotential line of the combined fields of the wedge 12 and the filter 28. To illustrate the procedure, consider the case where the active filter reduces to a single element designed to cancel the gradient of the field at x=0. The equipotential lines are shown in FIG. 13, and the field intensity at y=0 is plotted versus x in FIG. 14. Shown in FIG. 15 is the transformation of the active filter element built into the yoke 26 into a sandwich of magnetic material between the yoke 26 and a $\mu=\infty$ component whose external profile approximates an equipotential line of the field of FIG. 14 outside the wedge 12. The interface between the $\mu=\infty$ component of the hybrid filter and the magnetic material is a plane surface parallel to the x=0 plane, and the remanence of the magnetic material of the hybrid structure of FIG. 15 is parallel to $\vec{J}$ and its magnitude is $$J_2|3.2J_0 \tag{2.15}$$

Eq. (2.15) corresponds to what could be the remanence of a rare-earth hybrid filter element of a ferrite wedge magnet. FIG. 14 shows the intensity on the axis x that results from the transformation of the active filter into the hybrid structure of FIG. 15.

2.2 Longitudinal Field—Uniform field parallel to the x axis

Consider now the wedge structure that satisfies condition (1.7) and assume the two-dimensional geometry $$\alpha_1 = \frac{\pi}{2} - \arcsin K,\ \alpha_2 = \frac{\pi}{2}, \tag{2.16}$$

where the remanences of the two wedges are parallel to sides $s_1$ and $s_4$ (18 and 20). Assume a finite dimension $r_{o2}$ of sides $s_2, s_3$ (22 and 24). By virtue of Eq. 1.32 one has $r_0=r_{o4}=\infty$. In the absence of any ferromagnetic material, the intensity $H_x$ on the axis x within a distance $|x|>>r_{o2}$ is $$H_{i,e,x} = \pm \frac{KJ_0}{2\mu_0} - \frac{KJ_0}{\pi\mu_0}\ \frac{x}{r_{o2}},\ (x>0, x<0), \tag{2.17}$$

As with the transverse field described above, in the ideal case $r_{o2}=\infty$, either $H_{ix}$ or $H_{ex}$ are eliminated by assuming that either $\alpha_1, \alpha_4$ or $\alpha_2, \alpha_3$ are the interfaces between the wedges and a $\mu=\infty$ material and the intensity on either side of the magnet becomes $$H_{i,e,x} = \pm \frac{KJ_0}{\mu_0} \tag{2.18}$$

Figure 16:
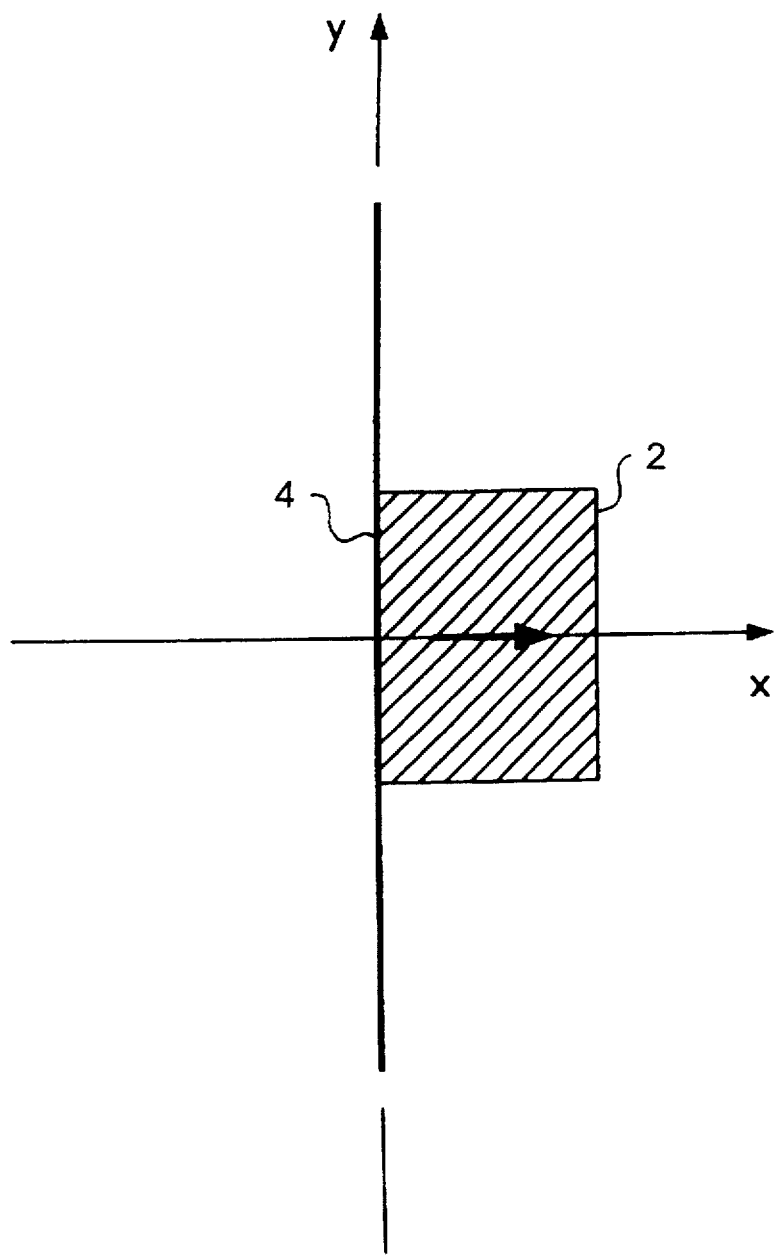
FIG. 16 is a schematic diagram of a rectangular magnetic block.
Figure 17:
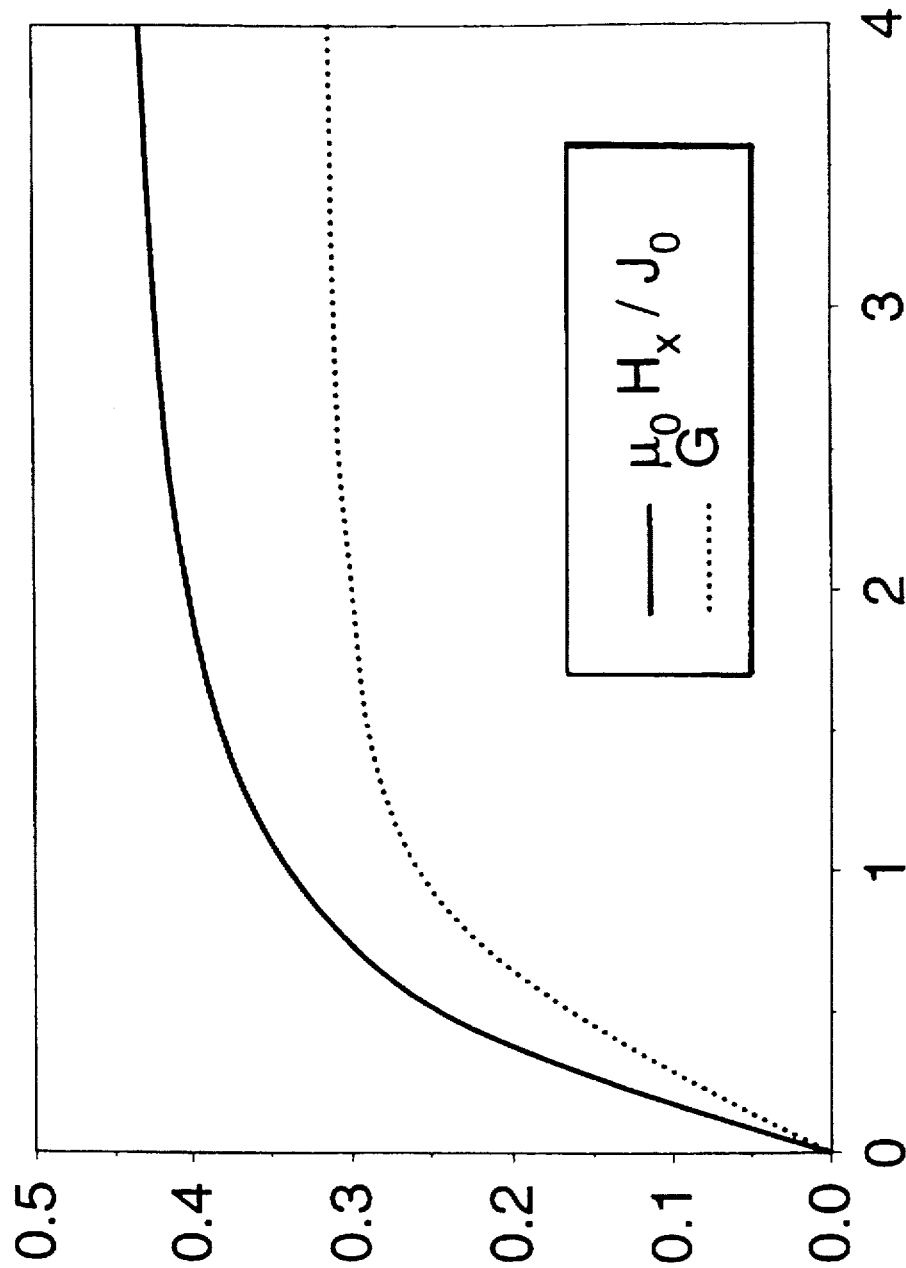
FIG. 17 is a graph of the field intensity and gradient along the x axis of the rectangular block of FIG. 16.

Compare a wedge structure 2 that satisfies condition (1.7) with the schematic of FIG. 16, also intended to generate a field oriented in the direction of the axis x. The rectangular block 2 of magnetic material is magnetized in the direction of the axis x and the plane x=0 is assumed to be the surface 4 of a $\mu=\infty$ material. The dimension of the block 2 on the y direction is $2y_0$ and the field is computed outside the block on the x axis, infinitely close to the surface of the block 2, as a function of its length $x_0$. As shown in FIG. 17, the field intensity outside the block vanishes for $x_0=0$ and its asymptotic value for $x_0 \to \infty$ is $$\lim_{x_0 \to \infty} (H_x)_{x=x_0} = \frac{J_0}{2\mu_0} \tag{2.19}$$

Also plotted in FIG. 17 is function $$G\left(\frac{x_0}{y_0}\right) = -\frac{\mu_0}{J_0}\left[\frac{dH_x}{d(x/y_0)}\right]_{x=x_0}, \tag{2.20}$$

by virtue of (1.31) the asymptotic value of G is $$\lim_{x_0 \to \infty} G\left(\frac{x_0}{y_0}\right) = +\frac{1}{\pi}, \tag{2.21}$$

Figure 18:
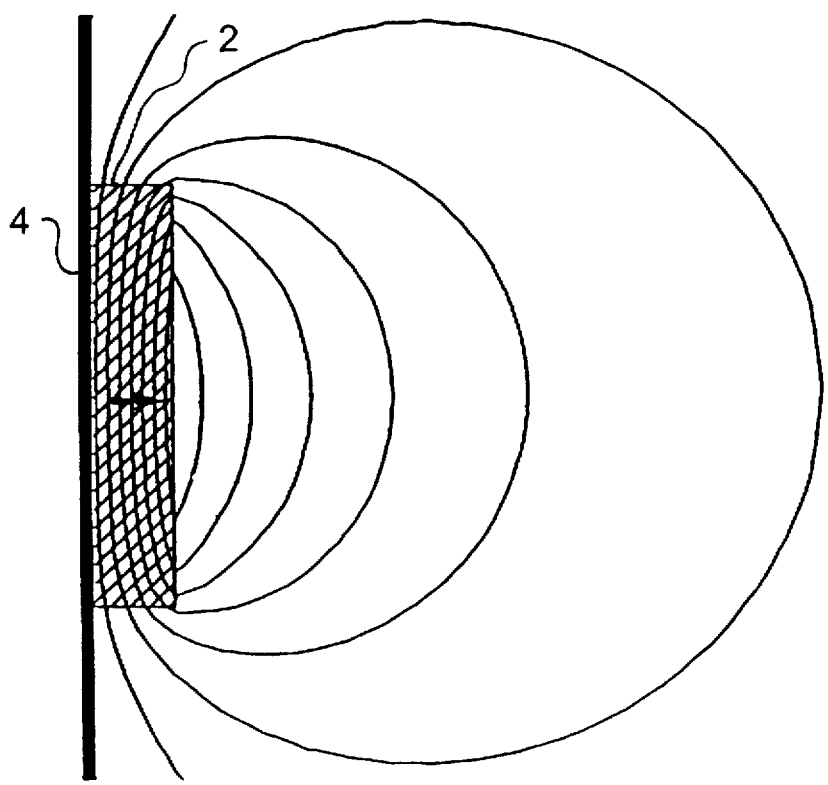
FIG. 18 is a schematic diagram showing the equipotential lines generated by a rectangular magnetic block.

The equipotential lines of the field generated by the block 2 of magnetized material are shown in FIG. 18.

Eq. 2.18 shows that for large values of K, the wedges generate an intensity larger than the maximum value (2.19) achieved with a single block. Assume the schematic of FIG. 19 where the sides $\alpha=\alpha_1$, $\alpha=\alpha_4$ are the interfaces with the $\mu=\infty$ material. In the limit $r_{o2}=r_{o3}=\infty$ and K=1 the geometry of FIG. 19 transforms into the schematic of FIG. 20, where the magnetic material is magnetized in the direction of the axis x, and the $\mu=\infty$ material 26 is confined to the axis x in the region $x>0$. With infinite dimensions of the magnetic material 26, the intensity is identically zero in the region $x>0$ and the flux of $\vec{B}=\vec{J}=\mu_0\ \vec{H}_e$ is parallel to the x axis everywhere.

Figure 19:
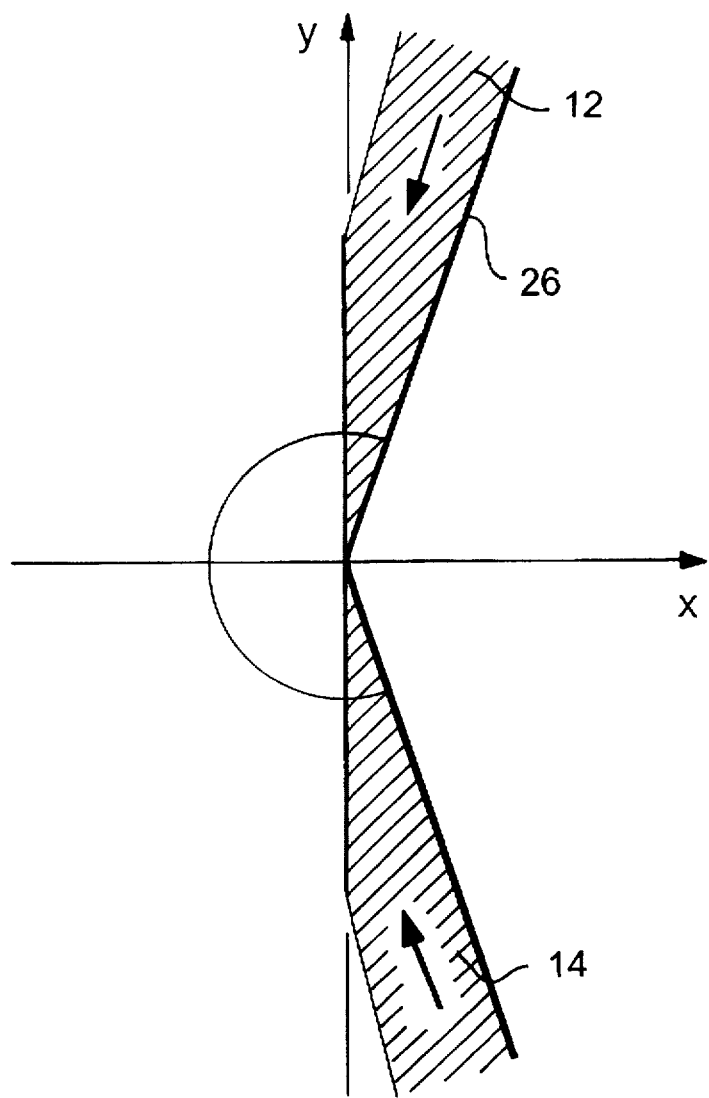
FIG. 19 is a schematic diagram of wedge magnets of one embodiment of the present invention with a high permeability yoke extending along the interior sides of the wedges.
Figure 20:
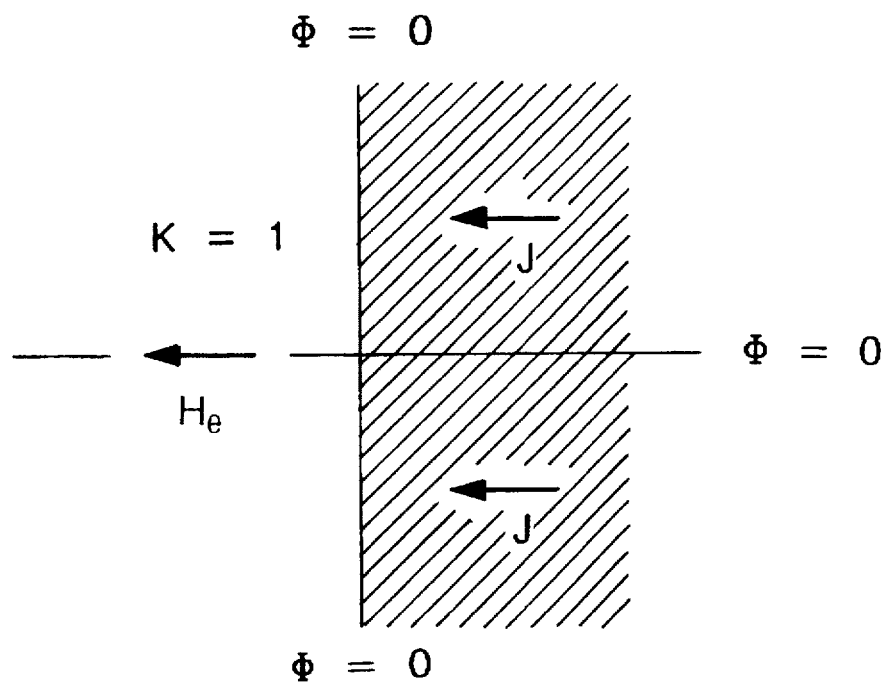
FIG. 20 is a schematic diagram of the wedge magnets of FIG. 19 with K=1.

A finite dimension of sides $s_2, s_3$ (22, 24) in the schematic of FIG. 19 yields a non zero field within the magnetic material. Thus, because of the truncation of the wedges, the presence of the $\mu=\infty$ material generates a singularity of the intensity at x=y=0 that cannot be compensated by a filter structure located outside a given distance from 0.

Figure 21:
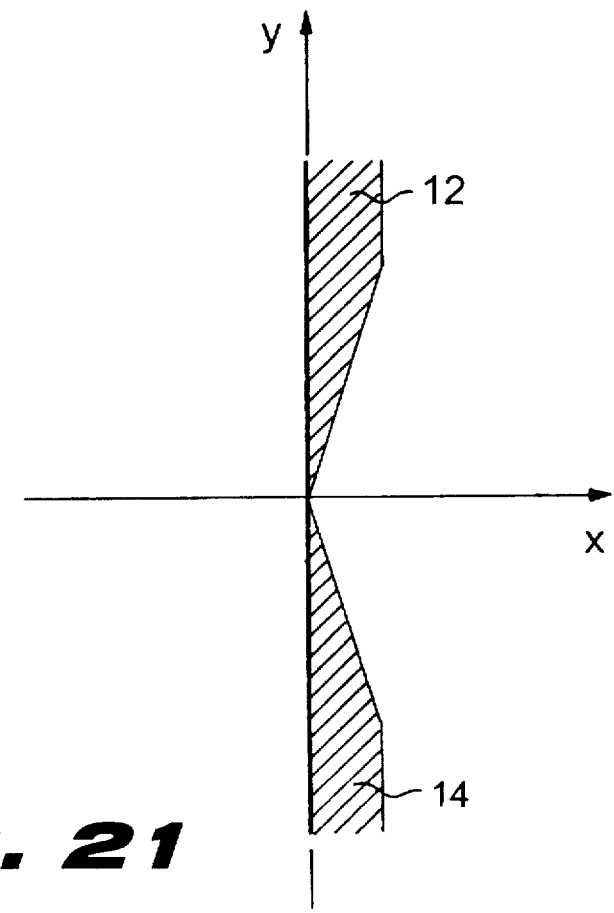
FIG. 21 is a schematic diagram of wedge magnet structures of embodiments of the present invention with a high permeability yoke extending along the exterior sides of the wedges along the line x=0.
Figure 23:
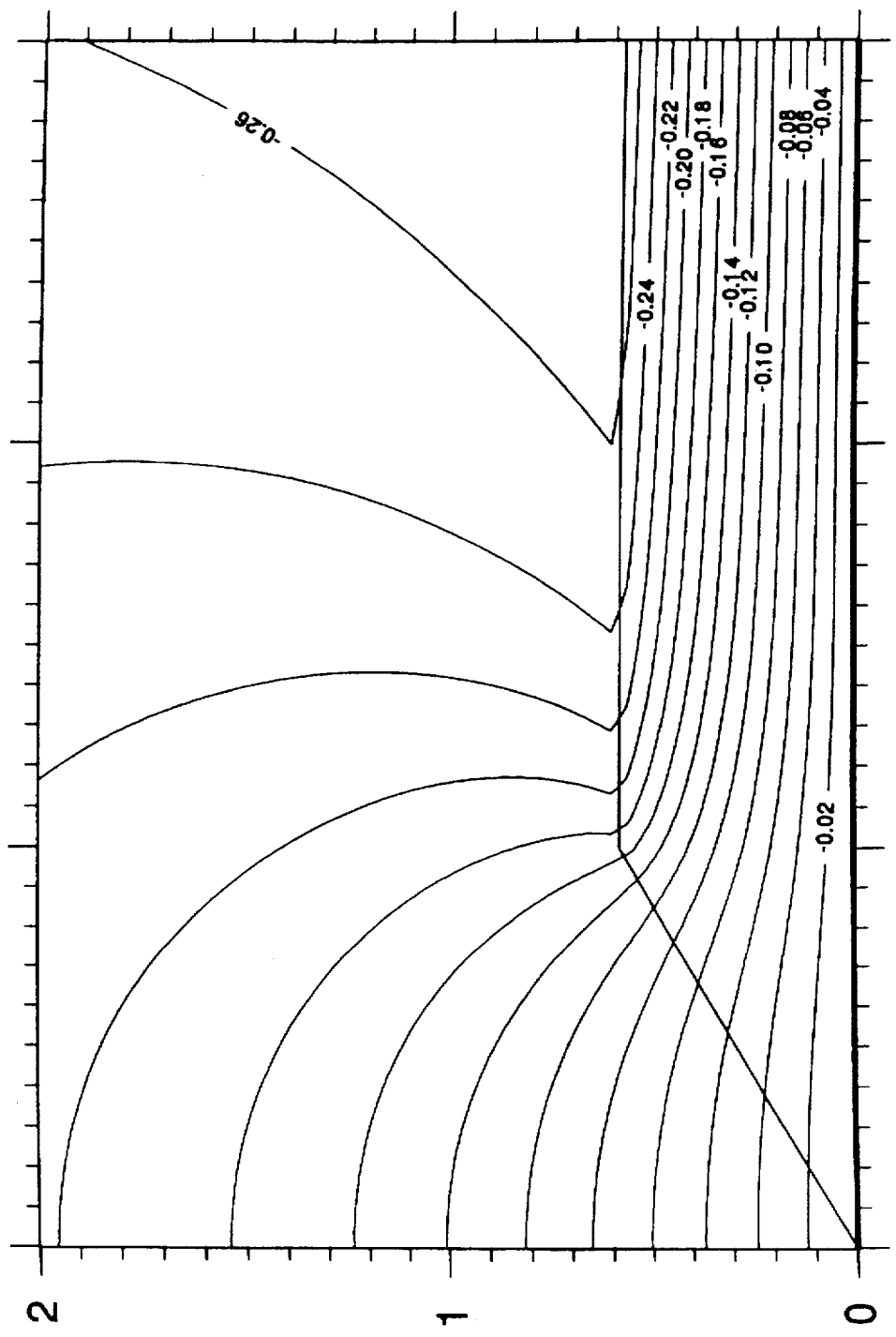
FIGS. 23 and 24 are schematic diagrams showing equipotential lines of a portion of the wedge magnet of FIG. 21 without and with a filter structure.

Consider the schematic of FIG. 21 where the plane x=0 is the surface of the $\mu=\infty$ material. As shown in the figure, the wedges are truncated on the plane $x=x_0$, and as a consequence, the field is generated by the uniform surface charge induced by $\vec{J}$ on the surface of the truncation. The equipotential lines in the structure of FIG. 21 are shown in FIG. 23. The effect of the charges induced by $\vec{J}$ on the surface $x=x_0$ in reducing the intensity of the field on the axis x is quite apparent in FIG. 23. The field is not uniform and the same approach for the elimination of the spatial harmonics described above can be followed in the schematic of FIG. 21 by developing a filter structure on the plane $x=0$.

Consider a cylindrical surface of radius $r_0$ coaxial with the axis z, and assume that $r_0$ is smaller than $x_0/(\tan\alpha_1)$. The potential of the field distortion generated by the truncation of the wedges satisfies the condition $$\Phi(y)=\Phi(-y), \tag{2.22}$$

and $$\Phi=0 \text{ at } x=0. \tag{2.23}$$

Because of conditions (2.22), (2.23) the potential generated in the region $|\alpha|<\alpha_1$ can be expanded in the series $$\Phi_{r,\alpha} = \sum_{n=0}^{\infty} g_n \left(\frac{r}{r_0}\right)^{2n+1} \cos(2n+1)\alpha. \tag{2.24}$$

Assume that the filter structure extends on the plane $x=0$ over a finite interval be $|y|>r_0$. Then, as with the transverse field described above, the computation of the filter structure is limited to the cancellation of the dominant, lower order harmonics. Within the surface $r=r_0$ the value of the potential generated by the distribution of dipole moment $\vec{p}_s$ on the $x=0$ plane is $$\Phi_s = \frac{2}{\pi\mu_0} \sum_{n=0}^{\infty} (-1)^n \int_{r_0}^{r_{0e}} \frac{p_s(y)}{y^{2(n+1)}} dy\, r^{2n+1}\cos(2n+1)\alpha, \tag{2.25}$$

where $p_s(y)$ is the solution of the system of equation $$\frac{2}{\pi\mu_0} (-1)^{n+1} r_0^{2n+1} \int_{r_0}^{r_{0e}} \frac{p_s(y)}{y^{2(n+1)}} dy = g_n. \tag{2.26}$$

Again, Eq. (2.26) can be solved by replacing the continuous distribution of $p_s(g)$ with a stepwise distribution on a number of intervals, each carrying a uniform dipole moment density. Eq. (2.26) transforms to $$\frac{2(-1)^{n+1}}{(2n+1)\pi\mu_0} r_0^{2n+1} \sum_{h=1}^{n_0} (y_h^{-2n-1} - y_{h-1}^{-2n-1}) p_{sh} = g_n. \tag{2.27}$$
$$n = 1, 2, \ldots n_0$$

Figure 22:
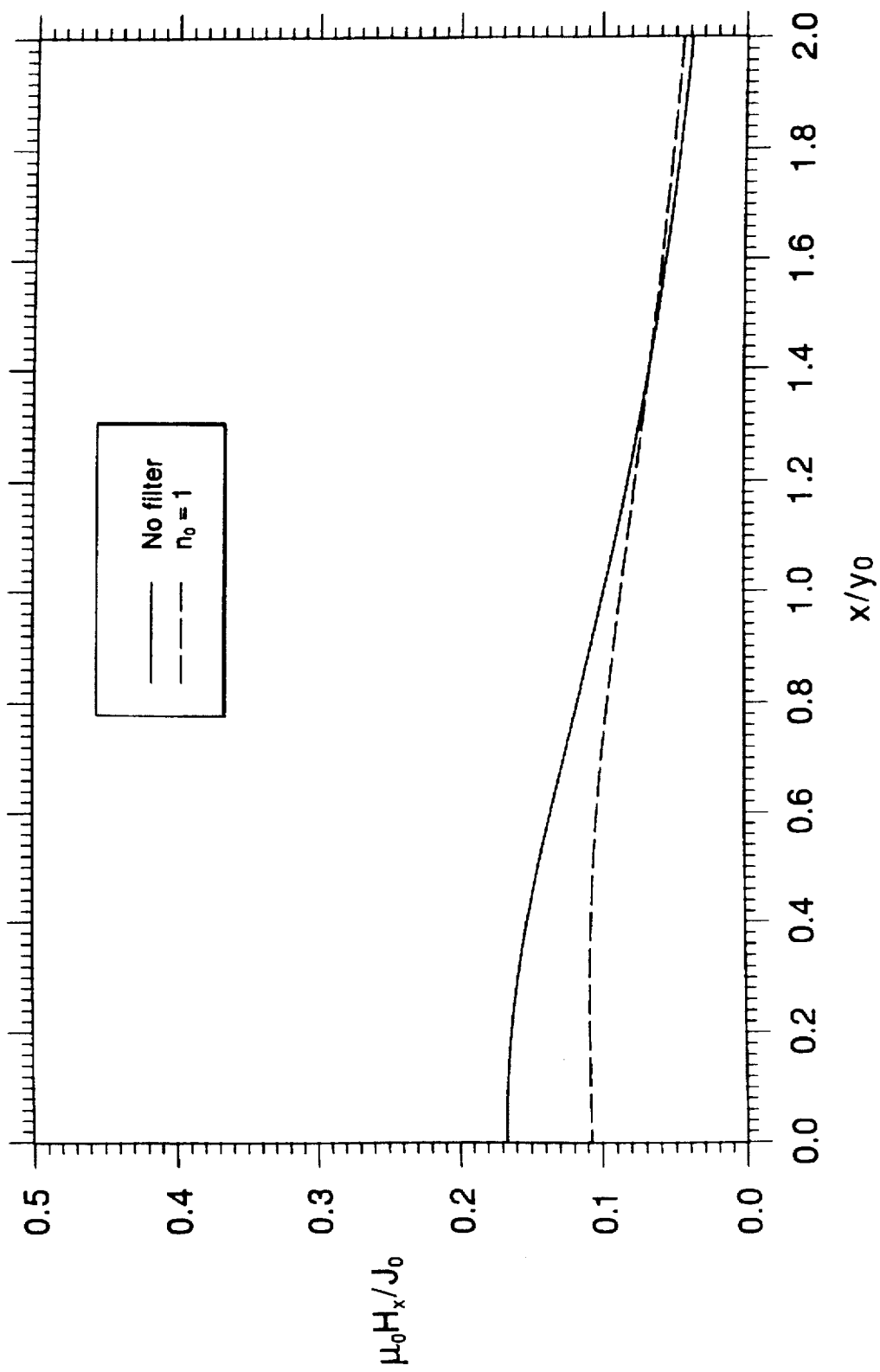
FIG. 22 is a graph of field intensity along the x axis for wedge magnetic structures with and without filter structures.
Figure 24:
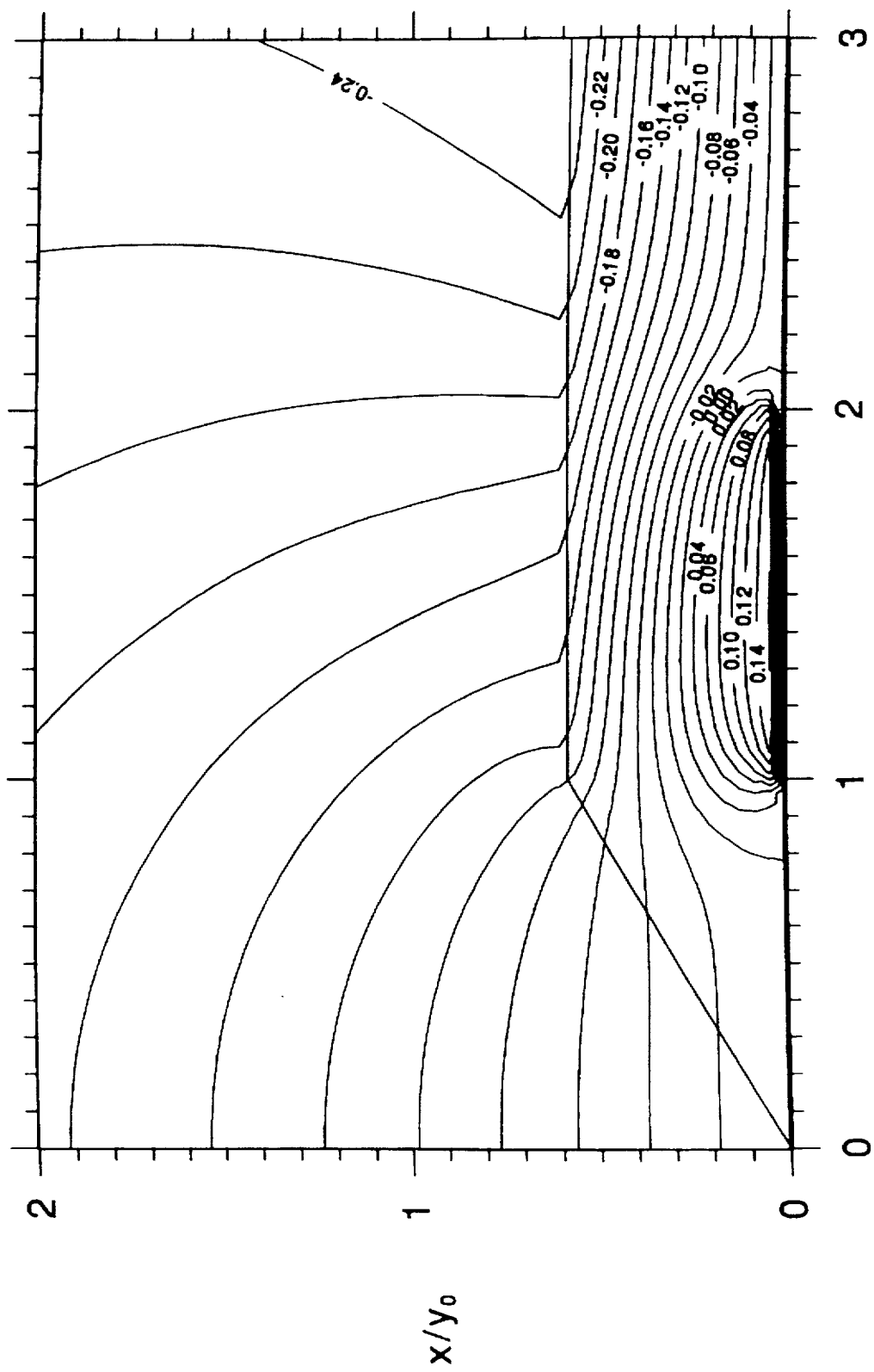

As an example, FIG. 22 shows the distribution of $H_x$ on the x axis with and without a single strip filter designated to cancel the $n=1$ harmonic ($K=0.5$, $x_0/y_0=0.55735$). The equipotential lines without and with the filter are shown in FIGS. 23–24, respectively.

In the schematic of FIG. 21, the field perturbation is a function of K only, and $x_0$ is the geometrical normalization factor of the magnetic structure. The field distortion in FIG. 21 coincides with the field generated by a strip of uniform charge density+K J of dimension $2x_0/\tan\alpha$, at a distance $x_0$ from the $\mu=\infty$ plane.

The filter structures described herein compensate for the field distortion generated by the finite dimensions of the wedges 12, 14. Additional causes of field distortion are the tolerances of magnetization and fabrication that generate additional harmonics, usually smaller than the harmonics due to the magnet geometry. One skilled in the art will recognize that the compensation of the additional harmonics due to the tolerances, or shimming of the magnet, may be accomplished by a correction of the strength of the individual elements of the filter structure. The possibility of performing the adjustment from the outside, through the yoke of the magnet, is another characteristic feature of the wedge structure of the present invention.

3. Defining the Imaging Region 3.1 Properties of the Region of Interest

The imaging area for the magnetic structure is in the region of interest, where the field generated by the wedges attains its maximum value. The region of interest is close to the origin O of the magnetic structure on either concave or convex side of the wedge system. The plotting of the equipotential lines in FIG. 25 indicates that the concave side provides a region with higher field intensity and better field uniformity.

Figure 25:
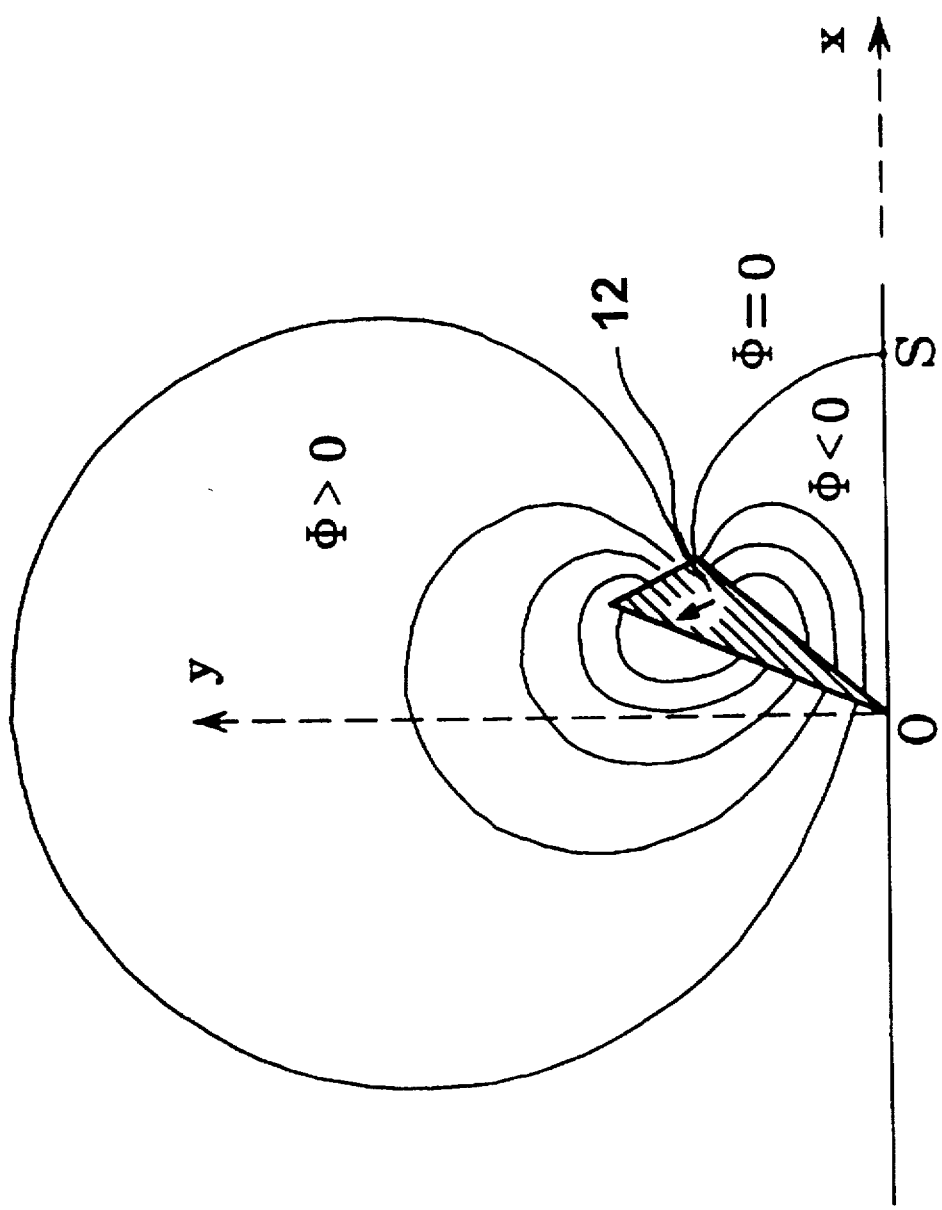
FIG. 25 is a schematic diagram showing equipotential lines of a single wedge magnet.

An essential characteristic of the field configuration of FIG. 25 is the closed $\Phi=0$ equipotential line that passes through the saddle point S located on the x axis. At point S the field intensity is zero, and the $\Phi=0$ line separates the region of interest from the external region where the field generated by the wedges is essentially the field of the linear dipole distribution given by Eq. (1.35). The plotting of $H_y$ versus x at $y=0$ and its first and second derivatives with respect to x are presented in FIG. 26 that corresponds to $$K=0.3,\ \alpha_1=50°. \tag{3.1}$$

By virtue of Eq. (1.13) the angle of the wedge (angular width) is $$\alpha_2-\alpha_1=17.46°. \tag{3.2}$$

Figure 26:
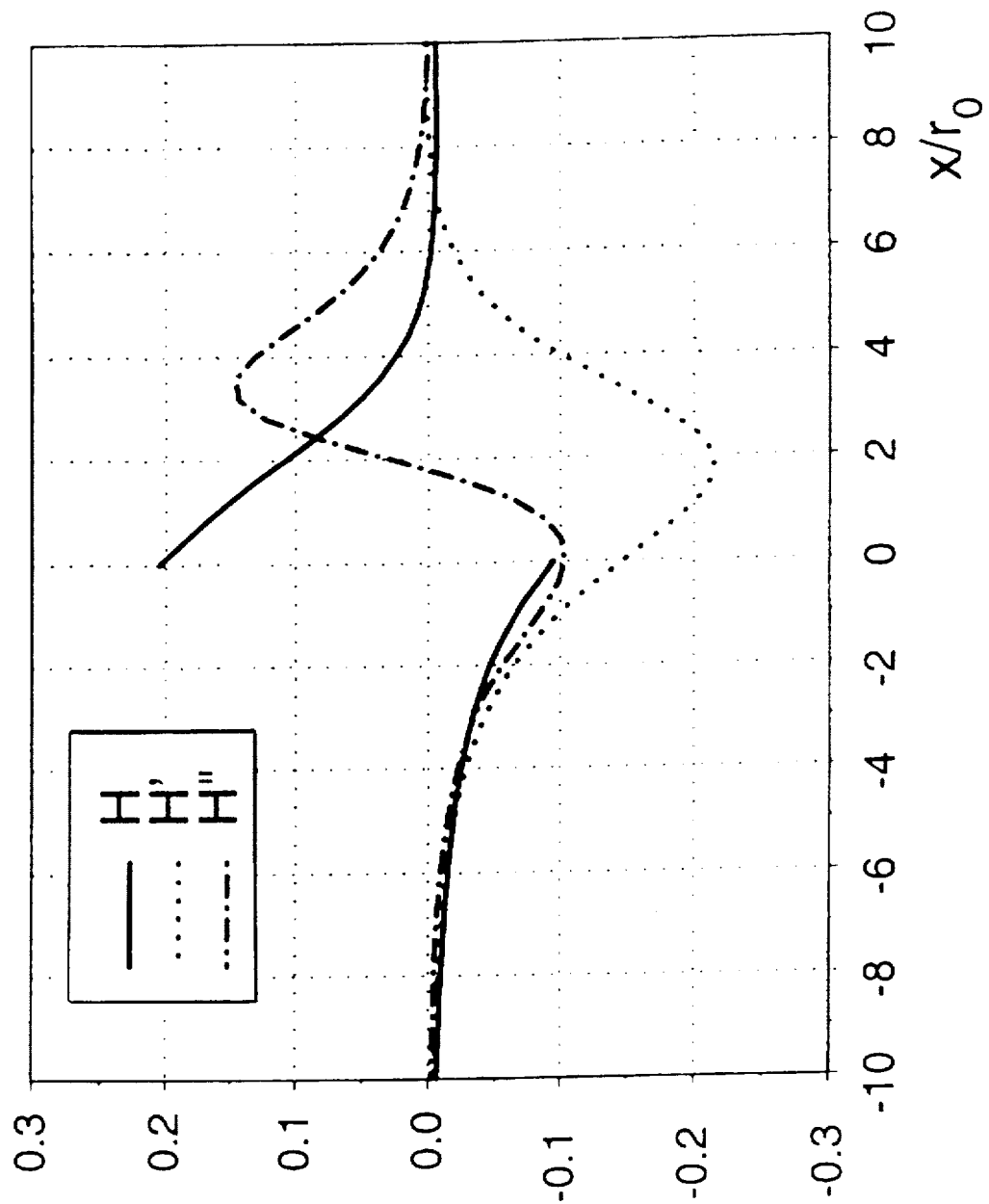
FIG. 26 is a graph of the field intensity component along the x axis and its first and second derivatives generated by a single wedge magnet.

FIG. 26 shows that the field generated by the truncated wedge 12 exhibits a sign reversal at the origin (In FIG. 26, $K=0.3$, $\alpha_1=50°$, and $r_{0h}=4$, with plots restricted to the x axis within the range $\pm 10 r_{0h}$, and the vertical axis normalized to $J_0/\mu_0$). The field discontinuity at $x=0$ approximates well the ideal value of Eq. (1.15) $KJ_0/\mu_0$ of the discontinuity of the infinite wedge. The derivatives of $H_y$ are continuous at $x=0$; thus $H_y$ decreases at the same rate with the distance from 0 on both sides of the wedge system.

The uniformity of the field generated by the wedges 12, 14 can be measured by selecting a point $P_0$ as the imaging center and computing the variation $\Delta|\vec{H}|$ of the magnitude of the field $|\vec{H}|$ in the region surrounding $P_0$. The imaging region is defined as the area where $$\frac{\Delta|\vec{H}|}{|\vec{H}|} \leq C \tag{3.3}$$

where C is an arbitrary constant.

Assume for instance points $P_{0i}$, $P_{0e}$ located on the axis x at distances $\pm 1$ from 0 respectively, and consider the wedge geometry of FIG. 25 with radial dimensions $$r_1=r_4=4.0 \tag{3.4}$$

Figure 27A:
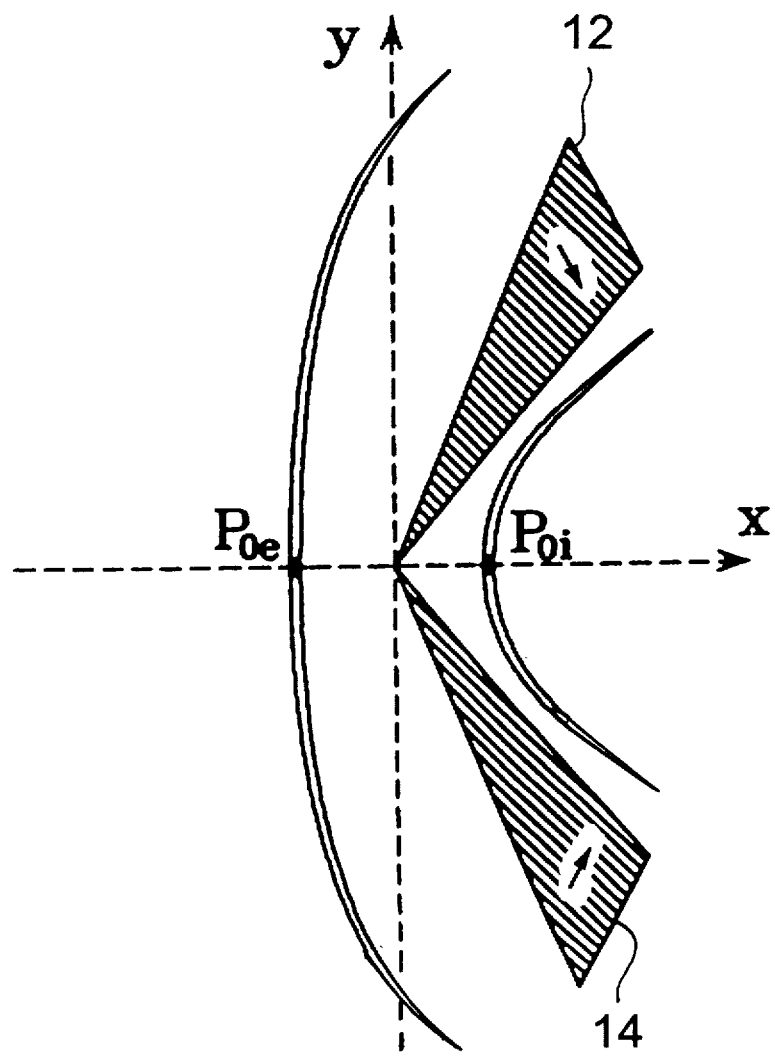
FIG. 27A is a schematic diagram showing the boundaries of two imaging regions near a magnetic structure of one embodiment of the present invention containing a single wedge magnet pair.

FIG. 27A (with radial dimensions of the wedge $r_1=4$) shows the boundaries of the two regions surrounding $P_{0i}$, $P_{0e}$ that correspond to the value of the constant C $$C=0.02 \tag{3.5}$$

As shown in FIG. 27A the imaging regions are narrow strips that approximately follow the contours of the wedge boundaries. Obviously, the geometry of the regions depicted in FIG. 27A is the result of the large gradient of $|\vec{H}|$ generated by the relatively small radial dimensions (3.4) of the wedges 12, 14.

Figure 27B:
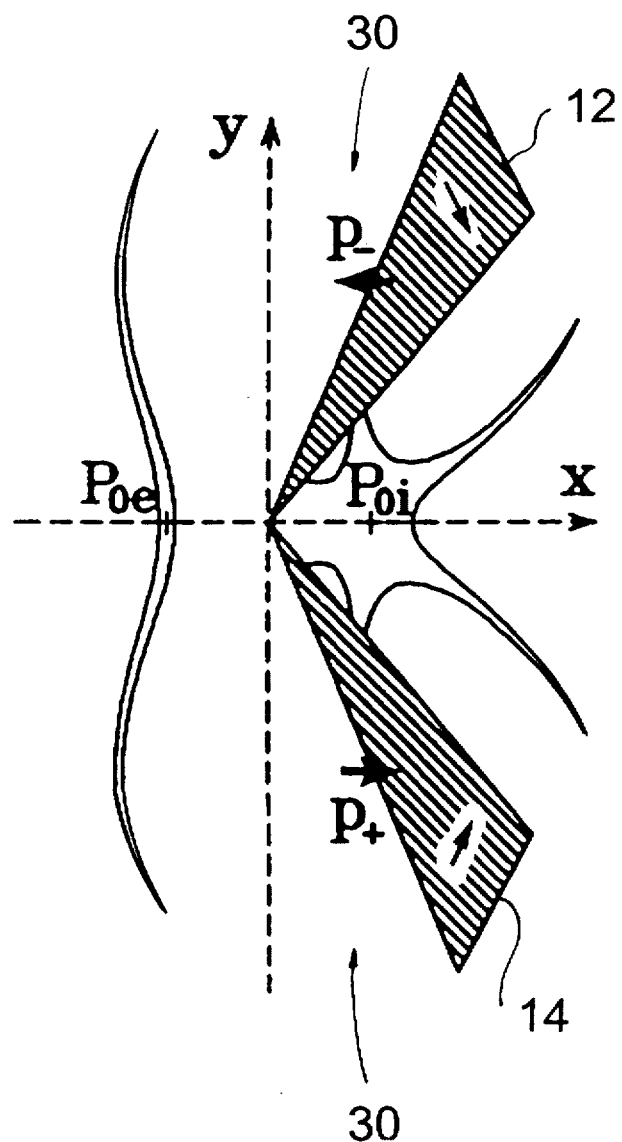
FIG. 27B is a schematic diagram showing the boundaries of two imaging regions near the magnetic structure of FIG. 27B further containing magnetic dipoles.

Consider point $P_{0i}$ to be the center of the imaging region. The gradient of $|\vec{H}|$ at $P_{0i}$ can be compensated by a system of the two linear dipole distributions 30 of uniform moments per unit length $\vec{p}_+$, $\vec{p}_-$ located at $$x=x_0=1, \quad y=\pm y_h \qquad (3.6)$$

and oriented in opposite directions along the axis x, as indicated in FIG. 27B. If the dipole moments have equal magnitude p, they generate on the axis x an intensity of the magnetic field of components $$\begin{cases} H_x \\ H_y \end{cases} = -\frac{2py_h}{\pi\mu_0} \frac{x-x_{0i}}{[(x-x_{0i})^2+y_h^2]^2} \qquad (3.7)$$

FIG. 27B illustrates the boundaries of the imaging regions for the wedge magnet with compensating dipoles 30. While the effect on the geometry of the imaging region about $P_{0i}$ is quite significant, it is negligible in the region around point $P_{0e}$. At $P_{0i}$, $H_y$ vanishes and, as a consequence, the dipoles 30 do not affect the value of the field intensity generated by the wedges at $P_{0i}$. The dipoles 30 generate a gradient $$\left(\frac{dH_y}{dx}\right)_{x=x_0^1} = -\frac{2p}{\pi\mu_0 y_h^3} \qquad (3.8)$$

Eq. (3.8) provides the value of the dipole moment p per unit length necessary to compensate for the gradient of the field generated by the wedges 12, 14 at $P_{0i}$.

Figure 28:
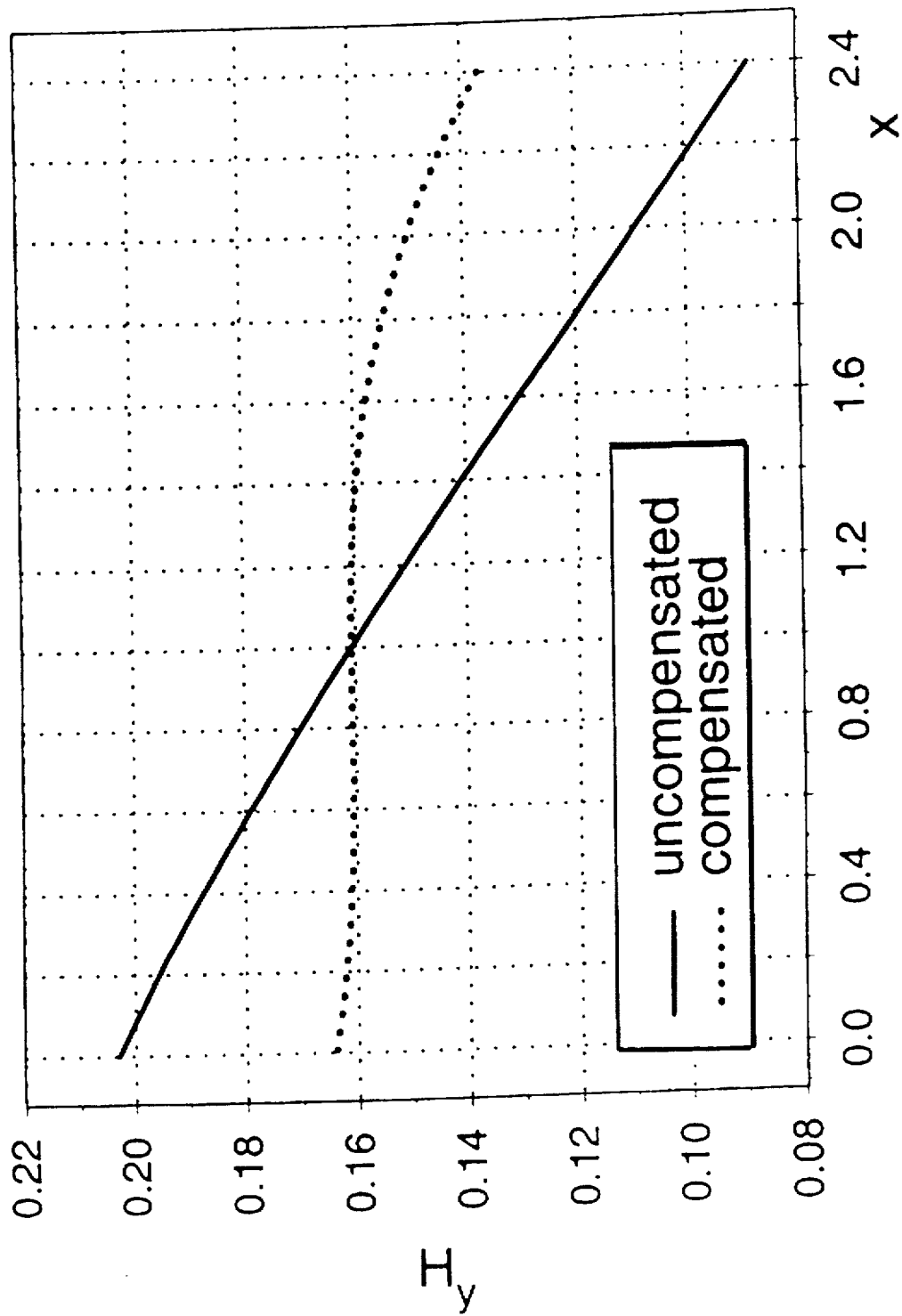
FIG. 28 is a graph of field intensity component along the x axis in the neighborhood of point $P_{0i}$ in FIGS. 27A and 27B.

The effect of the correction of the gradient at point $P_{0i}$ on the distribution of the field along the x-axis is shown in FIG. 28, where the coordinate $y_h$ has been selected as $$y_h=\tan\alpha_2=2.41. \qquad (3.9)$$

Figure 29:
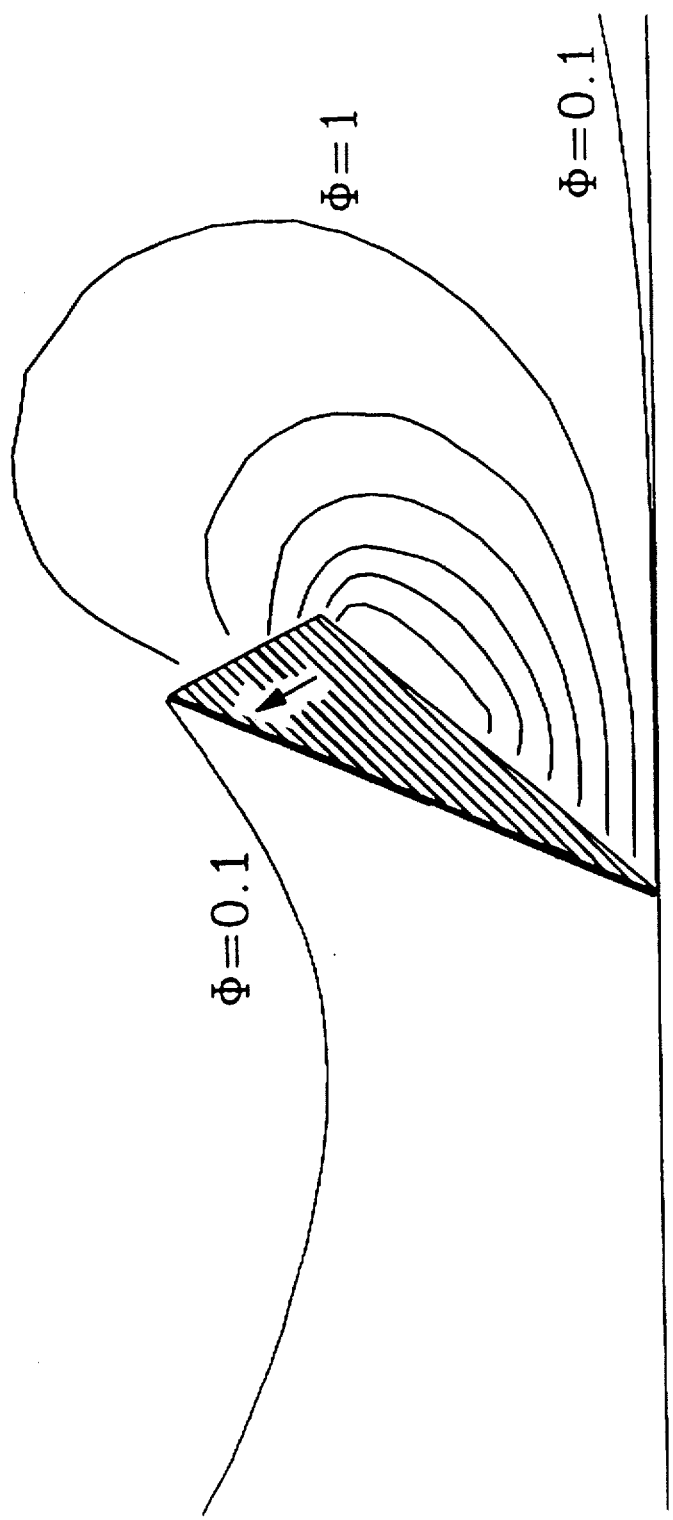
FIG. 29 is a schematic diagram showing equipotential lines of a single wedge magnet of the present invention having a high permeability medium placed along its exterior side.
Figure 30:
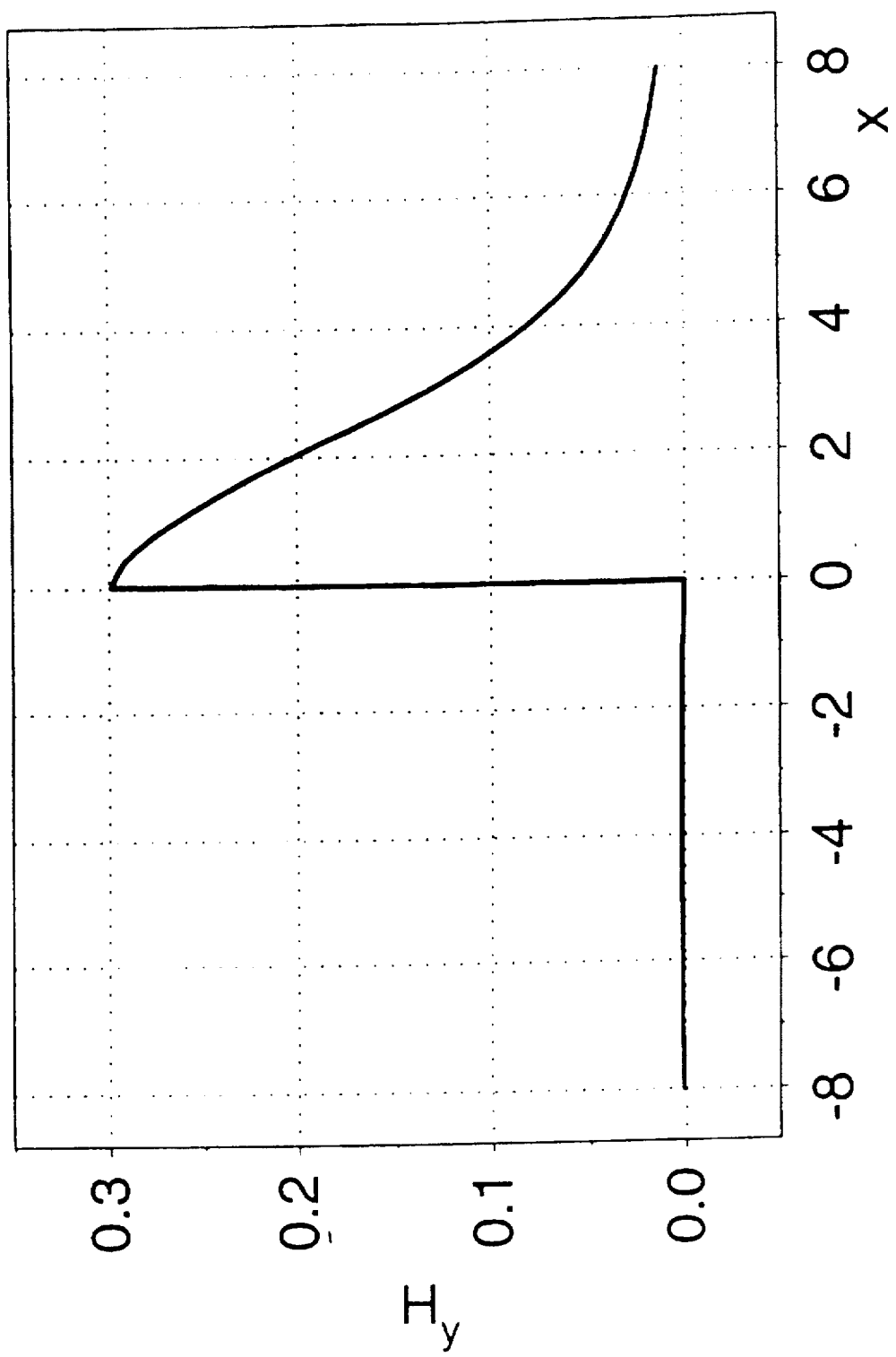
FIG. 30 is a graph of the field intensity component along the x axis for the wedge magnet of FIG. 29.

As described above, the field in either region (1.10) or (1.14) can be eliminated in practice by "short circuiting" one of the two regions by placing a medium of infinite magnetic permeability at either the interfaces h=2, h=3 (sides 22, 24) or the interfaces h=1, h=4 (sides 18, 20). FIG. 29 shows the equipotential lines resulting from the short circuit of interfaces h=2, h=3, and the distribution of the field along the axis x is shown in FIG. 30. In the limit $|x|\to 0$ the field intensities on both sides of the wedges satisfy the conditions $$\lim_{x\to -0}|H_e|=0, \quad \lim_{x\to +0}|H_i|=K\frac{J}{\mu_0} \qquad (3.10)$$

in agreement with Eq. (1.15). The short circuit of interfaces h=2, h=3 eliminates the saddle point S in FIG. 25. Both intensities $\vec{H}_i$, $\vec{H}_e$ on the axis x are oriented in the same direction, and the small value of $\vec{H}_e$ found in the x<0 region is the residual fringe field resulting from the finite radial dimension of the wedge system.

3.2 Closed and Open Magnetic Structures

The wedge systems described above can be integrated either into a magnetic structure that confines the field within a closed cavity, or it can provide the basis for the design of a totally open magnet in which the region of interest is bound only by the wedge magnets.

Figure 31:
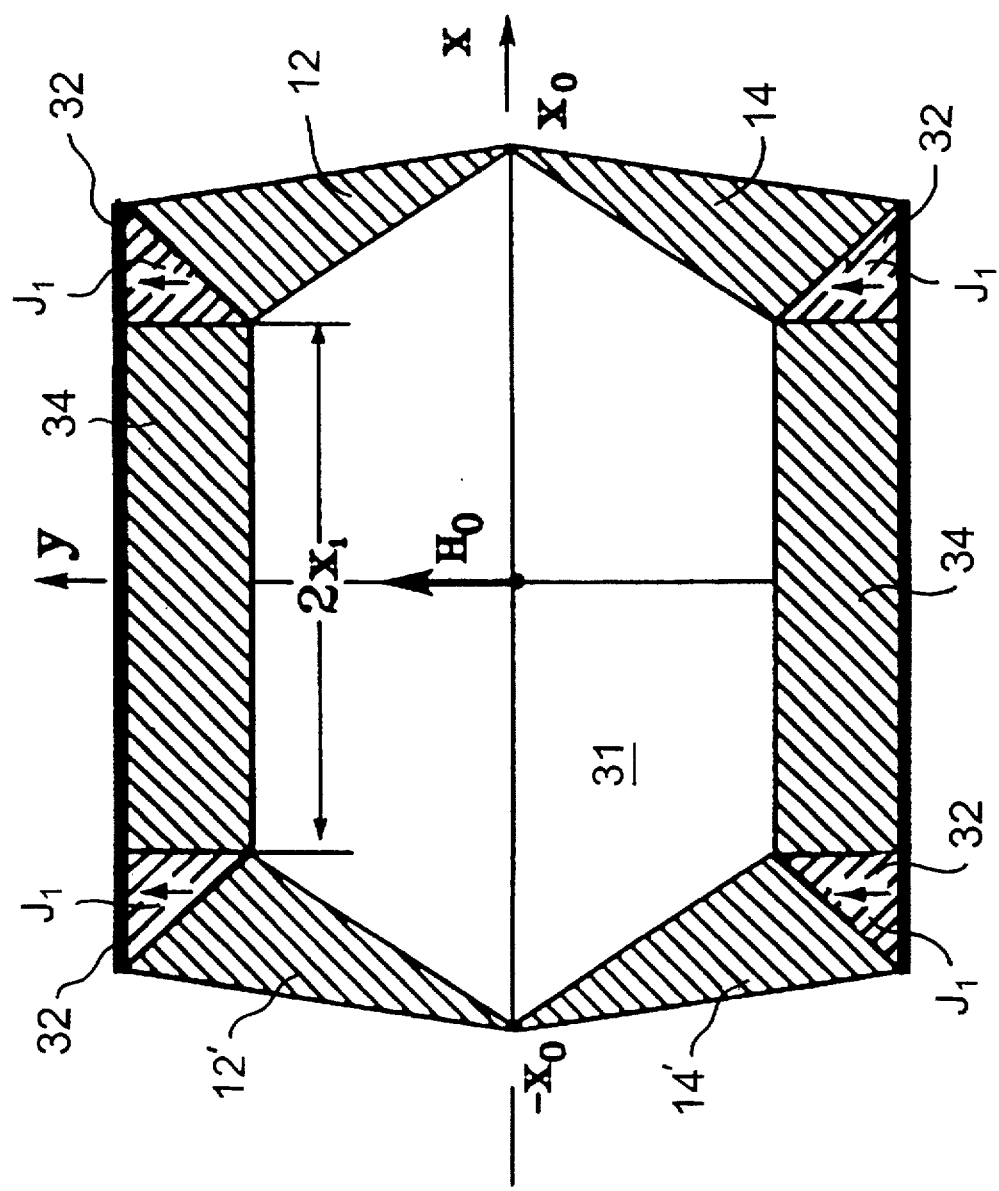
FIG. 31 is a schematic diagram of a closed hexagonal magnetic structure of one embodiment of the present invention.

One embodiment of an integration of a pair of magnetic wedges 12, 14 in a closed magnetic structure is shown in FIG. 31 as a two dimensional magnet with a hexagonal cross section cavity 31. The heavy lines are part of the external yoke that short circuits the external interfaces of the wedges 12, 14. Thus, no field is found outside the external boundary of the structure of FIG. 31 and a uniform field of intensity $\vec{H}_0$ oriented along the axis y is generated in the cavity 31. Triangular transition components 32 of remanence $J_i$ are inserted between the wedges 12, 14 and the rectangular components 34 of the magnetic structure. The transition components 32 carry the flux of the magnetic induction that flows in the cavity 31 of the region $2(x_0-x_i)$.

The value of the induction $B_i$ within the transition components 32 is $$B_i = \frac{K_0J_0}{1-\frac{1}{1-K_0}\frac{\tan\alpha_1}{\tan\alpha_2}}, \qquad (3.11)$$

where $K_0$ is related to the remanence $J_0$ of the other components by the equation $$K_0 = \frac{\mu_0 H_0}{J_0} \qquad (3.12)$$

Thus the remanence $J_i$ is given by $$J_i = B_i + (1+K_0)J_0 = \left[\frac{\frac{\tan\alpha_2}{\tan\alpha_1}-1}{\frac{\tan\alpha_2}{\tan\alpha_1}-\frac{1}{1-K_0}}J_0\right] \geq J_0 \qquad (3.13)$$

In the limit $$\alpha_2 = \frac{\pi}{2} \qquad (3.14)$$

one has $$J_i = J_0, \qquad (3.15)$$

i.e., the transition components 32 are just an extension of the rectangular components 34 of the structure.

Figure 32A:
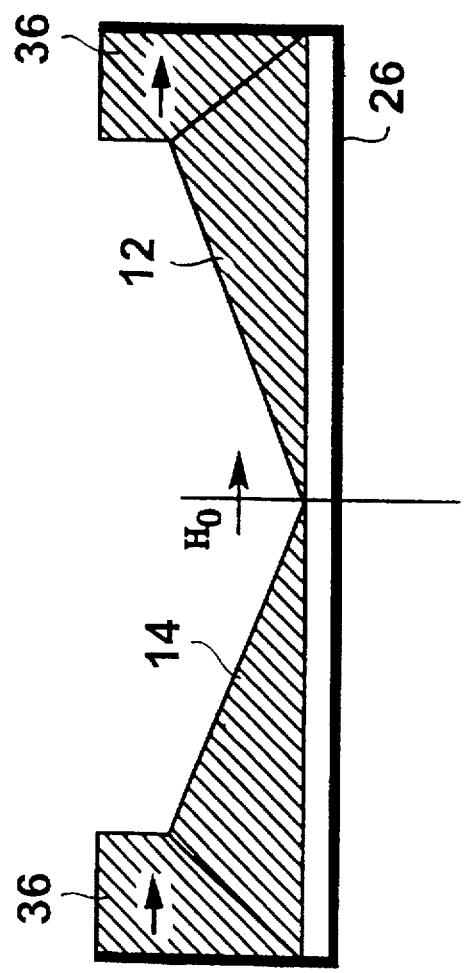
FIGS. 32A and 32B are schematic diagrams of single wedge pair magnetic structures of embodiments of the present invention with magnetic elements as partial terminations.
Figure 32B:
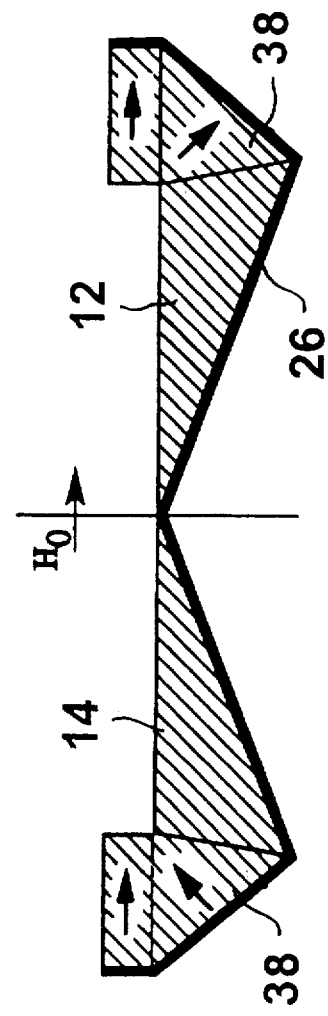

As described herein, the use of a high permeability yoke 26 or layer along one set of sides of a pair of wedges 12, 14 provides the ability to confine the field to one side of the structure as a totally open magnet. As explained above, a high degree of field uniformity can be achieved through the use of a large magnet. Two approaches can be followed to improve the flat, open magnet performance while minimizing its size. First a partial termination of the wedges can be included in the form of magnetized elements 36, as indicated in the schematics of FIGS. 32A and 32B. The partial termination in FIG. 32A follows the logic defined in the structure of FIGS. 27A and 27B in the particular case $\alpha_2=\pi/2$. In the partial termination of FIG. 32B the magnetic induction $B_i$ is zero in the transition triangles 38 which are magnetized with a remanence $\vec{J}_i$ perpendicular to this external boundary as dictated by Eq. (2.23). As explained above, the short circuit of the side of the wedge opposite to the imaging region does not require that the yoke 26 be attached to the wedges 12, 14 interfaces. As a consequence, a space can be created between wedges 12, 14 and yoke 26 where a filter structure 28 as described herein can be inserted to eliminate a given number of spatial harmonics of the field.

Figure 33:
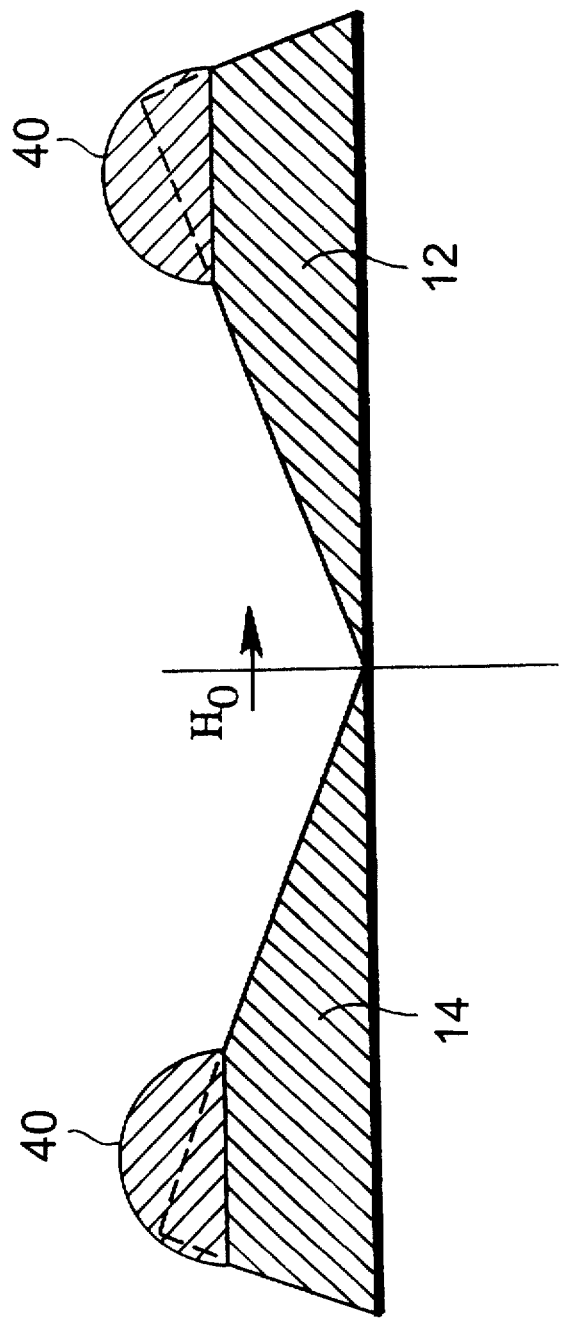
FIG. 33 is a schematic diagram of a single wedge pair magnetic structure of an embodiment with ferromagnetic pole pieces.

FIGS. 32A and 32B are embodiments of active partial terminations where magnetized material is used to reduce the effect of the termination of the wedges 12, 14. An example of passive partial termination is shown in FIG. 33 where ferromagnetic components 40 are performing the same function of the structures of FIGS. 32A and 32B. The two ferromagnetic components 40 are attached to the wedges 12, 14 and the interface between them and the wedges 12, 14 follows an equipotential surface of the ideal field inside the wedges in the limit of perfect termination.

4. Multiple Wedge Structures

The previous sections describe a magnetic structure containing a single pair of magnetic wedges. As described below, the intensity of the magnetic field generated by the structure can be increased by increasing the number of the wedge pairs in the structure.

Yokeless magnets are structures of magnetized material where the field is confined within the magnet without the need of a ferromagnetic yoke. If a magnet designated to generate a given field within its cavity is enclosed in another yokeless magnet designated to generate a field of the same magnitude and orientation, the total field intensity within the cavity doubles, as long as the magnetic material has an ideal linear characteristic with zero susceptibility. As a consequence, a multiplicity of concentric yokeless magnets may be used to generate strong fields in excess of the remanence of the material.

Figure 34:
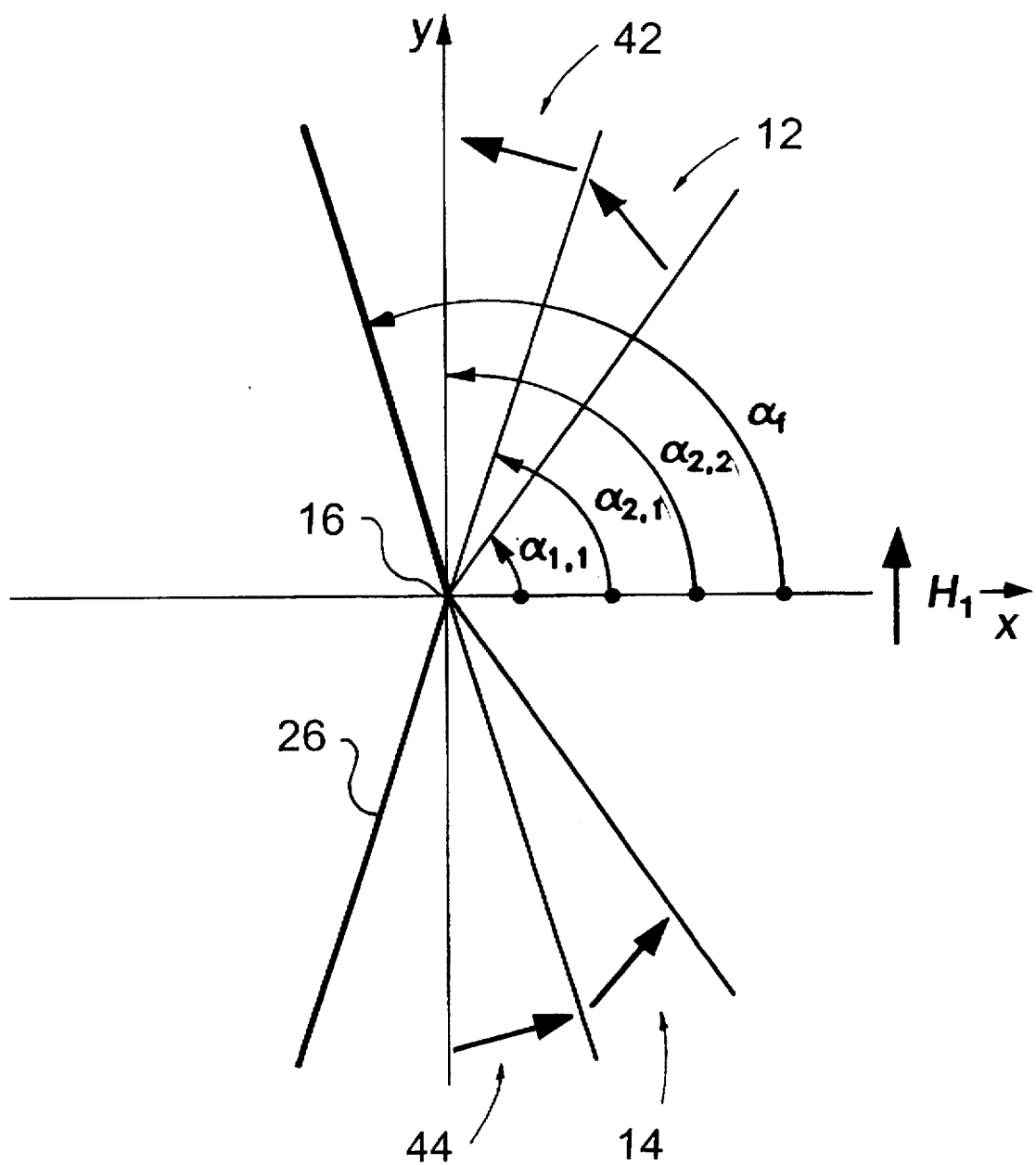
FIGS. 34, 35A and 35B are schematic diagrams of two wedge pair magnetic structures of embodiments of the present invention.

The same approach can be extended to a multiplicity of wedges having the axis z as a common edge. FIG. 34 shows the schematic of a structure of two wedge magnet pairs 12, 14, and 42, 44 designated to generate a transverse field ($H_{ix}=0$), in the presence of a $\mu=\infty$ ferromagnetic wedge 26 defined by the angle $2\alpha_f$. The pairs of wedges 12, 14 and 42, 44, have common edges 16 which are at the same location or are close to one another. Looking in the region y>0, the wedges 12, 42 have identical angular width $$\alpha_{1,2}-\alpha_{1,1}=\alpha_{2,2}-\alpha_{2,1}=\arcsin K, \quad (4.1)$$

where $$\alpha_{2,1}=\alpha_{1,2} \quad (4.2)$$

Corresponding wedges 14, 44 also have identical angular width. Because of the presence of the ferromagnetic yoke 26, the intensity of the field generated by each wedge magnet is zero in the region $\alpha>\alpha_{2,2}$, and the total intensity of the field in the region $|\alpha|<\alpha_{1,1}$ is $$\frac{\mu_0 H_t}{J_0} = 2K. \quad (4.3)$$

Obviously a single wedge of angular width $\alpha_{2,2}-\alpha_{1,1}$ would generate a field $$\frac{\mu_0 H_i}{J_0} = \sin(\alpha_{2,2} - \alpha_{1,1}) < 2K \quad (4.4)$$

Assume a total angle $$\alpha_f = \alpha_{m,2} - \alpha_{1,1}, \quad (4.5)$$

divided in a number m of wedges of identical angular width $\alpha_f/m$.

The structure of multiple wedges generates a field with a total value $K_t$ $$\frac{K_t}{K_s} = m \frac{\sin \frac{\alpha_f}{m}}{\sin \alpha_f}, \quad (4.6)$$

where $K_s$ is the value generated by a single wedge structure of angular width $\alpha_f$. In the limit $m=\infty$, Eq. (4.6) reduces to $$\frac{K_t}{K_s} = \frac{\alpha_f}{\sin \alpha_f}, \quad (4.7)$$

Eq. (4.7) shows that a multiple wedge structure is effective for large values of $\alpha_f$, i.e. in magnets designated to generate a strong field approaching or even exceeding the value of the remanence.

Assume a structure of m wedges of identical angular width and identical normalization factor $y_0$. By virtue of (1.30), the total intensity and its derivative with respect to x at r=0 increase proportionally with m. Consequently in the limit $r/y_0>>1$ the total intensity of the field generated by the m wedges satisfies the condition $$\left(\frac{\mu_0 H_{iy}}{mKJ_0}\right)_0 = 1, \left[\frac{d}{d(x/y_0)}\left(\frac{\mu_0 H_{iy}}{mKJ_0}\right)\right]_0 = -\frac{4}{\pi}. \quad (4.8)$$

The presence of the $\mu=\infty$ wedge does not change the value of $H_{iy}$ at x=0 but it affects its derivative of $H_{iy}$ at x=0. Within the angle $2\alpha_f$ of the $\mu=\infty$ wedge, the potential generated by the multiple wedge magnets in the proximity of the x=y=0 can be expanded in the series $$\Phi(r,\alpha) = \sum_{n=1}^{\infty} c_n \left(\frac{r}{r_0}\right)^{n\frac{\pi}{\alpha_f}} \sin n \frac{\pi}{\alpha_f} \alpha, \quad (4.9)$$

where $r_0$ is an arbitrary distance and $r/r_0>>1$. Coefficients $c_n$ depend upon the geometry of the multiple wedge magnet. The y component of the intensity is $$H_{iy} = \quad (4.10)$$

$$-\frac{\pi}{\alpha_f r_0^2} \sum_{n=1}^{\infty} n c_n \left(n\frac{r}{r_0}\right)^{n\frac{\pi}{\alpha_f}-1} \cos\left(n\frac{\pi}{\alpha_f} - 1\right)\alpha,$$

i.e. the derivative $H_{iy}$ with respect to x at y=0 is $$\left.\frac{\partial H_{iy}}{\partial x}\right)_0 = \quad (4.11)$$

$$-\frac{\pi}{\alpha_f r_0^2} \sum_{n=1}^{\infty} c_n n \left(n\frac{\pi}{\alpha_f} - 1\right)\left(\frac{x}{r_0}\right)^{n\frac{\pi}{\alpha_f}-2}.$$

The harmonics $n\geq 2$ of (4.11) cancel at x=0, independent of the value of $\alpha_f$. The fundamental harmonic (n=1) of (4.11) has a singularity at x=0 for $\alpha_f>\pi/2$ and it cancels for $$\alpha_f < \frac{\pi}{2}. \quad (4.12)$$

Figure 38:
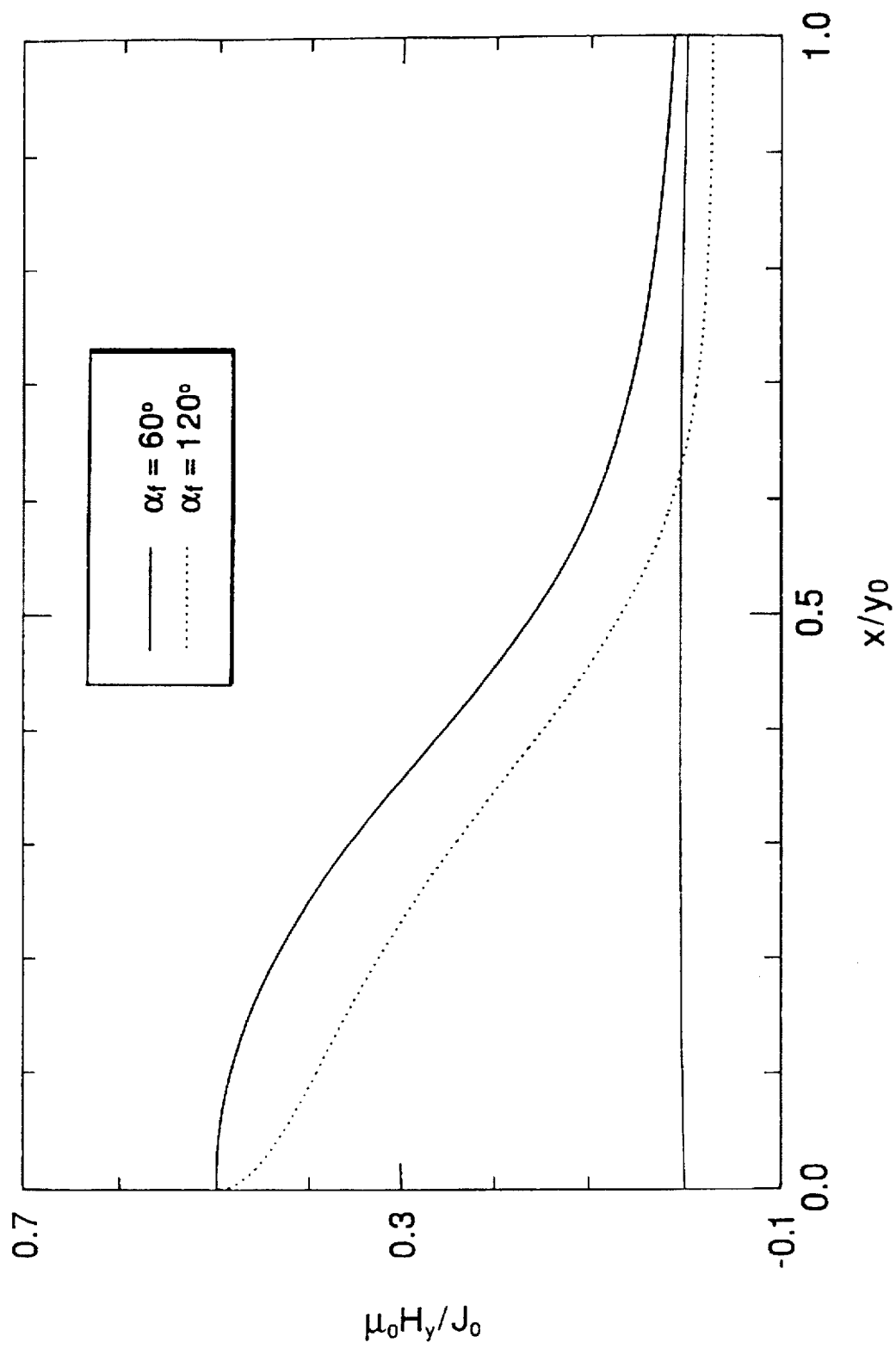
FIG. 38 is a graph of field intensity of a single wedge magnet for two values of $\alpha_f$.

Thus the gradient of the field at x=0 given by Eq. (4.8) in the absence of the $\mu=\infty$ wedge is eliminated by the presence of a concave ferromagnetic wedge that satisfies condition (4.12) as shown in FIG. 38.

Figure 35A:
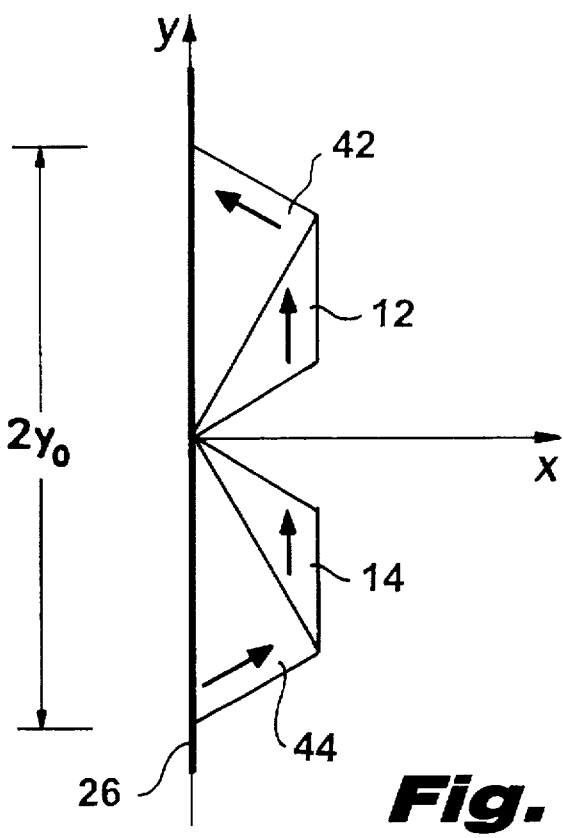
Figure 35B:
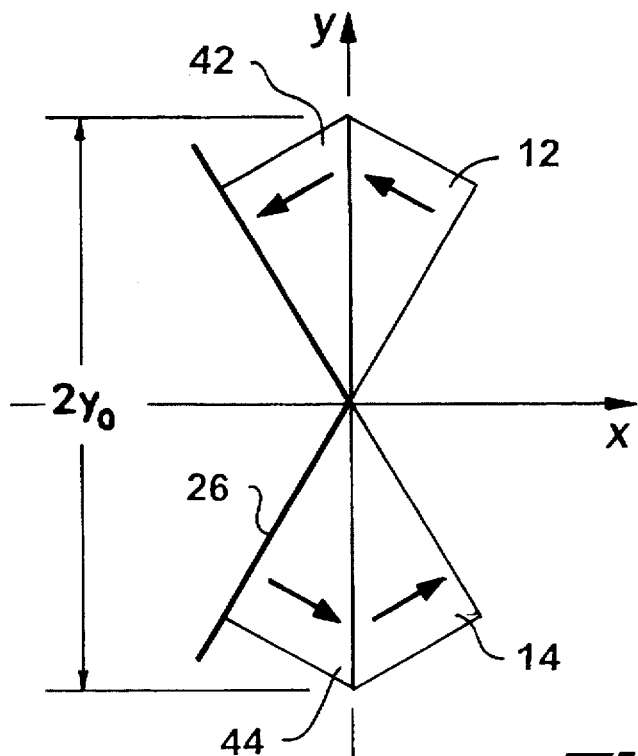

As an example, consider the structures of the two wedge magnets shown in FIGS. 35A and 35B. Each wedge magnet is designated for K=0.5 which corresponds to a $\pi/6$ wedge angle. A single wedge magnet of angle $\pi/3$ would generate a value of $K_s$ $$K_s = 0.866. \quad (4.13)$$

Figure 36:
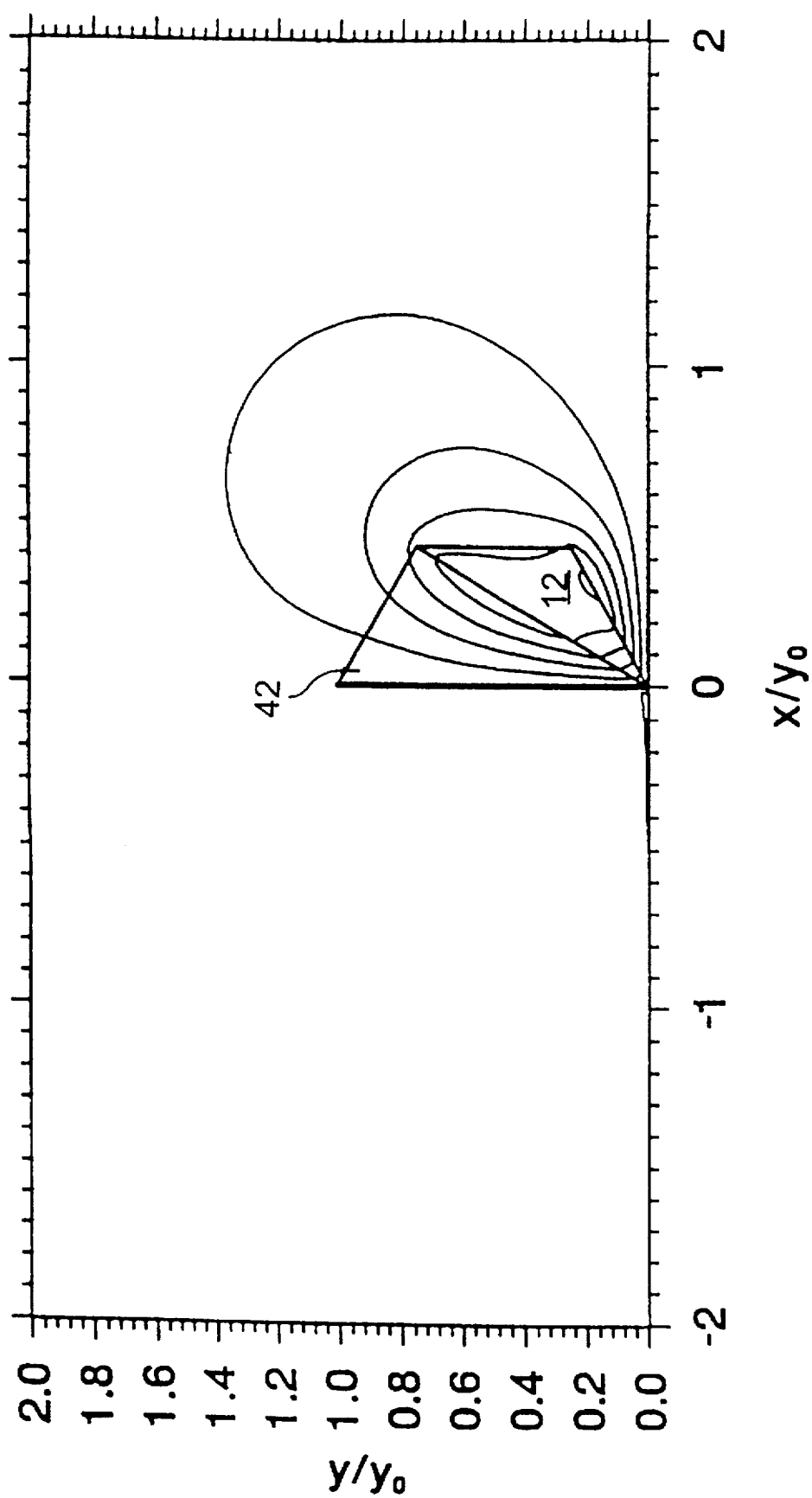
FIG. 36 is a schematic diagram showing equipotential lines of two magnetic wedges of the structure of FIG. 35A.
Figure 37:
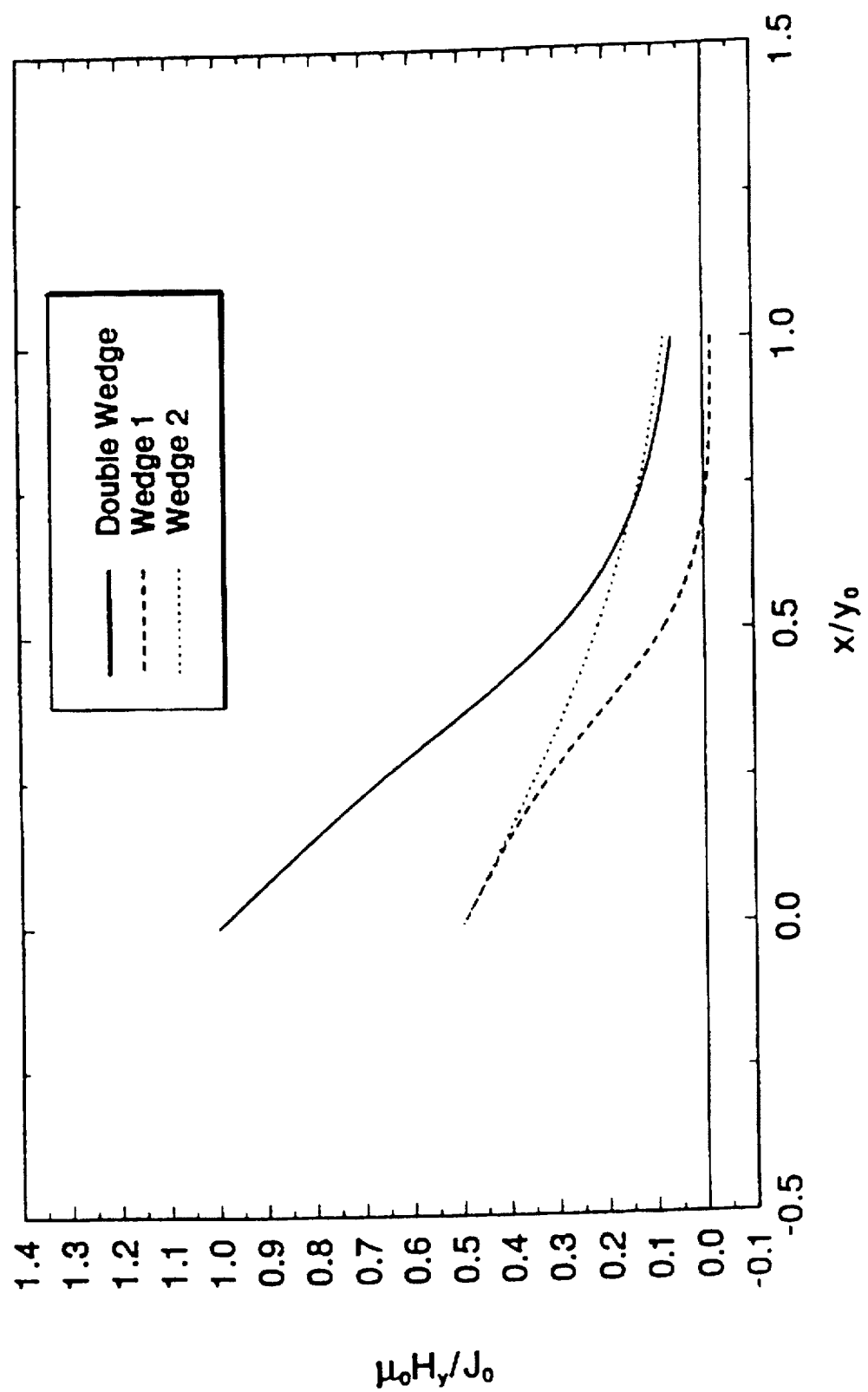
FIG. 37 is a graph of field intensity for the double wedge magnet of FIG. 35A.

The field generated by the structures of FIGS. 35A and 35B corresponds to a total value of $K_t=1$, which represents a 15% gain compared to a single $\pi/3$ wedge magnet. FIG. 36 shows the equipotential lines of the field generated by the structure of FIG. 35A where the angle $\alpha_f$ of the $\mu=\infty$ wedge 26 is $\pi/2$ (and $y_0=1.0$). The corresponding distribution of $H_{iy}$ on the axis x is shown in FIG. 37 which also shows the intensities generated on the axis x by the individual wedge magnets of the structure of FIG. 35A, in the presence of the ferromagnetic yoke. In agreement with Eq. 4.11, both wedge structures exhibit the same value of the derivative of the intensity with respect to x at x=0, which coincides with the value give by Eq. (3.8).

Figure 39:
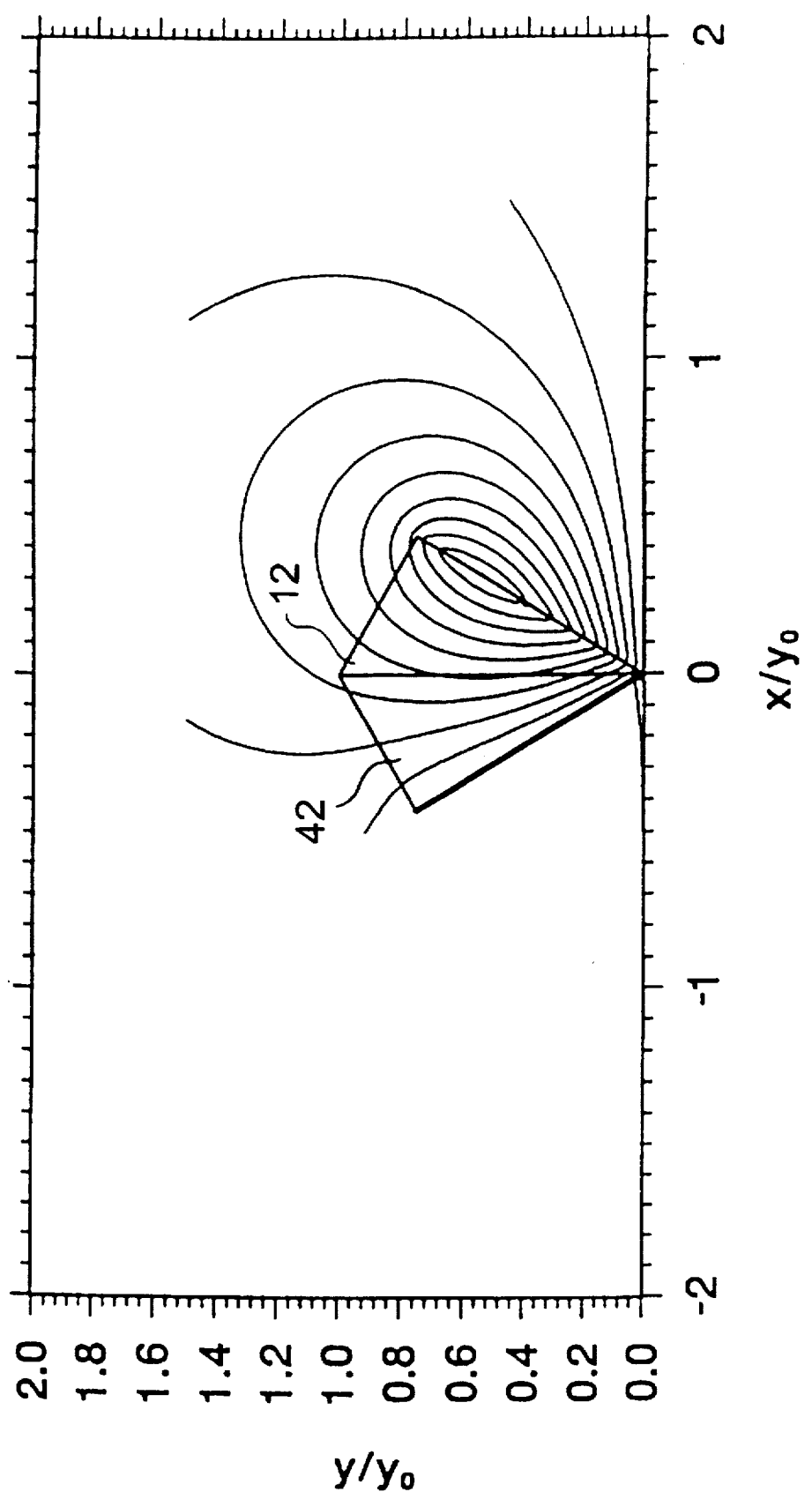
FIG. 39 is a schematic diagram showing equipotential lines of two magnetic wedges of the structure of FIG. 35B.

FIG. 39 shows the equipotential lines generated by the structure of FIG. 35B where the angle $\alpha_f$ of the $\mu=\infty$ wedge is $2\pi/3$. Because of the symmetry of the two wedge magnets relative to the plane x=0, the surface charge induced on the interface between the wedges vanishes and no discontinuity of the intensity is formed on the interface, as shown by FIG. 36.

Figure 40:
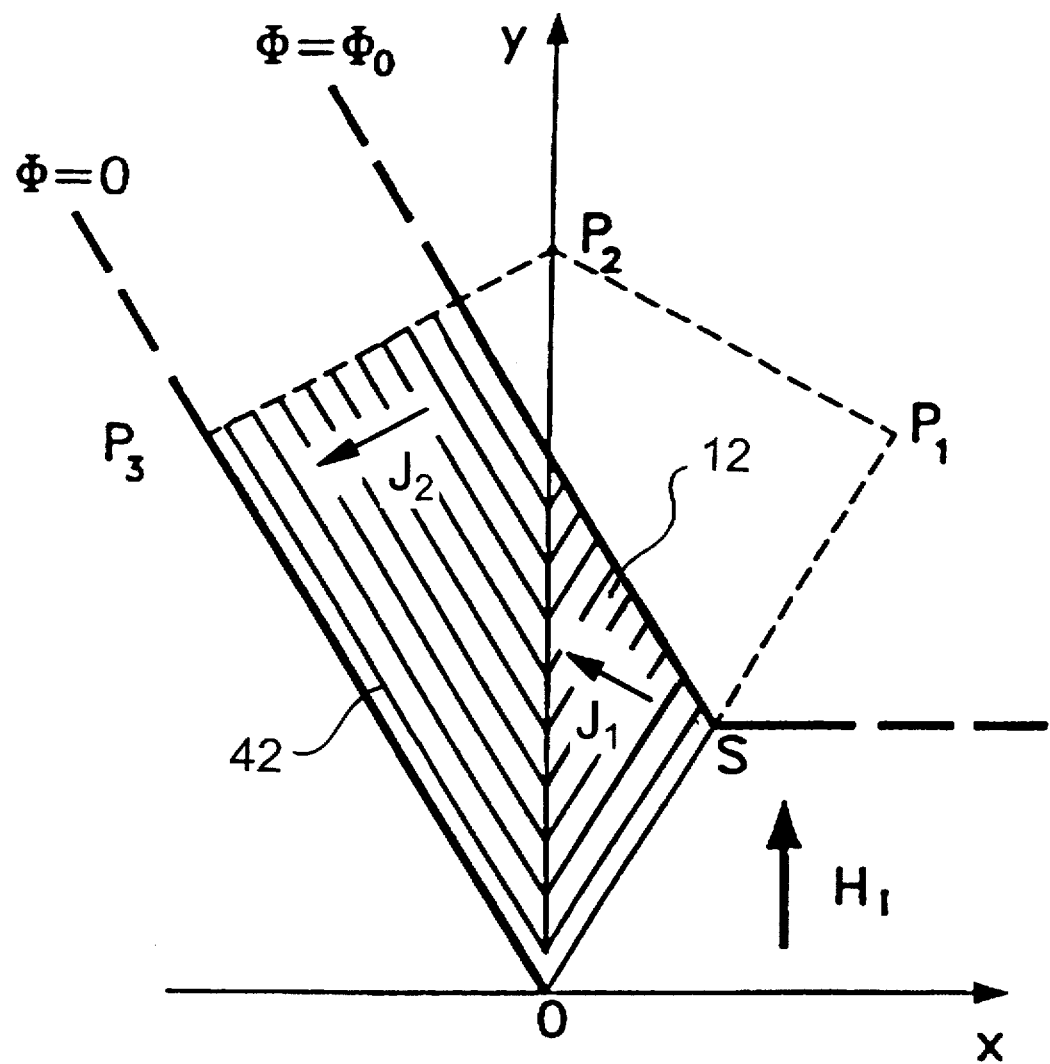
FIG. 40 is a schematic diagram for a double wedge pair magnetic structure of one embodiment of the present invention with the transformation of an equipotential line into an interface with a high magnetic permeability material.

The multiple wedge approach can be extended to structures designated to generate longitudinal fields ($H_{iy}=0$). However, for finite dimensions $r_{0h}$, the presence of the $\mu=\infty$ yoke results in a significant difference of the field properties in the two types of magnets. In the structure of FIG. 40, if the wedges 12, 42 are truncated symmetrically with respect to the axis x, the potential generated by the truncation satisfies the condition $\Phi=0$ at y=0. As a consequence no singularity of the intensity occurs at r=0.

A different situation is found in structures designated to generate a longitudinal field for an angle $\alpha_f$ of the $\mu=\infty$ wedge 26 larger than $\pi/2$. In this case a singularity of the field at r=0 is induced by the field generated by the truncation of the wedges, and compensation of the singularity can be achieved only at the cost of reducing the effectiveness of the multiple wedge approach.

As a consequence, although both conditions (1.6) and (1.7) can be used in the design of a wedge magnet, the following section will be confined to the implementation of multiple wedge structures for transverse fields.

5. Termination Of Multiple Wedge Structures

The properties of the multiple wedge structures presented in the previous section assume ideal geometries with wedge dimensions large compared to the dimension of a region of interest close to the common edge of the wedges. A way of implementing these properties in practical applications is to truncate the structures along equipotential surfaces of the field found in the ideal geometries, and to assume that these surfaces become the interfaces between wedges and high magnetic permeability materials. The introduction of these ferromagnetic materials provides an efficient way of integrating the multiple wedges in structures designated to satisfy the requirements of specific applications.

As an example, FIG. 40 shows the transformation of the basic schematic the two wedge structure of FIG. 35B that results from an arbitrary equipotential line $\Phi=\Phi_0$ becoming the interface of the wedges with a $\mu=\infty$ material. Assume that the equipotential interface extends to infinity. The values of $\vec{J}$, $\vec{H}$, $\vec{B}$ in the components of remanences $\vec{J}_1$ and $\vec{J}_2$ in the y>0 region of the magnet are provided by the vector diagram of FIG. 41 which corresponds to a total value $K_r$ $$K_r=1.0, \tag{5.1}$$

obtained with an angular width of 30° of the wedges 12, 42.

Figure 41:
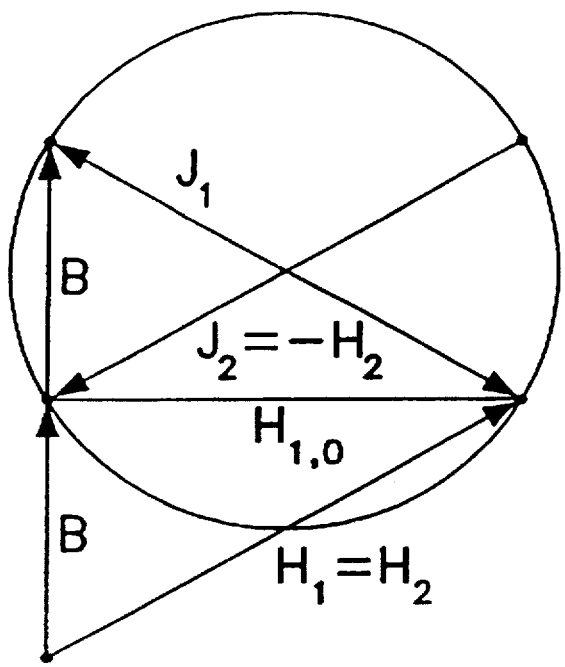
FIG. 41 is a vector diagram for the computation of field components for the double wedge structure of FIG. 40.

Vector $\vec{B}$ is the magnetic induction generated in the non magnetic medium of FIG. 40 by each wedge of the structure. As the vector diagram in FIG. 41 shows, the magnetic induction is zero in the wedge of remanence $\vec{J}_2$ that satisfies the condition $$\vec{J}_2 = -\mu_0\vec{H}_2 = -\mu_0\vec{H}_1 \tag{5.2}$$

Figure 42:
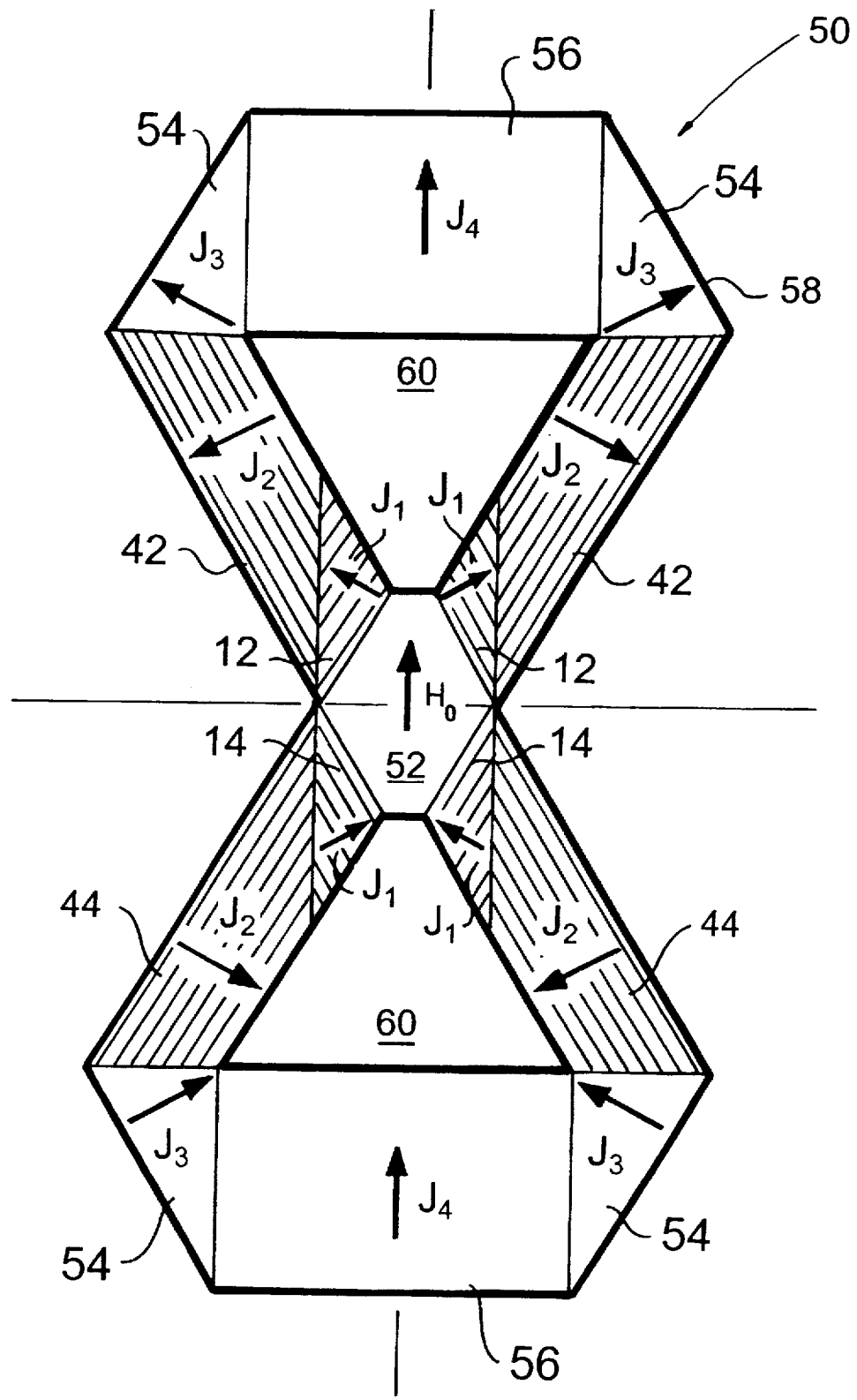
FIG. 42 is a schematic diagram of a closed magnetic structure of one embodiment of the present invention incorporating the double wedge structure of FIG. 40.
Figure 43:
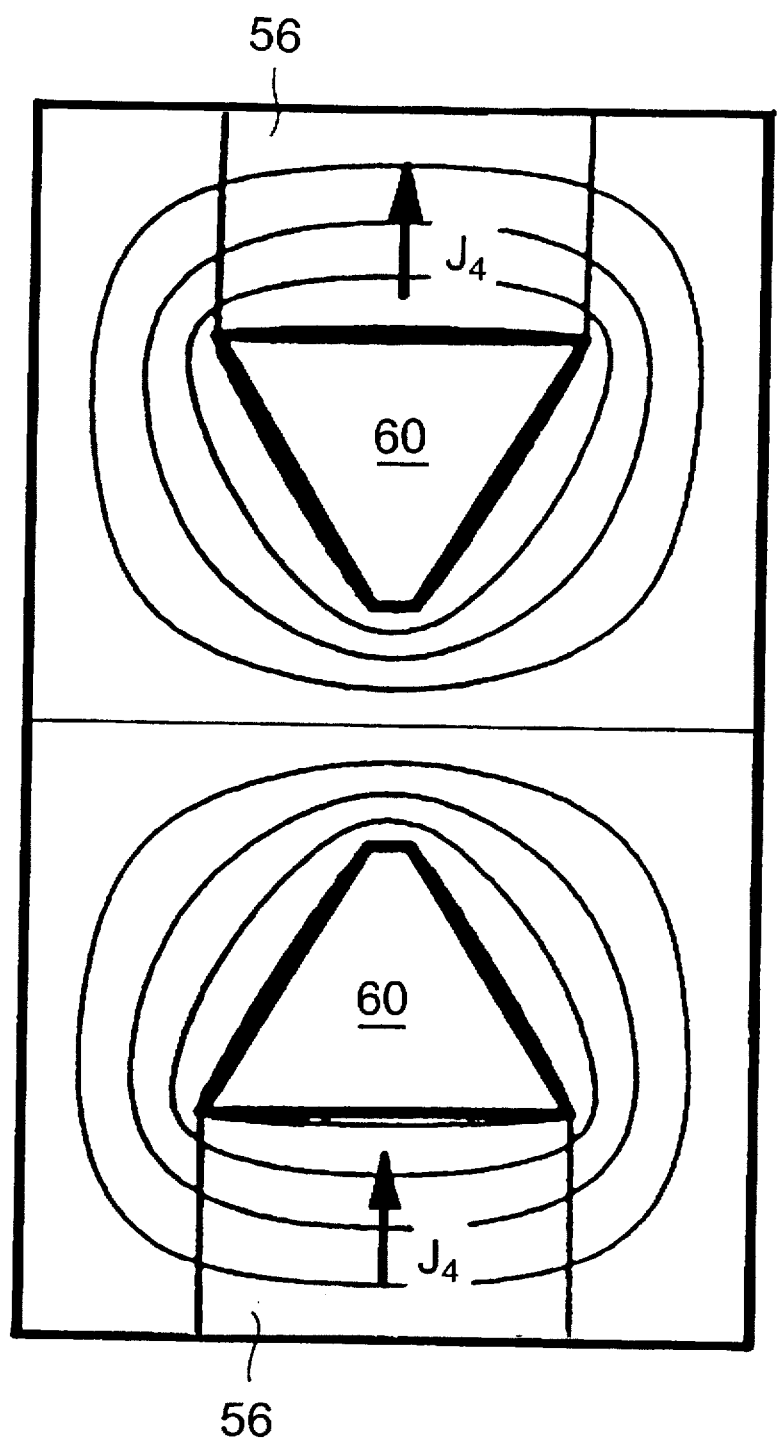
FIG. 43 is a schematic diagram of a magnet having pole pieces and rectangular magnetic components with geometries similar to the geometries of the structure of FIG. 42.
Figure 44:
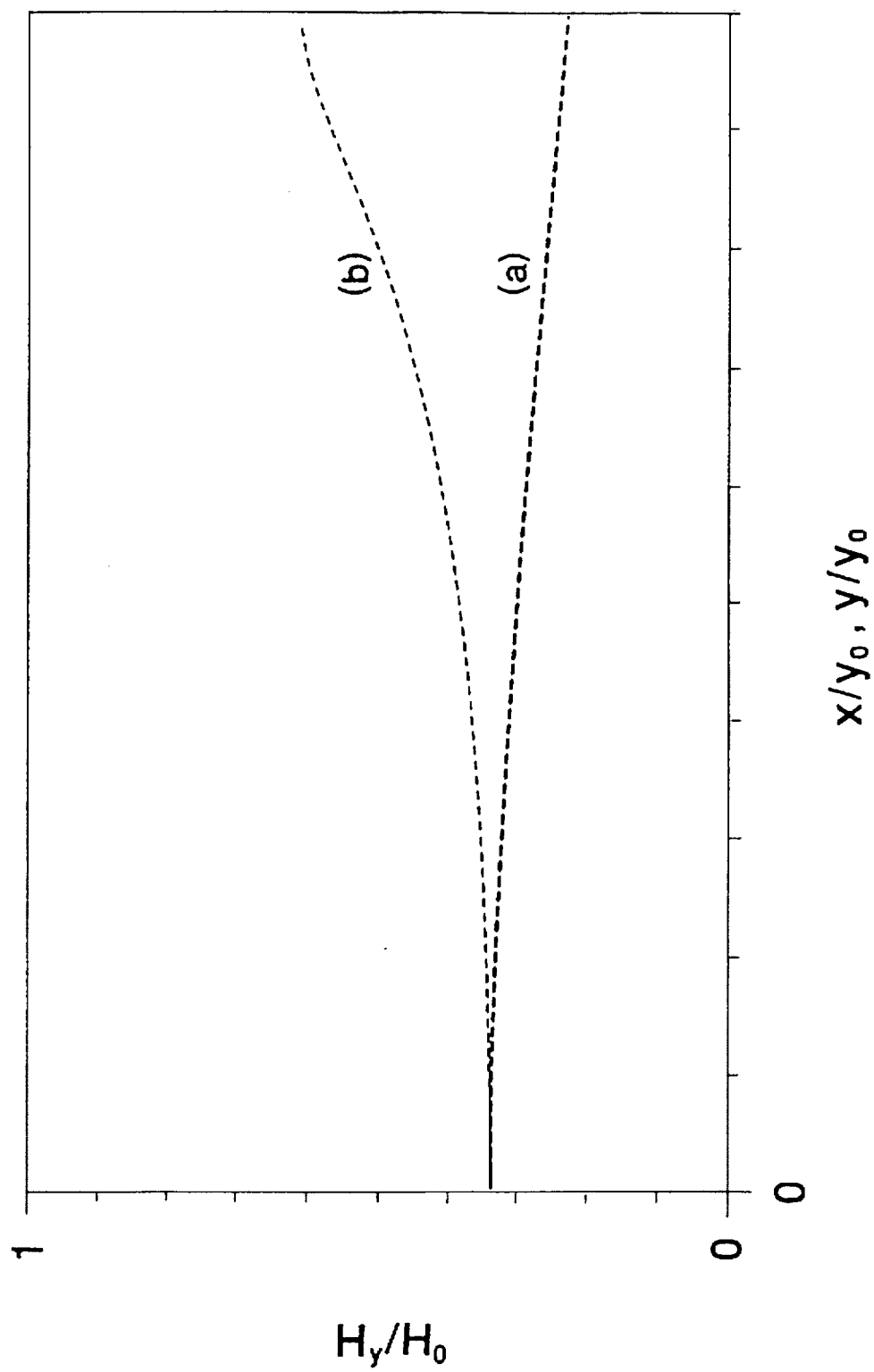
FIG. 44 is a graph of field distribution along the x axis (curve (a)) and y axis (curve (b)) for the magnetic structure of FIG. 43.

The termination of the wedge of remanence $\vec{J}_2$ and the non magnetic region of magnetic induction $2\vec{B}$ depends upon the requirements of each application. For instance, FIG. 42 shows the application of the structure of FIG. 40 in a magnet 50 designated around a prismatic cavity 52 of hexagonal cross-section. Components 54 of remanence $\vec{J}_3$ satisfy the condition $$\vec{B}=0, \tag{5.3}$$

and form the transition between the wedges 42, 44 of remanence $\vec{J}_2$ and rectangular blocks 56 of remanence $\vec{J}_4$ that close the flux of the magnetic induction through the external yoke 58 represented by the heavy line that encloses the magnet 50. In the schematic of FIG. 42, both remanences $\vec{J}_3$, $\vec{J}_4$ have the same magnitude of $\vec{J}_1$ and $\vec{J}_2$. The dimensions of the rectangular blocks 56 are chosen according to the optimum operating point of the demagnetization characteristics of the material of remanence $\vec{J}_4$, i.e., $$\vec{B}_4 = \frac{1}{2}\vec{J}_4 = -\mu_0\vec{H}_4 = \vec{B}, \tag{5.4}$$

i.e., the magnetic induction $\vec{B}_3$ is half the induction within the cavity 52. The two ferromagnetic components 60 derived from the equipotential lines of FIG. 40 channel the flux from the cavity into the two rectangular blocks 56 of remanence $\vec{J}_4$ and are the equivalent of the pole pieces of a traditional magnet designated to focus the field generated by the magnetic material into a smaller region of the magnet cavity. A schematic of such a traditional magnet with the same dimensions of the magnetic material of remanence $\vec{J}_4$ and the same geometry of the pole pieces is shown in FIG. 43. The equipotential lines of the field in FIG. 43 illustrate the differences between the magnet of FIG. 42 derived from the double wedge structure and a traditional magnet. The plotting of the field along axes x (curve (a)) and y (curve (b)) shown in FIG. 44 shows the non uniformity of the field in the gaps between the pole pieces of the traditional magnet. The field intensity in FIG. 44 is normalized to the value of the uniform intensity $H_0=\vec{J}_4/\mu_0$ generated by the double wedge structure of the magnet of FIG. 42. The value $H_y/H_0<1$ of the field at the center of the gap in FIG. 43 and the field non uniformity are the consequence of the fringe field outside the region of interest that characterizes traditional magnet designs.

The termination of a wedge structure by means of ferromagnetic components confined by an equipotential surface of the field generated by the wedges can be extended to structures of multiple wedges with m>2. An example is presented in FIG. 45 that shows the transformation of a triple wedge structure designated to generate a total value $K_r$ $$K_r=15, \tag{5.5}$$

Figure 46A:
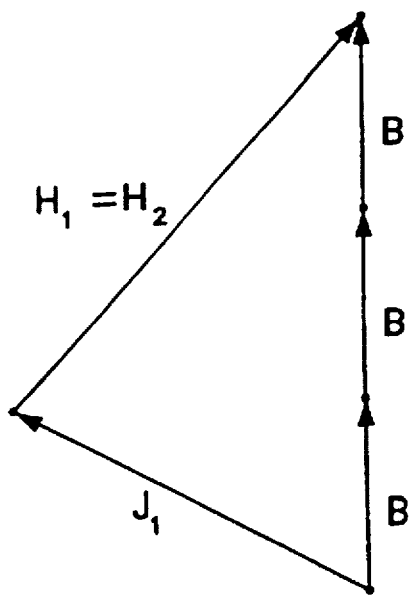
FIGS. 46A, 46B, and 46C are vector diagrams for the computation of field components in the three magnetic wedges of FIG. 45.
Figure 46B:
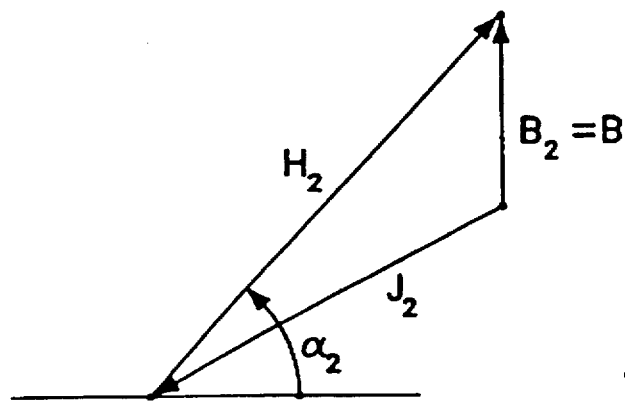
Figure 46C:
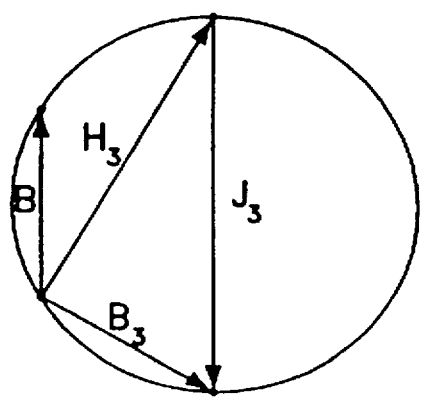

The wedges 12, 42, 62 have identical angular widths of 30°. The values of $\vec{J}$, $\vec{H}$, $\vec{B}$ in the three wedges 12, 42, 62 are provided by the vector diagrams of FIGS. 46A, 46B, and 46C, respectively. Again, the three remanences $\vec{J}_1$, $\vec{J}_2$, $\vec{J}_3$ have the same magnitude $J_0$ and vector $\vec{B}$ is the magnetic induction generated by each wedge of the region x>0 of the structure. As shown by the vector diagrams of FIGS. 46A and 46B, the magnetic induction does not vanish in the region x<0 of the structure. The induction $\vec{B}_2=\vec{B}$ in the wedge of remanence $\vec{J}_2$ is oriented parallel to the axis y and the induction $\vec{B}_3$ is the wedge of remanence $\vec{J}_3$ is oriented parallel to the yoke of the structure. The magnitude of $\vec{B}_3$ is equal to the magnitude of vector $\vec{B}$. As indicated in FIG. 45 the equipotential line transformed into the boundary between the wedges 12, 42 of remanences $\vec{J}_1$, $\vec{J}_2$ and the μ=∞ material is oriented at an angle $\alpha_{e1}$ with respect to the axis y given by $$\tan \alpha_{e1} = \frac{2}{\sqrt{3}} \tag{5.6}$$

i.e., $\alpha_{e1}$=49.1°. The orientation $\alpha_{e3}$ of the equipotential lines in the medium of remanence $\vec{J}_3$ is parallel to the external yoke, i.e., $\alpha_{e3}$=60°.

Figure 47:
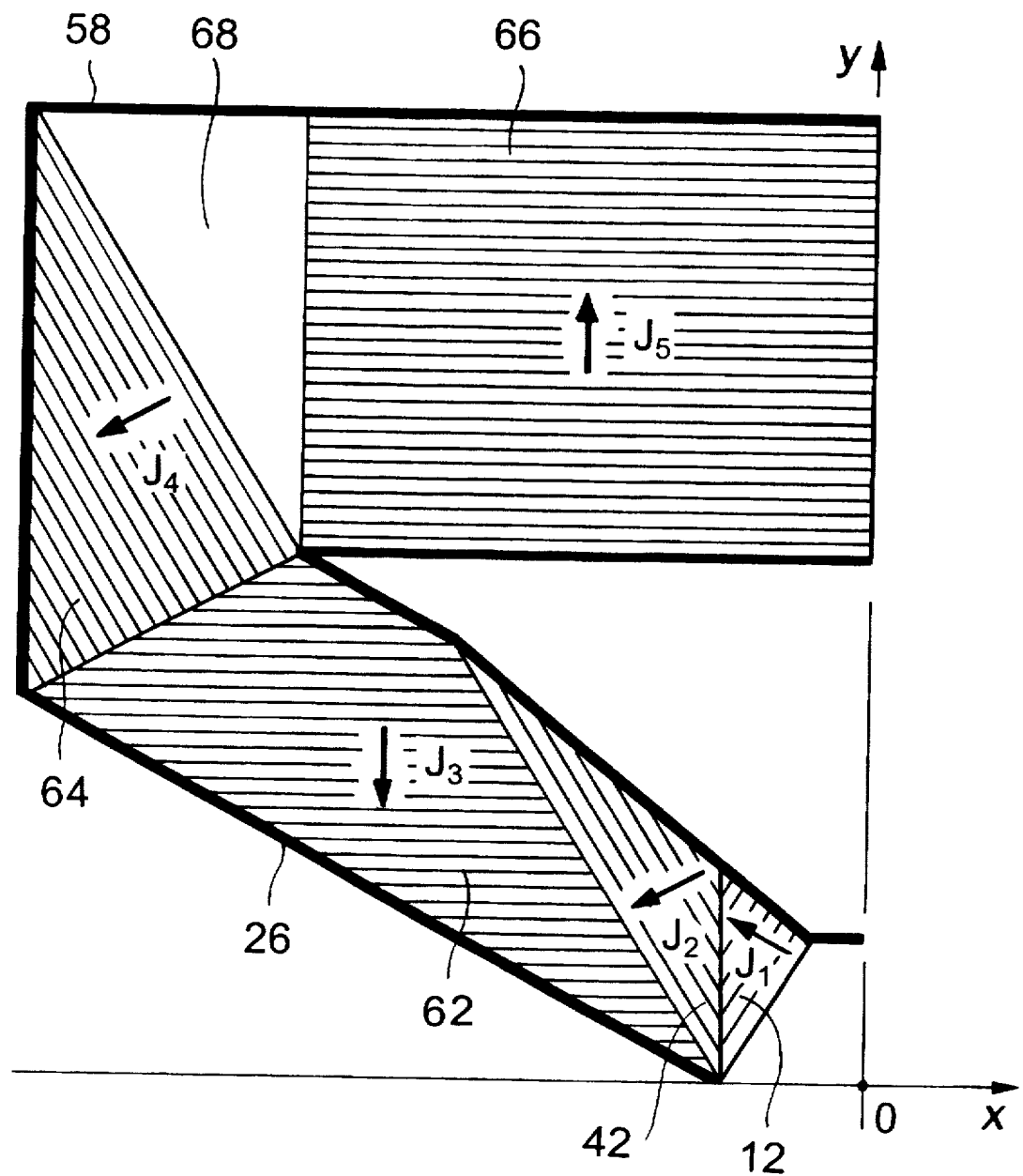
FIG. 47 is a schematic diagram of a portion of a closed magnetic structure of an embodiment of the present invention incorporating the triple wedge pair magnetic structure of FIG. 45.

The integration of the triple wedge structure into a magnet designated around the same prismatic cavity of FIG. 42 for the value of $K_t$ given by Eq. 5.5 is shown in structure of FIG. 47 where the remanences of all the components have the same magnitude $J_0$.

The transition between the wedge 62 of remanence $\vec{J}_3$ and a rectangular block 66 of remanence $\vec{J}_5$ is accomplished by a rectangular wedge 64 of remanence $\vec{J}_6$ and the triangular region 68 of non magnetic material where the intensity, oriented in the negative direction of the axis y, is $$\vec{H} = -\frac{1}{2\mu_0} \vec{J}_5 = -\frac{\vec{B}}{\mu_0}, \tag{5.7}$$

the magnetic reduction $\vec{B}_4$ in the triangle 64 of remanence $\vec{J}_4$ is $$\vec{B}_4 = -\vec{B}. \tag{5.8}$$

As in FIG. 42, the structure of FIG. 47 is enclosed by the external yoke 58 that channels the total flux of the induction carried by the rectangular component 66 of remanence $\vec{J}_5$.

Figure 48:
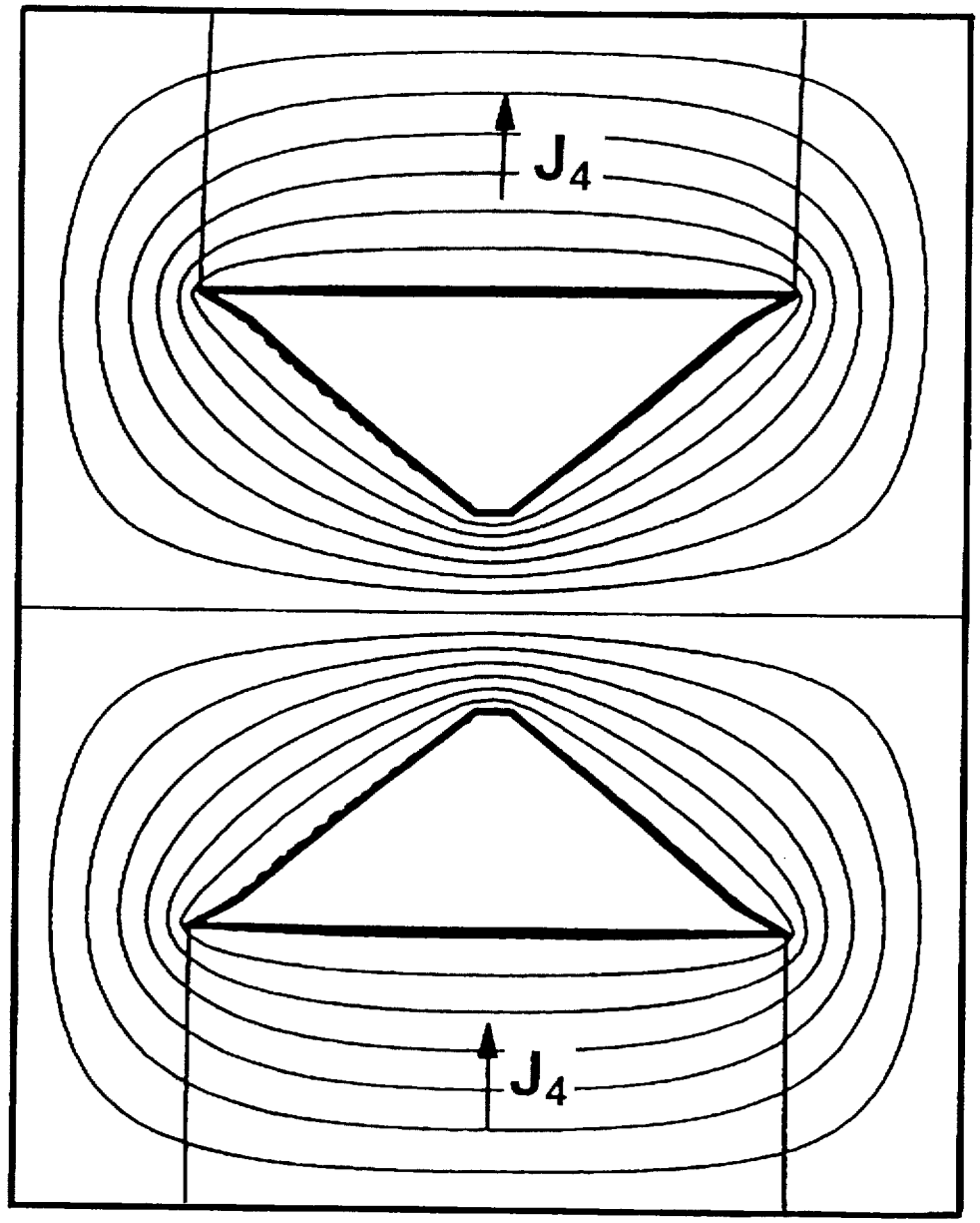
FIG. 48 is a schematic diagram of a magnet having pole pieces and rectangular magnetic components with geometries similar to the geometries of the structure of FIG. 47.
Figure 49:
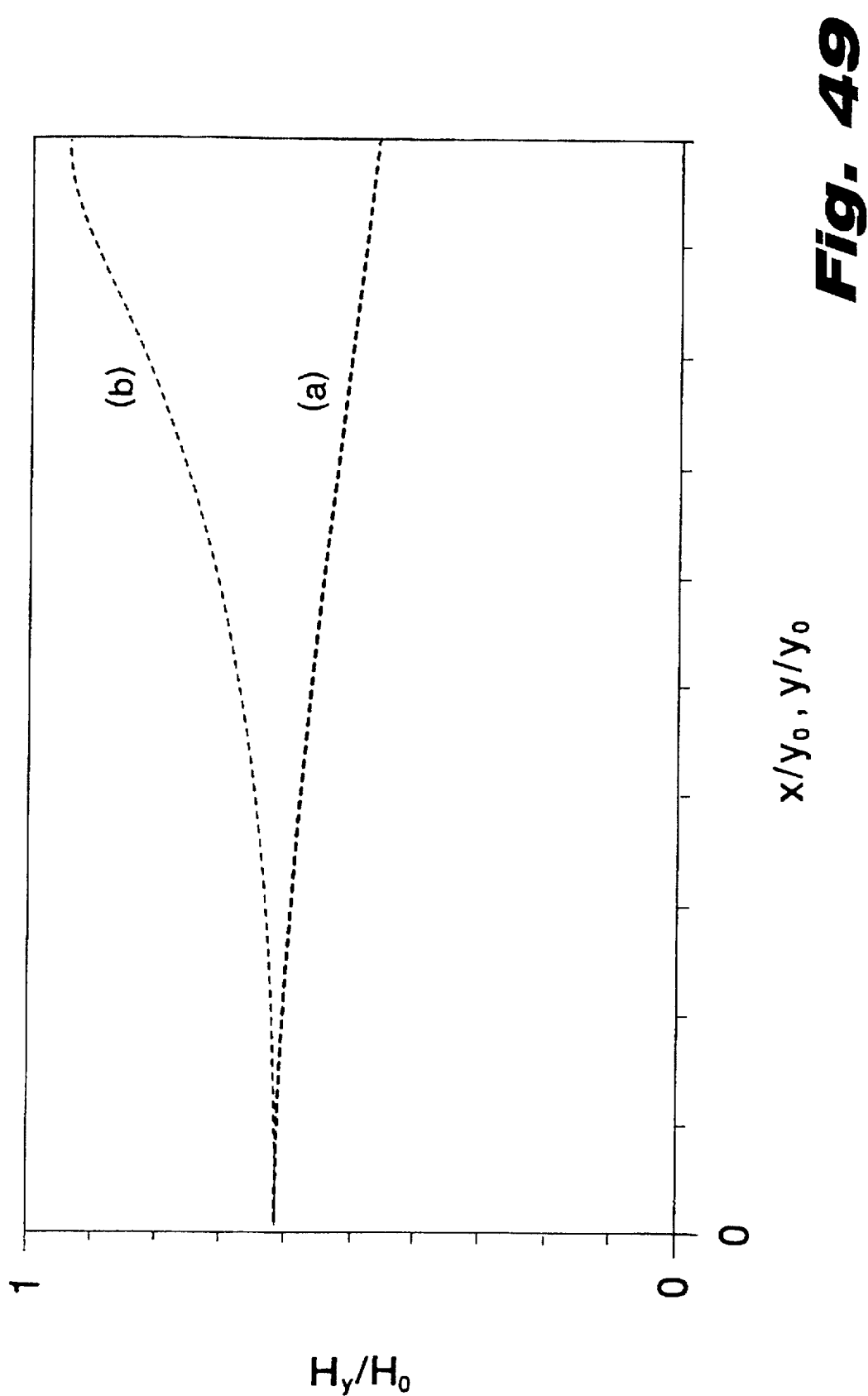
FIG. 49 is a graph of field distribution along the x axis (curve (a)) and y axis (curve (b)) for the magnetic structure of FIG. 48.

FIG. 48 shows the schematic of a traditional magnet where the geometry of the pole pieces is identical to that of the ferromagnetic components of the structure of FIG. 44. The equipotential lines in FIG. 48 of the field generated by the same rectangular components of magnetic material of remanence $\vec{J}_5$, again illustrate the loss of the focusing effect of the pole pieces due to the fringe field in the traditional magnet. The plotting of the field along the x (curve (a)) and y (curve (b)) axes of the magnet of FIG. 48 is shown in FIG. 49, where the intensity is normalized to the value $H_0=3J_4/2\mu_0$ generated by the triple wedge structure of FIG. 45.

Applications of the multiple wedge structures to generate high fields range from closed permanent magnets to fully open magnets like the schematics illustrated in FIGS. 35A and 35B. As described above, a single wedge magnet, in the presence of a μ=∞ plate, is limited to the generation of a field strength equal to the remanences of the magnetic material. This upper limit (K=1) is achieved with an angular width π/2 of the magnet wedge. The ability of superimposing linearly the field generated by single wedges of magnetic material with zero magnetic susceptibility, results in the structures of multiple wedges described herein that remove the K=1 limit and enable the generation of fields exceeding the remanence.

This interesting property of the magnets described above can be implemented in practical structures of rare-earth material capable of generating fields in the 1–2 Tesla range, far above the limits of traditional permanent magnet designs.

The magnitude of the intensity is controlled by the angle of the wedges and by the selected magnetic material. Some of the numerical calculations presented herein have been performed at K=0.3, which would correspond to a field of approximately 0.35 Tesla with an Nd.Fe.B alloy. The orientation of the field in the region of interest is controlled by the orientation of the remanence of the wedges, as described above. Although, in principle, wedge magnets can be designated to generate an arbitrary orientation, the orientation parallel to the surface of the yoke is the preferred solution that eliminates field singularities and makes it possible to achieve field strengths of the order of the remanence of the material.

The high fields generated by these structures extend the use of permanent magnets to field levels normally achieved with superconductive magnets. The use of rare earth materials in the types of structures described herein makes permanent magnet technology applicable to field levels above one Tesla. Conversely the same structures built with ferrite materials may replace expensive rare earth magnets to generate fields in the 0.4 T range.

The generation of a uniform field in the open structures described herein is achieved at the cost of a lack of field confinements. As discussed above, asymptotically the field generated by single wedge magnets in the absence of ferromagnetic components behaves like the field of a dipole, irrespective of the orientation of the magnetization. The presence of a μ=∞ flat plate that supports the wedges eliminates the dipole moment of the structures of some embodiments as described above. Likewise the dipole moment is canceled in single or multiple wedge structures without the μ=∞ plate, as long as the structures designated to generate a field parallel to the x=0 plane are symmetric with respect to the x=0 plane. This property is of particular importance when implemented in a three-dimensional structure, described below, in which case the far field reduces to the field of a quadrupole, whose magnitude decreases with the fourth power of the distance from the center of the magnet, resulting in a substantial improvement of the field confinement.

6. Three-dimensional Wedge Structure

Assume a wedge structure limited to the region between the two planes $z=\pm z_0$ with the distribution of remanence defined by condition (1.6). The angle $\alpha_2=\{\pi/2\}$ is selected for the wedge geometry in FIG. 50 and the plane x=0 is assumed to be the surface of a μ=∞ material 26. The two-dimensional formulation of the filter structure described above can be extended to the structure in FIG. 50 by designing a filter that compensates for the spherical harmonics of the field distortion computed in a spherical frame of reference ρ,θ, ψ, where the origin O is selected on the axis z at the center of interval $2z_0$. ρ is the distance of a point P from O, θ is the angle between ρ and the axis x and ψ is the angle between the plane y=0 and the plane formed by ρ and the axis x. On a sphere of radius $\rho_0$ and center O, the potential generated by the wedges 12, 14 can be expanded in the series $$\Phi(\theta,\psi) = \sum_{i,j} g_{i,j} P_i^j(\xi)\sin j\psi, \tag{6.1}$$

where $P_i^j$ are the Legendre's associated functions of the first kind, and $$\xi = \cos\theta, \tag{6.2}$$

coefficients $g_{ij}$ are the amplitudes of the harmonics of the field distortion. $\Phi(\theta\psi)$ satisfies the condition $$\Phi\left(\frac{\pi}{2}, \psi\right) = 0 \tag{6.3}$$

Because of Eqs. (6.3) and (1.6), the symmetry conditions of the structure of FIG. 50 limit the values of l,j to $$l=2n, j=2m+1. \tag{6.4}$$

As described above, the compensation of the harmonics is achieved by means of a surface dipole moment density $\vec{p}_s$ distributed on the $\mu=\infty$, $x=0$ plane outside a circle of radius $\rho_0$. $\vec{p}_s$ is oriented in the direction of the axis x and it generates a potential $\Phi_s$ on the surface $\rho=\rho_0$ $$\Phi_s(\theta,\psi) = \frac{2}{\pi\mu_0} \sum_{l=2}^{\infty} \sum_{j=1}^{l-1} \frac{(l-j)!}{(l+j)!} \left\{ \rho_0^l (P_l^j)'_0 \int_0^{2\pi} d\psi \int_{\rho_0}^{\infty} \frac{p_s(r,\psi)}{r^{l+1}} \sin j\psi \, dr \right\} P_l^j(\xi) \sin j\psi, \tag{6.5}$$

where r is the radial distance of a point of the plane x=0 from O, and $(P_l^j)'_0$ is the derivative of $P_l^j$ with respect to $\xi$ at $\xi=0$ which is given by the equation $$(P_l^j)'_0 = \frac{(-1)^{n+n}}{2^{2n-1}} \frac{(2n+2m+1)!}{(n-m-1)!(n+m)!} \tag{6.6}$$

$p_s(r,\psi)$ is zero within the circle of radius $\rho_0$. The harmonics of the field distortion are canceled if the distribution of $p_s(r,\psi)$ satisfies the integral equations $$\frac{(-1)^{n+m+1}}{2^{2n-3}\pi\mu_0} \frac{(2n-2m-1)!}{(n-m-1)!(n+m)!} \rho_0^{2n} \int_0^{\frac{\pi}{2}} d\psi \int_{\rho_0}^{\infty} \frac{p_s(r,\psi)}{r^{2n+1}} \sin(2m+1)\psi \, dr = g_{ij}, \tag{6.7}$$

$(n = 1,2,3,\ldots, m = 0,1,2,\ldots)$.

Again, if the compensation of the field distortion is limited to the lower order harmonics, the radial distribution of $p_s(r, \psi)$ can be confined to a finite interval $r_e - r_i$ outside the circle of radius $\rho_0$. A solution of Eqs. 6.7 is obtained by dividing the area between the circles of radii $r_1$, $r_2$ into a number $n_0$ of concentric rings, and by dividing the rings into a number $m_0$ of sectors, each having a uniform dipole moment density $p_{h,k}$. As in the case of the two-dimensional filter described above, the optimization of the distribution of p(r, ψ) yields the same Eq. (3.9) for the ring dimensions. The rings are divided in sectors of equal angular width, and their number $m_0$ is chosen to be large enough to provide the required approximation of the angular distribution of p(r, ψ) without introducing additional higher order harmonics.

As an example, consider a one ring filter designated to cancel the single harmonic l=2, j=1, whose potential within the sphere of radius $\rho_0$ is $$\Phi_{2,1} = 3g_{2,1}\left(\frac{\rho}{\rho_0}\right)^2 \sin\theta\cos\theta\sin\psi = 3g_{2,1}\frac{xy}{\rho_0^2}. \tag{6.8}$$

The field defined by potential $\Phi_{2,1}$ has a y component of the intensity that increases linearly with x $$H_{y,2,1} = -3\frac{g_{2,1}}{\rho_0^2} x \tag{6.9}$$

Thus, the fundamental harmonic (6.8) is caused by the gradient of $H_y$ in the y=0 plane, as in the case of the two-dimensional wedge structure analyzed above.

Assume that the single filter ring is confined between the concentric circles of radii $r_i$, $r_e$. The distribution of dipole moment $p_s$ on the ring that cancels the gradient of $H_y$ due to harmonic (6.8) is $$p_s = p_0 \sin\psi \tag{6.10}$$

independent of the radial coordinate. By virtue of Eqs. (6.7), (6.8), the amplitude $p_0$ in Eq. 6.10 is given by $$\frac{\rho_0^2}{2\mu_0}\left(\frac{1}{r_i^2} - \frac{1}{r_e^2}\right) p_0 = g_{2,1}. \tag{6.11}$$

In general, the basic properties of the two-dimensional filters described above, and in particular, the transformation of active filter elements into either passive or hybrid components applies to a multiple ring filter built into the $\mu=\infty$ plane that supports the three-dimensional structure of FIG. 50.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

What is claimed is:

1. A magnetic structure for generating a uniform magnetic field of arbitrary orientation comprising two wedge-shaped blocks of permanent magnet material each having first and second sides meeting at a common vertex, said wedge-shaped blocks each having a magnetization J and together possessing the properties:

a) in a rectangular coordinate system defined by perpendicular x, y, and z axes and situated so that the z axis coincides with the common vertex of the wedge-shaped blocks, the first side of the first wedge-shaped block extending radially from the z axis and being oriented at an angle $\alpha_1$ relative to the xz plane, where $\alpha_1>0$, the second side of the first wedge-shaped block extending radially from the z axis and being oriented at an angle $\alpha_2$ relative to the xz plane, where $\alpha_2>\alpha_1$, the first side of the second wedge-shaped block extending radially from the z axis and being oriented at an angle $-\alpha_1$ relative to the xz plane, the second side of the second wedge-shaped block extending radially from the z axis and being oriented at an angle $-\alpha_2$ relative to the xz plane, b) the magnetization of magnitude J being uniform in both wedge-shaped blocks, the angle of magnetization, relative to the yz plane, in the first wedge-shaped block being $\alpha_1+\alpha_2-\theta_1$ and the angle of magnetization in the second wedge-shaped block being $\pi-\alpha_1-\alpha_2-\theta_1$, where $\theta_1$ is any arbitrary angle relative to the xz plane.

c) in the region $|\alpha|<\alpha_1$, where $\alpha(-\pi<\alpha<\pi)$is the angle relative to the xz plane, the magnetic field is Hi, in the region $|\alpha|>\alpha_2$, the magnetic field is He, the fields Hi and He are uniform, and Hi is oriented at an angle $\theta_2$ relative to the xz plane, where $\theta_2$ is a function of $\theta_1$ and (Hi—He) is a vector oriented at the angle $\theta_1$.

2. A magnetic structure as claimed in claim 1, wherein $\theta_1=\pi/2$ and the uniform magnetic field is parallel to the y axis.

3. A magnetic structure as claimed in claim 1, wherein $\theta_1=\pi$ and the uniform magnetic field is parallel to the x axis.

4. A magnetic structure for generating a substantially uniform magnetic field within a region of interest, comprising:
   a) a pair of wedge-shaped blocks of permanent magnet material and of substantially identical shape and positioned within an arbitrary three-dimensional rectangular coordinate system consisting of perpendicular x, y, and z axes meeting at an origin such that the pair of wedge-shaped blocks are arranged symmetrically on either side of the xz plane and abut one another along a common edge extending along or parallel to the z axis, each wedge-shaped block having a first major side and a second major side subtending a first angle and which terminate at or near the common edge, each wedge-shaped block being substantially uniformly magnetized in a direction substantially perpendicularly to the z axis and a first wedge-shaped block of the pair having a magnetization J whose orientation forms in the xy plane a second angle $\theta$ with respect to the yz plane and a second wedge-shaped block of the pair having a substantially similar magnitude of magnetization J,
   b) the first wedge-shaped block of the pair of wedge-shaped blocks being configured to define a third angle $\alpha_1$ between the first side and the x axis and a fourth angle $\alpha_2$ between the second side and the x axis,
   c) the second wedge-shaped block of the pair of wedge-shaped blocks being magnetized such that components of its magnetization J along the x and y axes are related to corresponding x and y axis components of the magnetization J in the first wedge-shaped block of the pair of wedge-shaped blocks such that one of their respective x and y axis components extends in opposite directions and the other of their respective x and y axis components extends in the same direction,
   d) said region of interest being situated in the vicinity of the z axis within an open space between the first major sides of the pair of wedge-shaped blocks or in an open space opposite the second major sides of the pair of wedge-shaped blocks or in both open spaces, said wedge-shaped blocks being a major contributor to the substantially uniform magnetic field in the region of interest, said substantially uniform magnetic field being generally parallel to the x axis or the y axis,
   e) the value of $\theta$ being determined solely by the value of both $\alpha_1$ and $\alpha_2$.

5. A magnetic structure for generating a substantially uniform magnetic field within a region of interest as claimed in claim 4, wherein $\theta$ equals the sum of $\alpha_1$ and $\alpha_2$ minus $\pi/2$, and the substantially uniform magnetic field is generally parallel to the y axis.

6. A magnetic structure for generating a substantially uniform magnetic field within a region of interest as claimed in claim 4, wherein $\theta$ equals the sum of $\alpha_1$ and $\alpha_2$, and the substantially uniform magnetic field is generally parallel to the x axis.

7. A magnetic structure for generating a substantially uniform magnetic field within a region of interest as claimed in claim 4, wherein each of the wedge-shaped blocks has a triangular cross-section forming in addition to the first and second major sides a third side opposite the first angle, said third side of each wedge-shaped block being parallel to the orientation of its magnetization J.

8. A magnetic structure for generating a substantially uniform magnetic field within a region of interest as claimed in claim 4, further comprising a high-permeability member located close to the z axis and either in the open space between the first major sides of the pair of wedge-shaped blocks or in the open space opposite the second major sides of the pair of wedge-shaped blocks to short circuit the field in the region of interest in the space in which the high-permeability member is located leaving only the uniform field in the region of interest in the vicinity of the z axis within the other open space.

9. A magnetic structure for generating a substantially uniform magnetic field within a region of interest, comprising:
   a) a pair of wedge-shaped blocks of permanent magnet material and of substantially identical shape and positioned within an arbitrary three-dimensional rectangular coordinate system consisting of perpendicular x, y, and z axes meeting at an origin such that the pair of wedge-shaped blocks are arranged symmetrically on either side of the xz plane and abut one another along a common edge extending along or parallel to the z axis, each wedge-shaped block having a triangular cross-section forming a first side and a second side subtending a first angle and which terminate at or near the common edge and a third side remote from the common edge, each wedge-shaped block being substantially uniformly magnetized substantially perpendicularly to the z axis and parallel to its third side and a first wedge-shaped block of the pair having a magnetization J whose orientation forms a second angle $\theta$ with respect to the yz plane and a second wedge-shaped block of the pair having a substantially similar magnitude of magnetization J.
   b) the first wedge-shaped block of the pair of wedge-shaped blocks being configured to define a third angle $\alpha_1$ between the first side and the x axis and a fourth angle $\alpha_2$ between the second side and the x axis, the angle $\theta$ being substantially equal to $\alpha_1+\alpha_2-\pi/2$,
   c) a high-permeability member having an edge close to or substantially coinciding with the z axis and having a face close to or substantially coinciding with the second side of each of the wedge-shaped blocks, the radial extent, from the origin of the rectangular coordinate system, of the high-permeability member being at least equal to that of the wedge-shaped blocks,
   d) the second wedge-shaped block of the pair of wedges being magnetized such that components of its magnetization J along the x and y axes are related to x and y axis components of the magnetization J in the first wedge-shaped block of the pair of wedge-shaped blocks such that their respective x axis components extend in opposite directions and their respective y axis components extend in the same direction,
   e) said region of interest lying in an open space adjacent the z axis between the first major sides of the pair of wedge-shaped blocks and the substantially uniform field being oriented parallel to the y axis.

10. A magnetic structure for generating a substantially uniform magnetic field within a region of interest as claimed in claim 9, wherein the subtended first angle is substantially equal to $\pi/2$.

11. A magnetic structure for generating a substantially uniform magnetic field within a region of interest as claimed in claim 9, wherein the radial extent, from the z axis of the rectangular coordinate system, of the region of interest is substantially less than that of each wedge-shaped block.

12. A magnetic structure for generating a substantially uniform magnetic field within a region of interest as claimed in claim 9, wherein $\alpha_2 = \pi/2$ or $\alpha_1 = \pi/2$.

13. A magnetic structure for generating a substantially uniform magnetic field within a region of interest as claimed in claim 9, wherein the face of the high permeability member is oriented parallel to the substantially uniform field.

14. A magnetic structure for generating a substantially uniform magnetic field within a region of interest, comprising:

a) a pair of wedge-shaped blocks of permanent magnet material and of substantially identical shape and positioned within an arbitrary three-dimensional rectangular coordinate system consisting of perpendicular x, y, and z axes meeting at an origin such that the pair of wedge-shaped blocks are arranged symmetrically on either side of the xz plane and abut one another along a common edge extending along or parallel to the z axis, each wedge-shaped block having a triangular cross-section forming a first side and a second side subtending a first angle and which terminate at or near the common edge and a third side remote from the common edge, each wedge-shaped block being substantially uniformly magnetized substantially perpendicularly to the z axis and parallel to its third side and a first wedge-shaped block of the pair having a magnetization J whose orientation forms a second angle $\theta$ with respect to the yz plane and a second wedge-shaped block of the pair having a substantially similar magnitude of magnetization J, b) the first wedge-shaped block of the pair of wedge-shaped blocks being configured to define a third angle $\alpha_1$, between the first side and the x axis and a fourth angle $\alpha_2$ between the second side and the x axis, the angle $\theta$ being substantially equal to $\alpha_1 + \alpha_2$, c) a high-permeability member having an edge close to or substantially coinciding with the z axis and having a face close to or substantially coinciding with the second side of each of the wedge-shaped blocks, the radial extent, from the origin of the rectangular coordinate system, of the high-permeability member being at least equal to that of the wedge-shaped blocks, d) the second wedge-shaped block of the pair of wedges being magnetized such that components of its magnetization J along the x and y axes are related to x and y axis components of the magnetization J in the first wedge-shaped block of the pair of wedge-shaped blocks such that their respective y axis components extend in opposite directions and their respective x axis components extend in the same direction, e) said region of interest lying in an open space adjacent the z axis between the first major sides of the pair of wedge-shaped blocks and the substantially uniform field being oriented parallel to the x axis.

15. A magnetic structure for generating a substantially uniform magnetic field within a region of interest as claimed in claim 14, wherein the subtended first angle is substantially equal to $\pi/2$.

16. A magnetic structure for generating a substantially uniform magnetic field within a region of interest as claimed in claim 14, wherein the radial extent, from the z axis of the rectangular coordinate system, of the region of interest is substantially less than that of each wedge-shaped block.

17. An open magnetic structure for generating a substantially uniform magnetic field within a region of interest, comprising:

a) a pair of wedge-shaped blocks of permanent magnet material and of substantially identical shape and positioned within an arbitrary three-dimensional rectangular coordinate system consisting of perpendicular x, y, and z axes meeting at an origin such that the pair of wedge-shaped blocks are arranged symmetrically on either side of the xz plane and abut one another along a common edge extending along or parallel to the z axis, each wedge-shaped block having a first major side and a second major side subtending a first angle and which terminate at or near the common edge, each wedge-shaped block being substantially uniformly magnetized in a direction substantially perpendicularly to the z axis and a first wedge-shaped block of the pair having a magnetization J whose orientation forms in the xy plane a second angle $\theta$ with respect to the yz plane and a second wedge-shaped block of the pair having a substantially similar magnitude of magnetization J, the first major sides of the pair of wedge-shaped blocks defining between them an open space adjacent the common edge, b) the first wedge-shaped block of the pair of wedge-shaped blocks being configured to define a third angle $\alpha_1$ between the first side and the x axis and a fourth angle $\alpha_2$ between the second side and the x axis, c) the second wedge-shaped block of the pair of wedge-shaped blocks being magnetized such that components of its magnetization J along the x and y axes are related to corresponding x and y axis components of the magnetization J in the first wedge-shaped block of the pair of wedge-shaped blocks such that one of their respective x and y axis components extends in opposite directions and the other of their respective x and y axis components extends in the same direction, d) a high-permeability member having an edge close to or substantially coinciding with the z axis and having a face close to or substantially coinciding with the second side of each of the wedge-shaped blocks, the radial extent, from the origin of the rectangular coordinate system, of the high-permeability member being at least equal to that of the wedge-shaped blocks, e) said region of interest being situated in the vicinity of the z axis within the open space between and being bounded primarily by the first major sides of the pair of wedge-shaped blocks, said wedge-shaped blocks being the major contributor to the substantially uniform magnetic field in the region of interest, said substantially uniform magnetic field being generally parallel to the y axis, f) the value of $\theta$ being determined by the value of both $\alpha_1$ and $\alpha_2$, g) the magnetic structure on the side opposite to and facing the open space between the first major sides of the pair of wedge-shaped blocks being free of magnetic elements thereby allowing access to the region of interest from the side opposite.

18. An open magnetic structure for generating a substantially uniform magnetic field within a region of interest as claimed in claim 17, wherein $\alpha_2 = \pi/2$.

19. An open magnetic structure for generating a substantially uniform magnetic field within a region of interest as claimed in claim 17, further comprising additional magnetized elements for partially terminating the wedge-shaped blocks.

20. An open magnetic structure for generating a substantially uniform magnetic field within a region of interest as claimed in claim 17, wherein the high-permeability member is at least partially spaced from the second sides of the wedge-shaped blocks, and further comprising field-distorsion compensation means located in the space between the high-permeability member and the second sides of the wedge-shaped blocks.

21. A magnetic structure for generating a substantially uniform magnetic field within a region of interest, comprising:
   a) a pair of wedge-shaped blocks of permanent magnet material and of substantially identical shape and positioned within an arbitrary three-dimensional rectangular coordinate system consisting of perpendicular x, y, and z axes meeting at an origin such that the pair of wedge-shaped blocks are arranged symmetrically on either side of the xz plane and abut one another along a common edge extending along or parallel to the z axis, each wedge-shaped block having a first major side and a second major side subtending a first angle and which terminate at or near the common edge, each wedge-shaped block being substantially uniformly magnetized in a direction substantially perpendicularly to the z axis and a first wedge-shaped block of the pair having a magnetization J whose orientation forms in the xy plane a second angle $\theta$ with respect to the yz plane and a second wedge-shaped block of the pair having a substantially similar magnitude of magnetization J, the first major sides of the pair of wedge-shaped blocks defining between them an open space adjacent the common edge,
   b) the first wedge-shaped block of the pair of wedge-shaped blocks being configured to define a third angle $\alpha_1$ between the first side and the x axis and a fourth angle $\alpha_2$ between the second side and the x axis,
   c) the second wedge-shaped block of the pair of wedge-shaped blocks being magnetized such that components of its magnetization J along the x and y axes are related to corresponding x and y axis components of the magnetization J in the first wedge-shaped block of the pair of wedge-shaped blocks such that one of their respective x and y axis components extends in opposite directions and the other of their respective x and y axis components extends in the same direction,
   d) a high-permeability member having an edge close to or substantially coinciding with the z axis and having a face adjacent to the first or the second side of each of the wedge-shaped blocks, the radial extent, from the origin of the rectangular coordinate system, of the high-permeability member being at least equal to that of the wedge-shaped blocks,
   e) said region of interest being situated in the vicinity of the z axis within the open space between the first major sides of the pair of wedge-shaped blocks when the high-permeability member is adjacent the second sides of the wedge-shaped blocks or in an open space opposite the second major sides of the pair of wedge-shaped blocks when the high-permeability member is adjacent the first sides of the wedge-shaped blocks, said wedge-shaped blocks being a major contributor to the substantially uniform magnetic field in the region of interest, said substantially uniform magnetic field being generally parallel to the x axis or the y axis,
   f) the value of $\theta$ being determined solely by the value of both $\alpha_1$ and $\alpha_2$,
   g) further comprising compensation means for reducing field distortions by the substantial elimination of selected harmonics of the substantially uniform magnetic field in the region of interest, the compensation means comprising filter structures positioned between the high-permeability member and the adjacent side of the wedge-shaped blocks.

22. A magnetic structure for generating a substantially uniform magnetic field within a region of interest as claimed in claim 21, wherein the compensation means comprises a pair of dipole distributions of uniform moments positioned adjacent to the adjacent sides of the wedge-shaped blocks, the dipole distributions being positioned symmetrically about the x axis.

23. A magnetic structure for generating a substantially uniform magnetic field within a region of interest as claimed in claim 22, wherein the dipole distributions are oriented in opposite directions along the x axis and compensate for distortions in any component of the magnetic field along the y axis.

24. A magnetic structure for generating a substantially uniform magnetic field within a region of interest as claimed in claim 22, wherein the dipole distributions are oriented in the same direction along the x axis and compensate for distortions in any component of the magnetic field along the x axis.

25. A magnetic structure for generating a substantially uniform magnetic field within a region of interest as claimed in claim 21, wherein the compensation means comprises at least one pair of elements positioned at or near ends of the first or second sides of the wedge-shaped blocks.

26. A magnetic structure for generating a substantially uniform magnetic field within a region of interest as claimed in claim 25, wherein the at least one pair of elements comprises a pair of substantially identical ferromagnetic pole pieces positioned symmetrically about the x axis.

27. A magnetic structure for generating a substantially uniform magnetic field within a region of interest as claimed in claim 25, wherein the pair of elements comprises at least one pair of substantially identical magnetized elements positioned symmetrically about the x axis.

28. A magnetic structure for generating a substantially uniform magnetic field within a region of interest, comprising:
   a) a first and a second pair of wedge-shaped blocks of permanent magnet material with each block of a pair being substantially identical in shape to the other block of the pair and positioned within an arbitrary three-dimensional rectangular coordinate system consisting of perpendicular x, y, and z axes meeting at an origin such that both the first and second pair of wedge-shaped blocks are arranged symmetrically on either side of the xz plane, each wedge-shaped block of the first pair having a first major side and a second major side subtending a first angle and which terminate at or near the common edge, each wedge-shaped block of the second pair having a first major side and a second major side subtending a first angle and which terminate at or near the common edge, each wedge-shaped block of both the first and second pair being substantially uniformly magnetized substantially perpendicularly to the z axis and a respective first wedge-shaped block of each pair having a magnetization J whose orientation forms in the xy plane a respective second angle $\theta$ with respect to the yz plane and a respective second wedge-shaped block of each pair having a substantially similar magnitude of magnetization J, the first major sides of the first pair of wedge-shaped blocks defining between them an open space adjacent the common edge, the first major sides of the second pair of wedge-shaped blocks respectively being adjacent the second major sides of the first pair of wedge-shaped blocks, b) the first wedge-shaped block of each pair of wedge-shaped blocks being positioned to define a respective third angle $\alpha_1$ between the first side and the x axis and a respective fourth angle $\alpha_2$ between the second side and the x axis, c) a high-permeability member having face substantially coinciding with or close to the second side of each of the second pair of wedge-shaped blocks, d) the second wedge-shaped block of each pair of wedge-shaped blocks being magnetized such that components of its magnetization J along the x and y axes are related to corresponding x and y axis components of the magnetization J in the first wedge-shaped block of each pair of wedge-shaped blocks such that one of the respective x and y axis components extends in opposite directions and the other of their respective x and y axis components extends in the same direction, e) said region of interest being situated in the vicinity of the z axis within the open space between the first major sides of the first pair of wedge-shaped blocks, both pairs of said wedge-shaped blocks being a major contributor to the substantially uniform magnetic field in the region of interest, said substantially uniform magnetic field being generally parallel to the y or the x axis, f) the value of θ for each pair of wedge-shaped blocks being determined by the values of both $\alpha_1$ and $\alpha_2$ for the respective pair of wedge-shaped blocks.

29. A magnetic structure for generating a substantially uniform magnetic field within a region of interest as claimed in claim 28, wherein the pairs of wedge-shaped blocks abut one another along a common edge extending along or parallel to the z axis, and the first sides of the second pair of wedge-shaped blocks abut the second sides of the first pair of wedge-shaped blocks.

30. A magnetic structure for generating a substantially uniform magnetic field within a region of interest as claimed in claim 28, wherein the pairs of wedge-shaped blocks abut one another along a common edge extending along or parallel to the z axis, and the first sides of the second pair of wedge-shaped blocks are angularly spaced from the second sides of the first pair of wedge-shaped blocks.

31. A magnetic structure for generating a substantially uniform magnetic field within a region of interest as claimed in claim 28, wherein the wedge-shaped blocks in both pairs are substantially identical.

32. A magnetic structure for generating a substantially uniform magnetic field within a region of interest as claimed in claim 28, wherein each of the wedge-shaped blocks has a triangular cross-section forming in addition to the first and second major sides a third side opposite the first angle, said third side of each wedge-shaped block being parallel to the orientation of its magnetization J.

33. A magnetic structure for generating a substantially uniform magnetic field within a region of interest as claimed in claim 28, wherein the wedge-shaped blocks are oriented such that the high-permeability member extends in the yz plane.

* * * * *